(12) United States Patent
Sivaramakrishnan et al.

(10) Patent No.: US 11,182,221 B1
(45) Date of Patent: Nov. 23, 2021

(54) INTER-NODE BUFFER-BASED STREAMING FOR RECONFIGURABLE PROCESSOR-AS-A-SERVICE (RPAAS)

(71) Applicant: SambaNova Systems, Inc., Palo Alto, CA (US)

(72) Inventors: Ram Sivaramakrishnan, San Jose, CA (US); Sumti Jairath, Santa Clara, CA (US); Emre Ali Burhan, Sunnyvale, CA (US); Manish K. Shah, Austin, TX (US); Raghu Prabhakar, San Jose, CA (US); Ravinder Kumar, Fremont, CA (US); Arnav Goel, San Jose, CA (US); Ranen Chatterjee, Fremont, CA (US); Gregory Frederick Grohoski, Bee Cave, TX (US); Kin Hing Leung, Cupertino, CA (US); Dawei Huang, San Diego, CA (US); Manoj Unnikrishnan, Saratoga, CA (US); Martin Russell Raumann, San Leandro, CA (US); Bandish B. Shah, San Francisco, CA (US)

(73) Assignee: SambaNova Systems, Inc., Palo Alto, CA (US)

( * ) Notice: Subject to any disclaimer, the term of this patent is extended or adjusted under 35 U.S.C. 154(b) by 0 days.

(21) Appl. No.: 17/127,929

(22) Filed: Dec. 18, 2020

(51) Int. Cl.
*G06F 9/50* (2006.01)
*G06F 9/455* (2018.01)

(52) U.S. Cl.
CPC ........ *G06F 9/5077* (2013.01); *G06F 9/45558* (2013.01); *G06F 9/5027* (2013.01); *G06F 2009/4557* (2013.01)

(58) Field of Classification Search
None
See application file for complete search history.

(56) References Cited

U.S. PATENT DOCUMENTS 9,009,723 B2 * 4/2015 Degenaro ............. G06F 9/5027
  718/104
9,501,325 B2 * 11/2016 Pell ....................... G06F 9/5027
  (Continued)

OTHER PUBLICATIONS

Kachris et al.; "A Survey on Reconfigurable Accelerators for Cloud Computing"; IEEE 2016; (Kachris_2016.pdf; pp. 1-11) (Year: 2016).*

(Continued)

Primary Examiner — Hiren P Patel
(74) Attorney, Agent, or Firm — Haynes Beffel & Wolfeld LLP; Sikander M. Khan

(57) ABSTRACT

The technology disclosed relates to buffer-based inter-node streaming of configuration data over a network fabric. In particular, the technology disclosed relates to a runtime processor configured to load and execute a first subset of configuration files in a set of configuration files on a first reconfigurable processor operatively coupled to a first processing node, load and execute a second subset of configuration files in the set of configuration files on a second reconfigurable processor operatively coupled to a second processing node, and use a first plurality of buffers operatively coupled to the first processing node, and a second plurality of buffers operatively coupled to the second processing node to stream data between the first reconfigurable processor and the second reconfigurable processor to load and execute the first subset of configuration files and the second subset of configuration files.

20 Claims, 34 Drawing Sheets

(56) References Cited

U.S. PATENT DOCUMENTS

| | | | |
|---|---|---|---|
| 10,621,138 B2* | 4/2020 | Hu | H04L 12/4641 |
| 2008/0013448 A1* | 1/2008 | Horie | H04L 67/1097 |
| | | | 370/229 |
| 2009/0300209 A1* | 12/2009 | Elzur | H04L 47/24 |
| | | | 709/234 |
| 2014/0258438 A1* | 9/2014 | Ayoub | G06F 13/28 |
| | | | 709/212 |
| 2019/0089616 A1* | 3/2019 | Chabbi | G06F 11/3006 |
| 2019/0171612 A1* | 6/2019 | Shahar | G06F 15/17331 |
| 2019/0384642 A1* | 12/2019 | Bolkhovitin | G06F 3/0658 |
| 2020/0174840 A1* | 6/2020 | Zhao | G06N 3/084 |
| 2020/0326992 A1* | 10/2020 | Jin | G06F 9/44505 |
| 2021/0089343 A1* | 3/2021 | Hyoudou | G06F 9/5016 |

OTHER PUBLICATIONS

Knodel et al.; "RC3E: Reconfigurable Accelerators in Data Centers and their Provision by Adapted Service Models"; IEEE; (Knodel_2016.pdf; pp. 1-8) (Year: 2016).*

Prabhakar et al; "Plasticine: A Reconfigurable Architecture for Parallel Patterns"; Association for Computing Machinery 2017 (Prabhakar_2017.pdf; pp. 1-14) (Year: 2017).*

Liu et al.; "Offloading Distributed Applications onto SmartNICs using iPipe", ACM 2019 (Liu_2019.pdf; pp. 1-16) (Year: 2019).*

* cited by examiner

INTER-NODE BUFFER-BASED STREAMING FOR RECONFIGURABLE PROCESSOR-AS-A-SERVICE (RPAAS)

INCORPORATIONS

The following are incorporated by reference for all purposes as if fully set forth herein:

U.S. Non-provisional patent application Ser. No. 17/127,818, entitled "INTRA-NODE BUFFER-BASED STREAMING FOR RECONFIGURABLE PROCESSOR-AS-A-SERVICE (RPaaS)," filed Dec. 18, 2020.

Prabhakar et al., "Plasticine: A Reconfigurable Architecture for Parallel Patterns," ISCA '17, Jun. 24-28, 2017, Toronto, ON, Canada;

Koeplinger et al., "Spatial: A Language And Compiler For Application Accelerators," Proceedings Of The 39th ACM SIGPLAN Conference On Programming Language Design And Implementation (PLDI), Proceedings of the 43rd International Symposium on Computer Architecture, 2018;

U.S. Non-provisional patent application Ser. No. 16/239,252, filed Jan. 3, 2019, entitled, "VIRTUALIZATION OF A RECONFIGURABLE DATA PROCESSOR,";

U.S. Non-provisional patent application Ser. No. 16/197,826, filed Nov. 21, 2018, entitled, "CONFIGURATION LOAD OF A RECONFIGURABLE DATA PROCESSOR,";

U.S. Non-provisional patent application Ser. No. 16/198,086, filed Nov. 21, 2018, entitled, "CONFIGURATION UNLOAD OF A RECONFIGURABLE DATA PROCESSOR,";

U.S. Non-provisional patent application Ser. No. 16/260,548, filed Jan. 29, 2019, entitled, "MATRIX NORMAL/TRANSPOSE READ AND A RECONFIGURABLE DATA PROCESSOR INCLUDING SAME,";

U.S. Non-provisional patent application Ser. No. 16/536,192, filed Aug. 8, 2019, entitled, "COMPILER FLOW LOGIC FOR RECONFIGURABLE ARCHITECTURES,";

U.S. Non-provisional patent application Ser. No. 16/407,675, filed May 9, 2019, entitled, "CONTROL FLOW BARRIER AND RECONFIGURABLE DATA PROCESSOR,";

U.S. Non-provisional patent application Ser. No. 16/504,627, filed Jul. 8, 2019, entitled, "QUIESCE RECONFIGURABLE DATA PROCESSOR,";

U.S. Non-provisional patent application Ser. No. 16/572,516, filed Sep. 16, 2019, entitled, "EFFICIENT EXECUTION OF OPERATION UNIT GRAPHS ON RECONFIGURABLE ARCHITECTURES BASED ON USER SPECIFICATION,";

U.S. Non-provisional patent application Ser. No. 16/744,077, filed Jan. 15, 2020, entitled, "COMPUTATIONALLY EFFICIENT SOFTMAX LOSS GRADIENT BACKPROPAGATION,";

U.S. Non-provisional patent application Ser. No. 16/590,058, filed Oct. 1, 2019, entitled, "COMPUTATION UNITS FOR FUNCTIONS BASED ON LOOKUP TABLES,";

U.S. Non-provisional patent application Ser. No. 16/695,138, filed Nov. 25, 2019, entitled, "COMPUTATION UNITS FOR BATCH NORMALIZATION,";

U.S. Non-provisional patent application Ser. No. 16/688,069, filed Nov. 19, 2019, entitled, "LOOK-UP TABLE WITH INPUT OFFSETTING,";

U.S. Non-provisional patent application Ser. No. 16/718,094, filed Dec. 17, 2019, entitled, "COMPUTATION UNITS FOR ELEMENT APPROXIMATION,";

U.S. Non-provisional patent application Ser. No. 16/560,057, filed Sep. 4, 2019, entitled, "SIGMOID FUNCTION IN HARDWARE AND A RECONFIGURABLE DATA PROCESSOR INCLUDING SAME,";

U.S. Non-provisional patent application Ser. No. 16/572,527, filed Sep. 16, 2019, entitled, "PERFORMANCE ESTIMATION-BASED RESOURCE ALLOCATION FOR RECONFIGURABLE ARCHITECTURES,";

U.S. Non-provisional patent application Ser. No. 15/930,381, filed May 12, 2020, entitled, "COMPUTATIONALLY EFFICIENT GENERAL MATRIX-MATRIX MULTIPLICATION (GeMM),";

U.S. Non-provisional patent application Ser. No. 16/890,841, filed Jun. 2, 2020, entitled, "ANTI-CONGESTION FLOW CONTROL FOR RECONFIGURABLE PROCESSORS,";

U.S. Non-provisional patent application Ser. No. 16/922,975, filed Jul. 7, 2020, entitled, "RUNTIME VIRTUALIZATION OF RECONFIGURABLE DATAFLOW RESOURCES,";

US Non-provisional patent application Ser. No. 16/996,66, filed Aug. 18, 2020, entitled, "RUNTIME PATCHING OF CONFIGURATION FILES,";

U.S. Non-provisional patent application Ser. No. 17/023,015, filed Sep. 16, 2020, "COMPILE TIME LOGIC FOR DETECTING STREAMING COMPATIBLE AND BROADCAST COMPATIBLE DATA ACCESS PATTERNS"; and U.S. Non-provisional patent application Ser. No. 17/031,679, filed Sep. 24, 2020, "SYSTEMS AND METHODS FOR MEMORY LAYOUT DETERMINATION AND CONFLICT RESOLUTION".

FIELD OF THE TECHNOLOGY DISCLOSED

The technology disclosed relates to latency optimization in intra-node and inter-node processing that uses processors like Central Processing Units (CPUs), Graphics Processing Units (GPUs), Field Programmable Gate Arrays (FPGAs), Coarse-Grained Reconfigurable Architectures (CGRAs), Application-Specific Integrated Circuits (ASICs), Application Specific Instruction-set Processor (ASIP), and Digital Signal Processors (DSPs). In particular, the technology disclosed relates to using buffers to efficiently stream data between processors on a same processing node and on different processing nodes.

BACKGROUND

The subject matter discussed in this section should not be assumed to be prior art merely as a result of its mention in this section. Similarly, a problem mentioned in this section or associated with the subject matter provided as background should not be assumed to have been previously recognized in the prior art. The subject matter in this section merely represents different approaches, which in and of themselves can also correspond to implementations of the claimed technology.

Reconfigurable processors, including Field Programmable Gate Arrays (FPGAs), can be configured to implement a variety of functions more efficiently or faster than might be achieved using a general-purpose processor executing a computer program. So-called Coarse-Grained Reconfigurable Architectures (CGRAs) are being developed in which the configurable units in the array are more complex than used in typical, more fine-grained FPGAs, and may enable faster or more efficient execution of various classes of functions. For example, CGRAs have been proposed that can enable implementation of energy-efficient accelerators for machine learning and artificial intelligence workloads. See, Prabhakar, et al., "Plasticine: A Reconfigurable Architecture for Parallel Patterns," ISCA '17, Jun. 24-28, 2017, Toronto, ON, Canada.

Configuration of reconfigurable processors involves compilation of a configuration description to produce a configuration file, referred to sometimes as a bitstream or bit file, and distributing the configuration file to the configurable units on the processor. To start a process, the configuration file must be loaded for that process. To change a process, the configuration file must be replaced with the new configuration file.

The procedures and supporting structures for distributing and loading configuration files can be complex, and the execution of the procedures can be time consuming.

In order to maximize operating efficiency and be able to run programs on multiple reconfigurable processors on a same processing node or different processing nodes, a means for efficiently streaming configuration data between reconfigurable processors is needed.

BRIEF DESCRIPTION OF THE DRAWINGS

In the drawings, like reference characters generally refer to like parts throughout the different views. Also, the drawings are not necessarily to scale, with an emphasis instead generally being placed upon illustrating the principles of the technology disclosed. In the following description, various implementations of the technology disclosed are described with reference to the following drawings, in which.

DETAILED DESCRIPTION

The following discussion is presented to enable any person skilled in the art to make and use the technology disclosed and is provided in the context of a particular application and its requirements. Various modifications to the disclosed implementations will be readily apparent to those skilled in the art, and the general principles defined herein may be applied to other implementations and applications without departing from the spirit and scope of the technology disclosed. Thus, the technology disclosed is not intended to be limited to the implementations shown but is to be accorded the widest scope consistent with the principles and features disclosed herein.

Data Center

Figure 1:
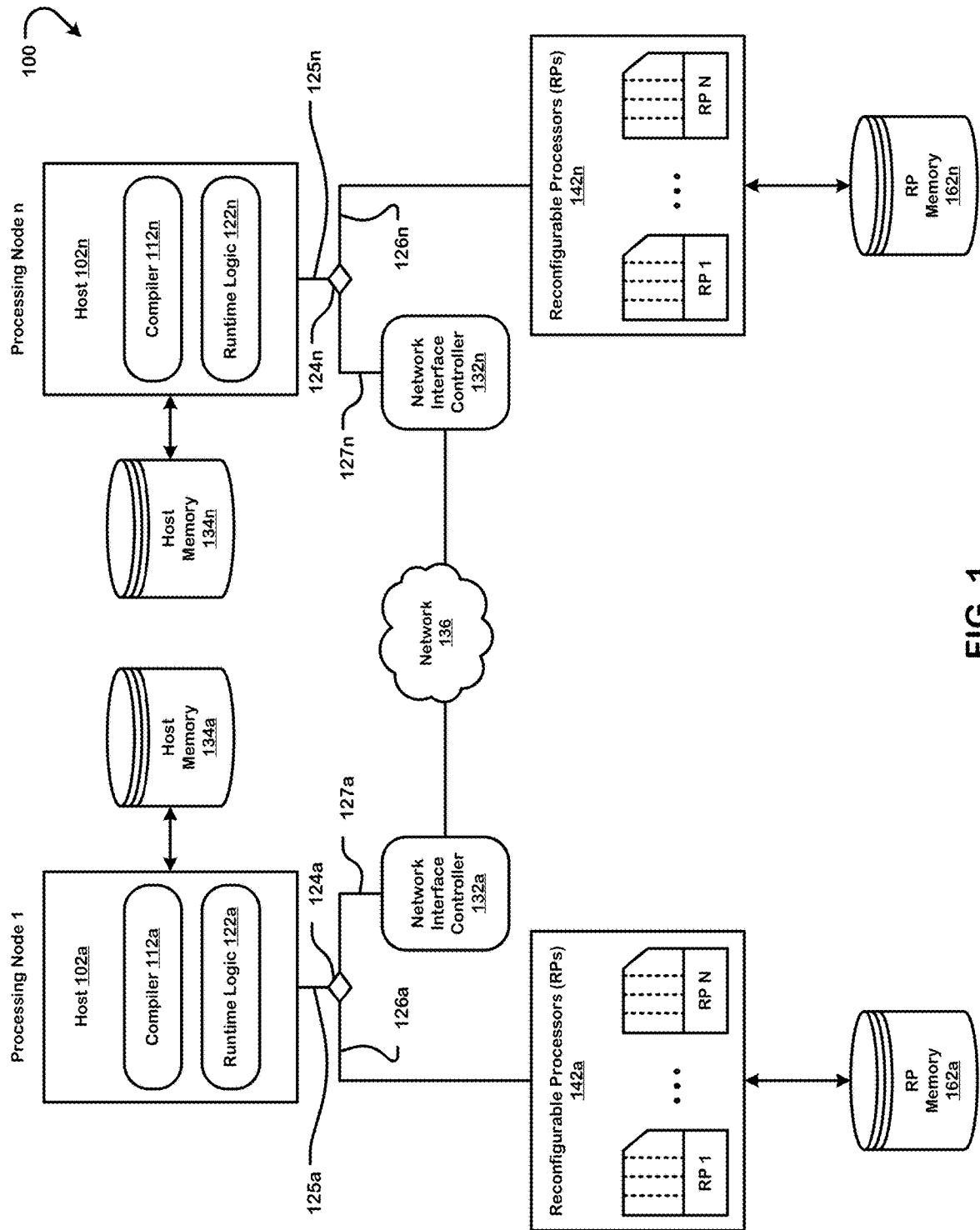
FIG. 1 shows an architectural level schematic of a data center in accordance with an implementation.

Systems and processes for providing Reconfigurable Processor-as-a-Service (RPaaS) are described. The systems and processes will be described with reference to FIG. 1 showing an architectural level schematic of a data center 100 in accordance with an implementation. Because FIG. 1 is an architectural diagram, certain details of the data center 100 are intentionally omitted to improve the clarity of the description. It may be noted that data center 100 can include the same, more, or fewer elements configured in the same or different manner in other implementations. The discussion of FIG. 1 will be organized as follows. First, the elements of the figure will be described, followed by their interconnections. Then, the use of the elements in the system will be described in greater detail.

FIG. 1 shows first and second processing nodes in the data center 100. In FIG. 1, the first processing node is identified as "processing node 1," and the second processing node is identified as "processing node n." The first and second processing nodes are configured to collaboratively execute configuration files for applications in a distributed fashion. One skilled in the art will appreciate that the data center 100 can have any number of processing nodes operatively coupled for data communications through a network 136 (also called herein "network fabric 136"). Examples of the network 136 include a Storage Area Network (SAN) and a Local Area Network (LAN). The SAN can be implemented with a variety of data communications fabrics, devices, and protocols. For example, the fabrics for the SAN can include Fibre Channel, Ethernet, InfiniBand, Serial Attached Small Computer System Interface ('SAS'), or the like. Data communications protocols for use with the SAN can include Advanced Technology Attachment ('ATA'), Fibre Channel Protocol, Small Computer System Interface ('SCSI'), Internet Small Computer System Interface ('iSCSI'), Hyper-SCSI, Non-Volatile Memory Express ('NVMe') over Fabrics, or the like.

The LAN can also be implemented with a variety of fabrics, devices, and protocols. For example, the fabrics for the LAN can include Ethernet (802.3), wireless (802.11), or the like. Data communication protocols for use in the LAN can include Transmission Control Protocol ('TCP'), User Datagram Protocol ('UDP'), Internet Protocol (IP), Hypertext Transfer Protocol ('HTTP'), Wireless Access Protocol ('WAP'), Handheld Device Transport Protocol ('HDTP'), Session Initiation Protocol (SIT), Real-time Transport Protocol ('RTP'), or the like.

The network 136 also connects other network components in the data center 100. Examples of other network components include buses, switches, routers, load balancers, hypervisors, and Application Programming Interfaces (APIs). Along the network 136, the switches, for example, can receive packets via a plurality of input ports and can transmit packets via a plurality of output ports. The processing nodes in the data center 100 can communicate with each other through the network 136 using a variety of networking paths established by the switches. Another example of the network 136 is a Wide Area Network (WAN).

A processing node (or node) is an addressable application running on a hardware device or virtual device that attaches to a network, and is capable of sending, receiving, or forwarding information over a communications channel to or from other processing nodes. Examples of electronic devices which can be deployed as hardware processing nodes include all varieties of computers, workstations, laptop computers, handheld computers, and smartphones. Processing nodes can be implemented in a cloud-based server system. More than one virtual device configured as a processing node can be implemented using a single physical device.

The data center 100 comprises a pool of reconfigurable dataflow resources. The pool of reconfigurable dataflow resources can have a variety of compute scales and hierarchies. The pool of reconfigurable dataflow resources can be a single processing node operatively coupled to a plurality of reconfigurable processors, which in turn is supported by different bus and memory resources. The processing node can have a host processor (e.g., a CPU) that exchanges data with the reconfigurable processors, for example, over a local bus like Peripheral Component Interconnect Express (PCIe) interface. The host processor can have a runtime processor (or a runtime logic) that manages resource allocation, memory mapping, and execution of configuration files for applications requesting execution from the host processor.

The pool of reconfigurable dataflow resources can be a rack (or cluster) of processing nodes connected through the network 136. Each processing node in the rack can run a respective plurality of reconfigurable processors and include a respective host processor configured with a respective runtime processor. The runtime processors, distributed across the processing nodes, communicate with each other to provide unified access to reconfigurable processors attached not only to their own processing node but also to reconfigurable processors attached to every other processing node in the data center 100.

The pool of reconfigurable dataflow resources can be a pod that comprises a plurality of racks connected through the network 136. The pool of reconfigurable dataflow resources can be a superpod that comprises a plurality of pods connected through the network 136. The pool of reconfigurable dataflow resources can be a zone that comprises a plurality of superpods connected through the network 136. The pool of reconfigurable dataflow resources can be the data center 100 that comprises a plurality of zones connected through the network 136.

The pool of reconfigurable dataflow resources can include bus (or transfer) resources. Examples of the bus resources include PCIe channels, Direct Memory Access (DMA) channels, and Double Data Rate (DDR) channels. The pool of reconfigurable dataflow resources can include memory (or storage) resources. Examples of the memory resources include main memory (e.g., off-chip/external Dynamic Random Access Memory (DRAM), NAND flash), local secondary storage (e.g., local disks (e.g., HDD, SSD)), and remote secondary storage (e.g., distributed file systems, web servers). Other examples of the memory resources include latches, registers, flops, bypass networks, and caches (e.g., ones explicitly addressed by RAMs/DRAMs/SRAMs). The pool of reconfigurable dataflow resources is dynamically scalable to meet the performance requirements of applications requesting execution. The applications access the pool of reconfigurable dataflow resources over one or more networks (e.g., the Internet).

The discussion now returns to the first and second processing nodes of the data center 100. The first processing node comprises a first host processor 102a. Examples of the first host processor 102a include x86 and x64 processors. The first host processor 102a interfaces with a host memory 134a (e.g., RAM). The first host processor 102a has a compiler 112a to compile applications and a runtime logic 122a to execute the compiled applications on a plurality of reconfigurable processors 142a. The runtime logic 122a is configured to provide on-demand access to the pool of reconfigurable dataflow resources, which can be rapidly provisioned and released with minimal management effort or service provider interaction.

Examples of the reconfigurable processors 142a include Field Programmable Gate Arrays (FPGAs), Coarse-Grained Reconfigurable Architectures (CGRAs), Application-Specific Integrated Circuits (ASICs), and Application Specific Instruction-set Processor (ASIP). The reconfigurable processors 142a interface with a reconfigurable processor memory 162a (e.g., DRAM). Each of the reconfigurable processors 142a includes an array of configurable units (e.g., compute units and memory units) in a programmable interconnect fabric. The array of configurable units in a reconfigurable processor is partitionable into a plurality of subarrays (or tiles) of configurable units. Additional details about one implementation of the architecture of the reconfigurable processors are discussed later in this application. In other implementations, the processing nodes in the data center 100 include processors instead of/in addition to the reconfigurable processors 142a. Examples of such processors include Graphics Processing Units (GPUs) and Digital Signal Processors (DSPs).

A Network Interface Controller 132a (e.g., NIC, SmartNIC) connects the first host processor 102a and the reconfigurable processors 142a to the network 136. A bus switch 124a uses local buses 125a, 126a, and 127a to operatively couple the first host processor 102a, the reconfigurable processors 142a, and the Network Interface Controller 132a. Examples of the local buses 125a, 126a, and 127a include Peripheral Component Interconnect Express (PCIe), Cache Coherent Interconnect for Accelerators (CCIX), Compute Express Link (CXL), and Open Coherent Accelerator Processor Interface (OpenCAPI).

The second processing node comprises a second host processor 102n. Examples of the second host processor 102n include x86 and x64 processors. The second host processor 102n interfaces with a host memory 134n (e.g., RAM). The second host processor 102n has a compiler 112n to compile applications and a runtime logic 122n to execute the compiled applications on a plurality of reconfigurable processors 142n. The runtime logic 122n is configured to provide on-demand access to the pool of reconfigurable dataflow resources, which can be rapidly provisioned and released with minimal management effort or service provider interaction.

Examples of the reconfigurable processors 142n include Field Programmable Gate Arrays (FPGAs), Coarse-Grained Reconfigurable Architectures (CGRAs), Application-Specific Integrated Circuits (ASICs), and Application Specific Instruction-set Processor (ASIP). The reconfigurable processors 142n interface with a reconfigurable processor memory 162n (e.g., DRAM). Each of the reconfigurable processors 142n includes an array of configurable units (e.g., compute units and memory units) in a programmable interconnect fabric. The array of configurable units in a reconfigurable processor is partitionable into a plurality of subarrays (or tiles) of configurable units. Additional details about one implementation of the architecture of the reconfigurable processors are discussed later in this application. In other implementations, the processing nodes in the data center 100 include processors instead of/in addition to the reconfigurable processors 142n. Examples of such processors include Graphics Processing Units (GPUs) and Digital Signal Processors (DSPs).

A Network Interface Controller 132n (e.g., NIC, SmartNIC) connects the second host processor 102n and the reconfigurable processors 142n to the network 136. A bus switch 124n uses local buses 125n, 126n, and 127n to operatively couple the second host processor 102n, the reconfigurable processors 142n, and the Network Interface Controller 132n. Examples of the local buses 125n, 126n, and 127n include Peripheral Component Interconnect Express (PCIe), Cache Coherent Interconnect for Accelerators (CCIX), Compute Express Link (CXL), and Open Coherent Accelerator Processor Interface (OpenCAPI).

Having described the elements and interconnections of FIG. 1, the discussion now turns to the buffers used by the technology disclosed for latency optimization in intra-node and inter-node processing.

Buffers

Figure 2A:
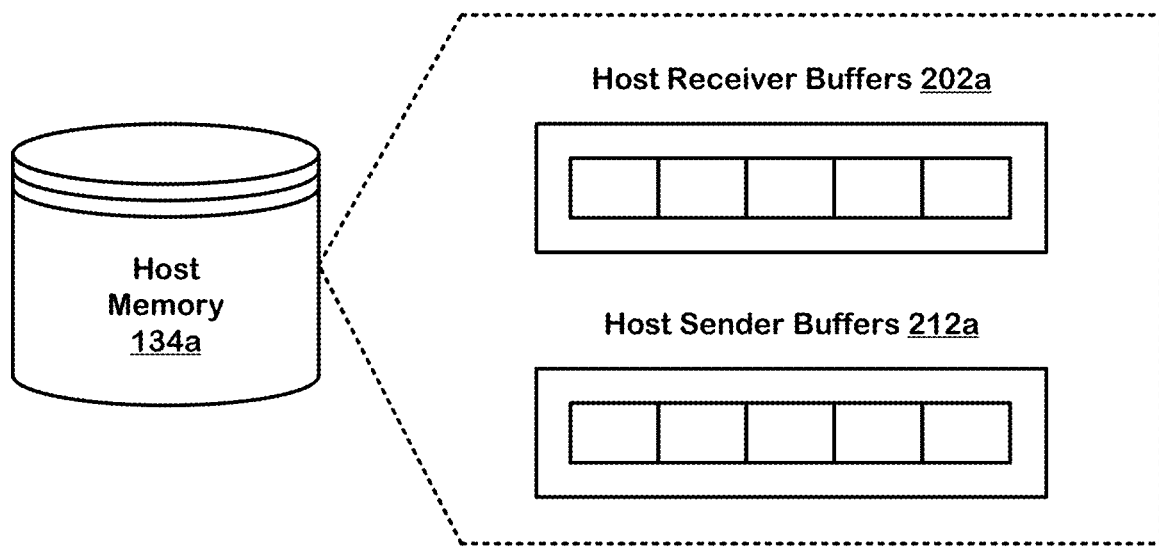
FIG. 2A shows host sender buffers and host receiver buffers located in a host memory of a first host processor of a first processing node in the data center of FIG. 1.

FIG. 2A shows host sender buffers 212a and host receiver buffers 202a located in the host memory 134a. The host sender buffers 212a are reconfigurable processors-to-host processor buffers that are configured to receive data from the reconfigurable processors 142a and provide the data to the first host processor 102a. The host receiver buffers 202a are host processor-to-reconfigurable processors buffers that are configured to receive data from the first host processor 102a and provide the data to the reconfigurable processors 142a. Examples of the data include scalar data (e.g., control bits) and vector data (e.g., vectors, tensors, arguments, commands). The host memory 134a, and therefore the host sender buffers 212a and the host receiver buffers 202a, are accessible to each of the host processors (e.g., first and second host processors 102a, 102n), each of the reconfigurable processors (e.g., reconfigurable processors 142a, 142n), and each of the Network Interface Controllers (e.g., Network Interface Controllers 132a, 132n) in the data center 100. The host sender buffers 212a and the host receiver buffers 202a can be First-In, First-Out (FIFO) buffers, First-In, Last-Out (FILO) buffers, Last-In, First-Out (LIFO) buffers, Last-In, Last-Out (LILO) buffers, or circular buffers. The host sender buffers 212a and the host receiver buffers 202a can be of size 8 bytes, 16 bytes, 32 bytes, 64 bytes, 128 bytes, 256 bytes, and so on, or any convenient size appropriate for the transfer of data between the host processor, the network interface controllers, and the reconfigurable processors.

Figure 2B:
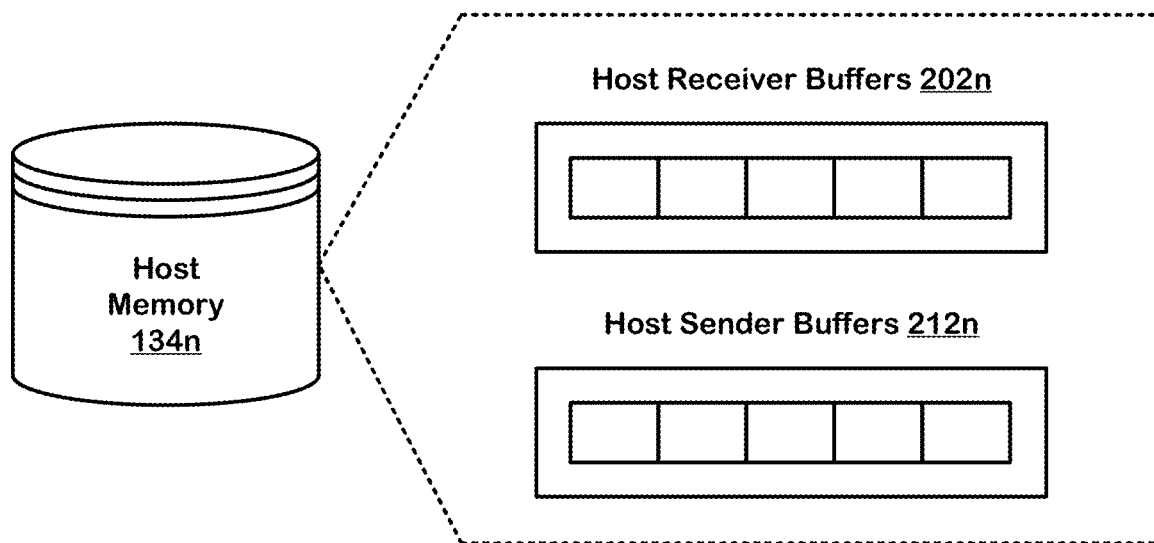
FIG. 2B shows host sender buffers and host receiver buffers located in a host memory of a second host processor of a second processing node in the data center of FIG. 1.

FIG. 2B shows host sender buffers 212n and host receiver buffers 202n located in the host memory 134n. The host sender buffers 212n are reconfigurable processors-to-host processor buffers that are configured to receive data from the reconfigurable processors 142n and provide the data to the second host processor 102n. The host receiver buffers 202n are host processor-to-reconfigurable processors buffers that are configured to receive data from the second host processor 102n and provide the data to the reconfigurable processors 142n. Examples of the data include scalar data (e.g., control bits) and vector data (e.g., vectors, tensors, arguments, commands). The host memory 134n, and therefore the host sender buffers 212n and the host receiver buffers 202n, are accessible to each of the host processors (e.g., first and second host processors 102a, 102n), each of the reconfigurable processors (e.g., reconfigurable processors 142a, 142n), and each of the Network Interface Controllers (e.g., Network Interface Controllers 132a, 132n) in the data center 100. The host sender buffers 212n and the host receiver buffers 202n can be First-In, First-Out (FIFO) buffers, First-In, Last-Out (FILO) buffers, Last-In, First-Out (LIFO) buffers, Last-In, Last-Out (LILO) buffers, or circular buffers. The host sender buffers 212n and the host receiver buffers 202n can be of size 8 bytes, 16 bytes, 32 bytes, 64 bytes, 128 bytes, 256 bytes, and so on, or any convenient size appropriate for the transfer of data between the host processor, the network interface controllers, and the reconfigurable processors.

Figure 3A:
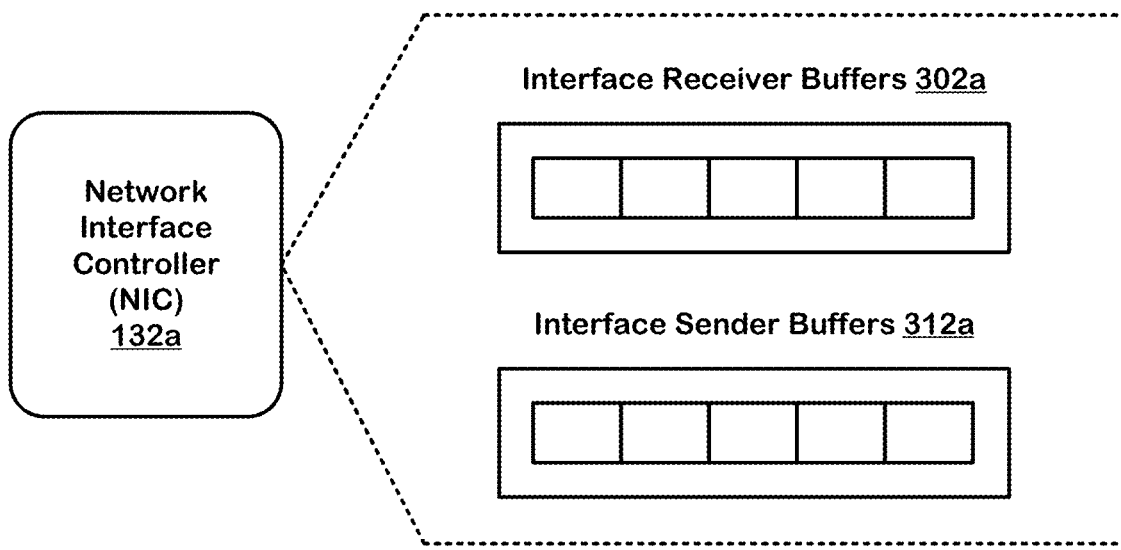
FIG. 3A shows interface sender buffers and interface receiver buffers located at a first Network Interface Controller operatively coupled to the first processing node.

FIG. 3A shows interface sender buffers 312a and interface receiver buffers 302a located at the Network Interface Controller 132a. The interface sender buffers 312a are reconfigurable processors-to-host processor buffers that are configured to receive data from the reconfigurable processors 142a and provide the data to the first host processor 102a. The interface receiver buffers 302a are host processor-to-reconfigurable processors buffers that are configured to receive data from the first host processor 102a and provide the data to the reconfigurable processors 142a. Examples of the data include scalar data (e.g., control bits) and vector data (e.g., vectors, tensors, arguments, commands). The Network Interface Controller 132a, and therefore the interface sender buffers 312a and the interface receiver buffers 302a, are accessible to each of the host processors (e.g., first and second host processors 102a, 102n), each of the reconfigurable processors (e.g., reconfigurable processors 142a, 142n), and each of the Network Interface Controllers (e.g., Network Interface Controllers 132a, 132n) in the data center 100. The interface sender buffers 312a and the interface receiver buffers 302a can be First-In, First-Out (FIFO) buffers, First-In, Last-Out (FILO) buffers, Last-In, First-Out (LIFO) buffers, Last-In, Last-Out (LILO) buffers, or circular buffers. The interface sender buffers 312a and the interface receiver buffers 302a can be of size 8 bytes, 16 bytes, 32 bytes, 64 bytes, 128 bytes, 256 bytes, and so on, or any convenient size appropriate for the transfer of data between the host processor, the network interface controllers, and the reconfigurable processors.

Figure 3B:
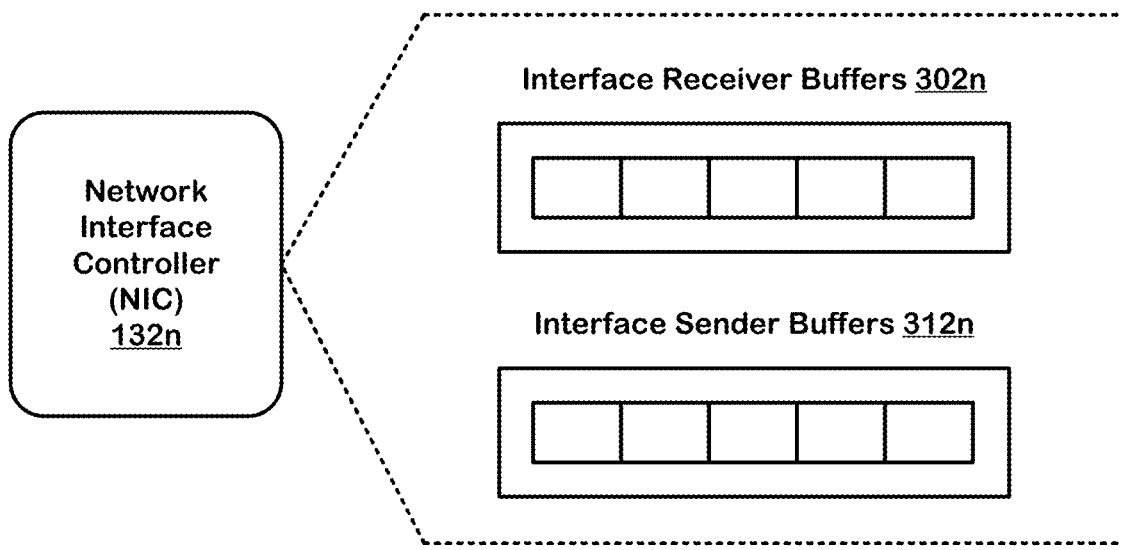
FIG. 3B shows interface sender buffers and interface receiver buffers located at a second Network Interface Controller operatively coupled to the second processing node.

FIG. 3B shows interface sender buffers 312n and interface receiver buffers 302n located at the Network Interface Controller 132n. The interface sender buffers 312n are reconfigurable processors-to-host processor buffers that are configured to receive data from the reconfigurable processors 142n and provide the data to the second host processor 102n. The interface receiver buffers 302n are host processor-to-reconfigurable processors buffers that are configured to receive data from the second host processor 102n and provide the data to the reconfigurable processors 142n. Examples of the data include scalar data (e.g., control bits) and vector data (e.g., vectors, tensors, arguments, commands). The Network Interface Controller 132n, and therefore the interface sender buffers 312n and the interface receiver buffers 302n, are accessible to each of the host processors (e.g., first and second host processors 102a, 102n), each of the reconfigurable processors (e.g., reconfigurable processors 142a, 142n), and each of the Network Interface Controllers (e.g., Network Interface Controllers 132a, 132n) in the data center 100. The interface sender buffers 312n and the interface receiver buffers 302n can be First-In, First-Out (FIFO) buffers, First-In, Last-Out (FILO) buffers, Last-In, First-Out (LIFO) buffers, Last-In, Last-Out (LILO) buffers, or circular buffers. The interface sender buffers 312n and the interface receiver buffers 302n can be of size 8 bytes, 16 bytes, 32 bytes, 64 bytes, 128 bytes, 256 bytes, and so on, or any convenient size appropriate for the transfer of data between the host processor, the network interface controllers, and the reconfigurable processors.

Figure 4A:
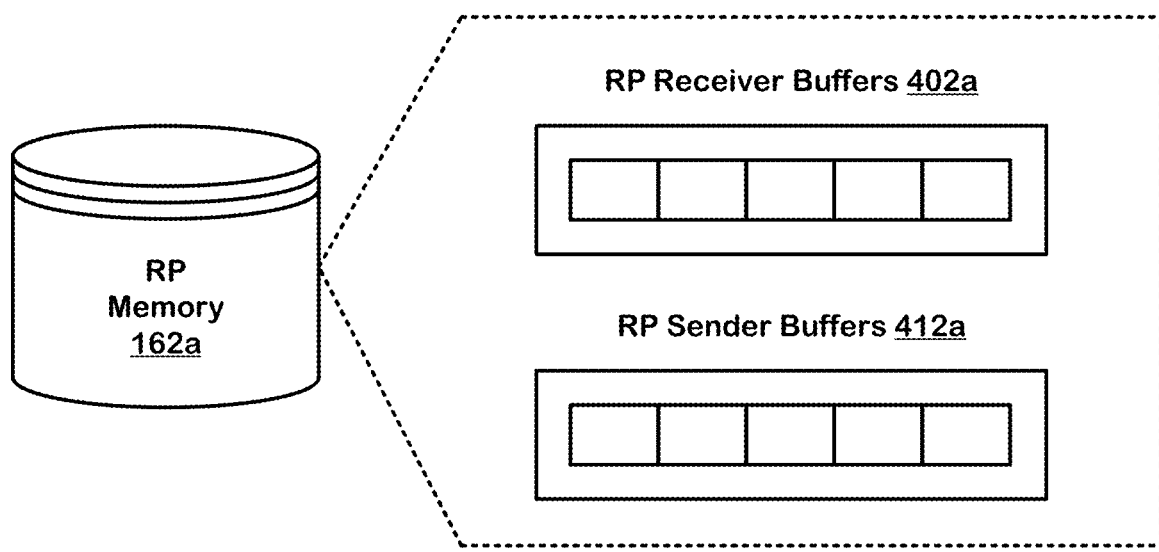
FIG. 4A shows reconfigurable processor (RP) sender buffers and reconfigurable processor receiver buffers located in a processor memory of a first reconfigurable processor operatively coupled to the first processing node.

FIG. 4A shows reconfigurable processor (RP) sender buffers 412a and reconfigurable processor (RP) receiver buffers 402a located in the reconfigurable processor memory 162a of the reconfigurable processors 142a. The reconfigurable processor sender buffers 412a are reconfigurable processors-to-host processor buffers that are configured to receive data from the reconfigurable processors 142a and provide the data to the first host processor 102a. The reconfigurable processor receiver buffers 402a are host processor-to-reconfigurable processors buffers that are configured to receive data from the first host processor 102a and provide the data to the reconfigurable processors 142a. Examples of the data include scalar data (e.g., control bits) and vector data (e.g., vectors, tensors, arguments, commands). The reconfigurable processor memory 162a, and therefore the reconfigurable processor sender buffers 412a and the reconfigurable processor receiver buffers 402a, are accessible to each of the host processors (e.g., first and second host processors 102a, 102n), each of the reconfigurable processors (e.g., reconfigurable processors 142a, 142n), and each of the Network Interface Controllers (e.g., Network Interface Controllers 132a, 132n) in the data center 100. The reconfigurable processor sender buffers 412a and the reconfigurable processor receiver buffers 402a can be First-In, First-Out (FIFO) buffers, First-In, Last-Out (FILO) buffers, Last-In, First-Out (LIFO) buffers, Last-In, Last-Out (LILO) buffers, or circular buffers. The reconfigurable processor sender buffers 412a and the reconfigurable processor receiver buffers 402a can be of size 8 bytes, 16 bytes, 32 bytes, 64 bytes, 128 bytes, 256 bytes, and so on, or any convenient size appropriate for the transfer of data between the host processor, the network interface controllers, and the reconfigurable processors.

Figure 4B:
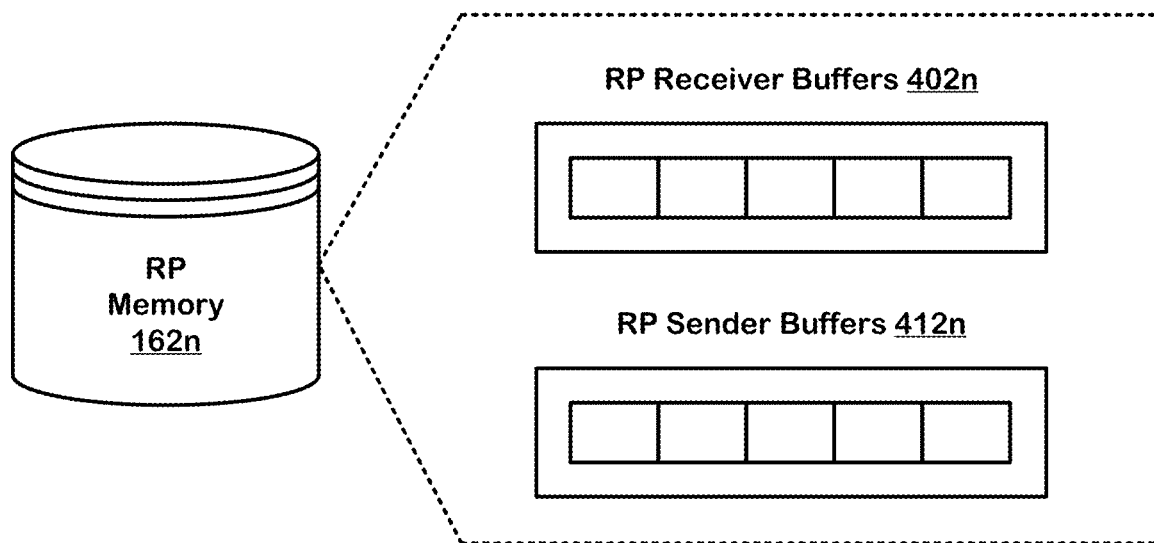
FIG. 4B shows reconfigurable processor sender buffers and reconfigurable processor receiver buffers located in a processor memory of a second reconfigurable processor operatively coupled to the second processing node.

FIG. 4B shows reconfigurable processor (RP) sender buffers 412n and reconfigurable processor (RP) receiver buffers 402n located in the reconfigurable processor memory 162n of the reconfigurable processors 142n. The reconfigurable processor sender buffers 412n are reconfigurable processors-to-host processor buffers that are configured to receive data from the reconfigurable processors 142n and provide the data to the second host processor 102n. The reconfigurable processor receiver buffers 402n are host processor-to-reconfigurable processors buffers that are configured to receive data from the second host processor 102n and provide the data to the reconfigurable processors 142n. Examples of the data include scalar data (e.g., control bits) and vector data (e.g., vectors, tensors, arguments, commands). The reconfigurable processor memory 162n, and therefore the reconfigurable processor sender buffers 412n and the reconfigurable processor receiver buffers 402n, are accessible to each of the host processors (e.g., first and second host processors 102a, 102n), each of the reconfigurable processors (e.g., reconfigurable processors 142a, 142n), and each of the Network Interface Controllers (e.g., Network Interface Controllers 132a, 132n) in the data center 100. The reconfigurable processor sender buffers 412n and the reconfigurable processor receiver buffers 402n can be First-In, First-Out (FIFO) buffers, First-In, Last-Out (FILO) buffers, Last-In, First-Out (LIFO) buffers, Last-In, Last-Out (LILO) buffers, or circular buffers. The reconfigurable processor sender buffers 412n and the reconfigurable processor receiver buffers 402n can be of size 8 bytes, 16 bytes, 32 bytes, 64 bytes, 128 bytes, 256 bytes, and so on, or any convenient size appropriate for the transfer of data between the host processor, the network interface controllers, and the reconfigurable processors.

The buffers can be defined by a virtual address space that maps to a physical range of memory addresses (which may be contiguous or discontiguous) in the memory. The virtual buffers are read from and written to at locations in the memory indicated using a read pointer and write pointer, respectfully. The pointers are held in a memory (which may be the same as or separate to memory).

Having described the buffers, the discussion now turns to the debugging logic and the testing logic disclosed by the technology disclosed.

Debugging Logic and Testing Logic

Figure 5A:
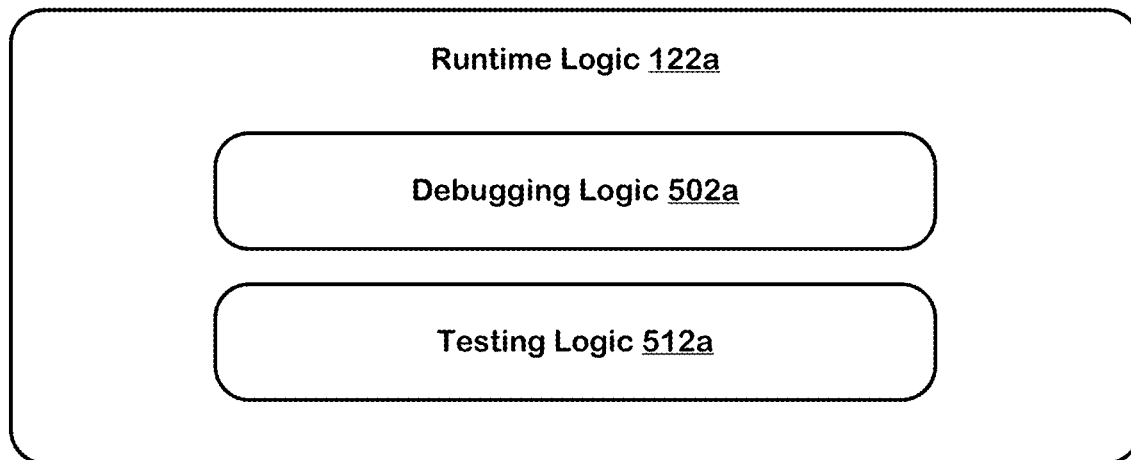
FIG. 5A is a heuristics diagram of a runtime logic running at the first host processor.

FIG. 5A is a heuristics diagram of the runtime logic 122a. The runtime logic 122a comprises debugging logic 502a and testing logic 512a. The runtime logic 122a is configured to load and execute one or more configuration files for applications on one or more of the reconfigurable processors 142a. The reconfigurable processors 142a are configured to process the configuration files and generate outputs, and to send the outputs to the first host processor 102a using at least one of the reconfigurable processors-to-host processor buffers (e.g., host sender buffers 212a, host sender buffers 212n, interface sender buffers 312a, interface sender buffers 312n, reconfigurable processor sender buffers 412a, reconfigurable processor sender buffers 412n).

The debugging logic 502a, running on the first host processor 102a, is configured to detect errors (e.g., in execution of the configuration files). In one implementation, the debugging logic 502a is further configured to report the errors to a debugging console on the first host processor 102a based on comparison of the outputs to expected outputs. In another implementation, the debugging logic 502a is further configured to report the errors to a debug output file on the first host processor 102a based on the comparison of the outputs to the expected outputs.

In some implementations, debugging logic running on a particular host processor or reconfigurable processor in the data center 100 can report errors to any other host processor or reconfigurable processor in the data center 100. For example, the debugging logic 502a, running on the first host processor 102a, can report errors to a debugging console on the second host processor 102n based on comparison of outputs to expected outputs. In another example, the debugging logic 502a can report errors to a debug output file on the second host processor 102n based on comparison of outputs to expected outputs.

The runtime logic 122a is further configured to execute, on the reconfigurable processors 142a, one or more test configuration files for test applications. The reconfigurable processors 142a are further configured to process the test configuration files and generate test outputs, and to send the test outputs to the first host processor 102a using at least one of the reconfigurable processors-to-host processor buffers (e.g., host sender buffers 212a, host sender buffers 212n, interface sender buffers 312a, interface sender buffers 312n, reconfigurable processor sender buffers 412a, reconfigurable processor sender buffers 412n). The testing logic 512a, running on the first host processor 102a, is configured to determine test statistics based on the test outputs, and to report the test statistics to a test output file on the first host processor 102a.

In some implementations, testing logic running on a particular host processor or reconfigurable processor in the data center 100 can report test statistics to a test output file on any other host processor or reconfigurable processor in the data center 100. For example, the testing logic 512a, running on the first host processor 102a, can report test statistics to a test output file on the second host processor 102n.

Figure 5B:
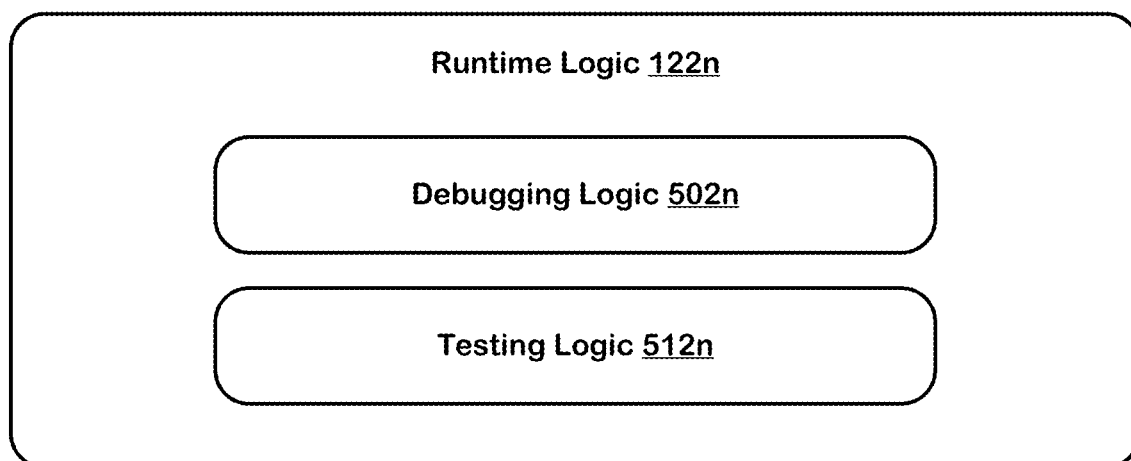
FIG. 5B is a heuristics diagram of a runtime logic running at the second host processor.

FIG. 5B is a heuristics diagram of the runtime logic 122n. The runtime logic 122n comprises debugging logic 502n and testing logic 512n. The runtime logic 122n is configured to load and execute one or more configuration files for applications on one or more of the reconfigurable processors 142n. The reconfigurable processors 142n are configured to process the configuration files and generate outputs, and to send the outputs to the second host processor 102n using at least one of the reconfigurable processors-to-host processor buffers (e.g., host sender buffers 212a, host sender buffers 212n, interface sender buffers 312a, interface sender buffers 312n, reconfigurable processor sender buffers 412a, reconfigurable processor sender buffers 412n).

The debugging logic 502n, running on the second host processor 102n, is configured to detect errors (e.g., in execution of the configuration files). In one implementation, the debugging logic 502n is further configured to report errors to a debugging console on the second host processor 102n based on comparison of the outputs to expected outputs. In another implementation, the debugging logic 502n is further configured to report the errors to a debug output file on the second host processor 102n based on the comparison of the outputs to the expected outputs.

In some implementations, debugging logic running on a particular host processor or reconfigurable processor in the data center 100 can report errors to any other host processor or reconfigurable processor in the data center 100. For example, the debugging logic 502n, running on the second host processor 102n, can report errors to a debugging console on the first host processor 102a based on comparison of outputs to expected outputs. In another example, the debugging logic 502n can report errors to a debug output file on the first host processor 102a based on comparison of outputs to expected outputs.

In some implementations, testing logic running on a particular host processor or reconfigurable processor in the data center 100 can report test statistics to a test output file on any other host processor or reconfigurable processor in the data center 100. For example, the testing logic 512n, running on the second host processor 102n, can report test statistics to a test output file on the first host processor 102a.

Figure 6:
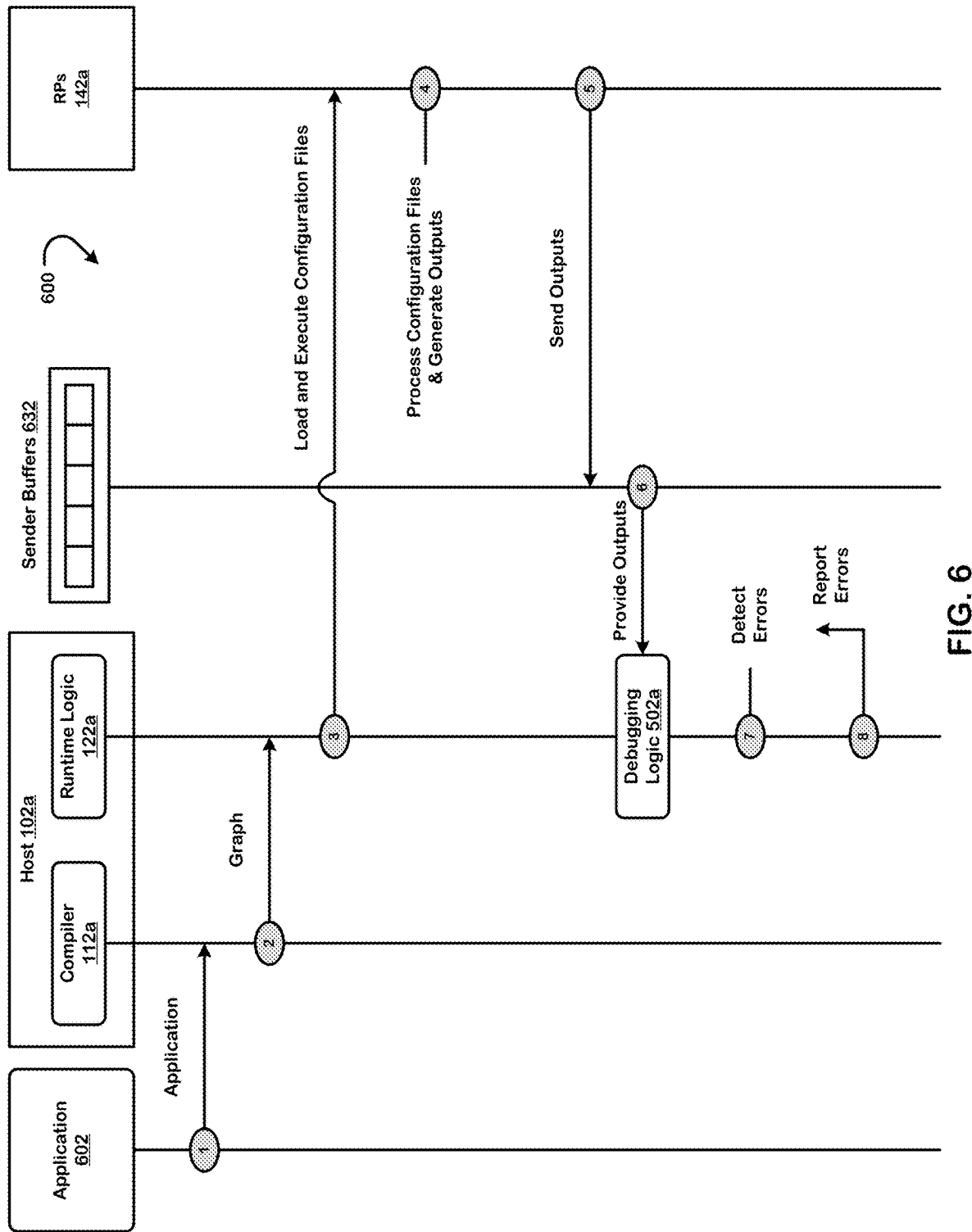
FIG. 6 is a message sequence chart illustrating one implementation of a debugging logic running at the first host processor and detecting errors in execution of configuration files on one or more of reconfigurable processors operatively coupled to the first processing node.

FIG. 6 is a message sequence chart 600 illustrating one implementation of the debugging logic 502a detecting errors in execution of configuration files on one or more of the reconfigurable processors (RP) 142a. At operation one, the compiler 112a compiles an application 602 to generate a graph that includes one or more configuration files for the application 602. At operation two, the compiler 112a sends the graph to the runtime logic 122a for execution. At operation three, the runtime logic 122a loads and executes the configuration files on one or more of the reconfigurable processors 142a. At operation four, the reconfigurable processors 142a process the configuration files and generate outputs (e.g., vectors, tensors). At operation five, the reconfigurable processors 142a send the outputs to sender buffers 632 (or reconfigurable processors-to-host processor buffers). Examples of the sender buffers 632 include host sender buffers 212a, host sender buffers 212n, interface sender buffers 312a, interface sender buffers 312n, reconfigurable processor sender buffers 412a, and reconfigurable processor sender buffers 412n. At operation six, the sender buffers 632 provide the outputs to the debugging logic 502a. At operation seven, the debugging logic 502a detects errors in the execution of the configuration files based on comparison of the outputs to expected outputs. At operation eight, the debugging logic 502a reports the errors to a debugging console or a debug output file on the first host processor 102a. Other implementations may perform the operations in different orders and/or with different, fewer, or additional operations than the ones illustrated in FIG. 6. Multiple operations can be combined in some implementations.

One skilled in the art will appreciate that, in FIG. 6, operations three and six comprise streaming network packets between reconfigurable processors (e.g., RPs 142a) and a host processor (e.g., host 102a) on a same processing node 1 over local buses (e.g., PCIe buses) using a protocol like Transmission Control Protocol (TCP).

Figure 7:
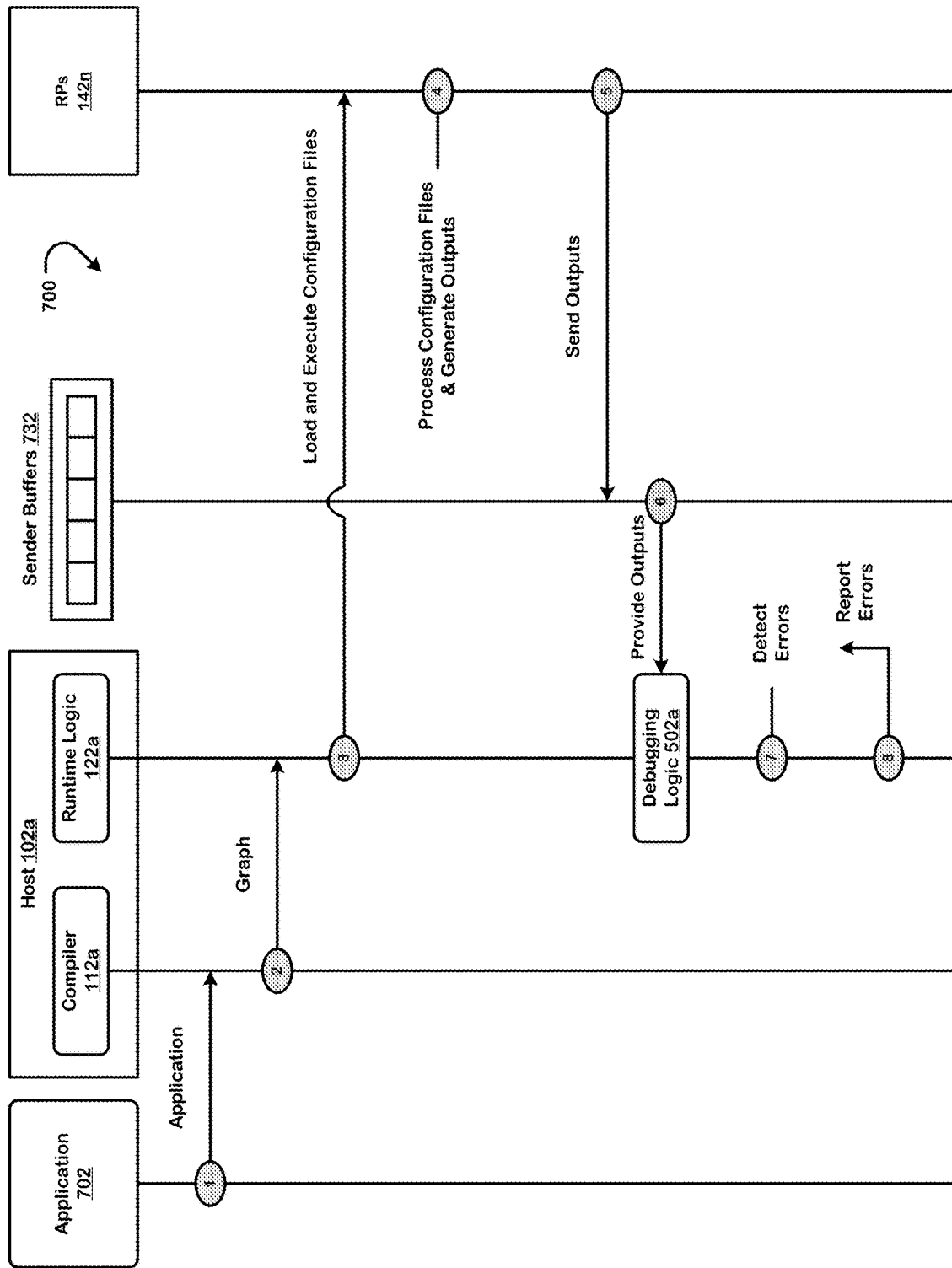
FIG. 7 is a message sequence chart illustrating one implementation of the debugging logic of FIG. 6 detecting errors in execution of configuration files on one or more of reconfigurable processors operatively coupled to the second processing node.

FIG. 7 is a message sequence chart 700 illustrating one implementation of the debugging logic 502a detecting errors in execution of configuration files on one or more of the reconfigurable processors (RP) 142n. At operation one, the compiler 112a compiles an application 702 to generate a graph that includes one or more configuration files for the application 702. At operation two, the compiler 112a sends the graph to the runtime logic 122a for execution. At operation three, the runtime logic 122a loads and executes the configuration files on one or more of the reconfigurable processors 142n. At operation four, the reconfigurable processors 142n process the configuration files and generate outputs (e.g., vectors, tensors). At operation five, the reconfigurable processors 142n send the outputs to sender buffers 732 (or reconfigurable processors-to-host processor buffers). Examples of the sender buffers 732 include host sender buffers 212a, host sender buffers 212n, interface sender buffers 312a, interface sender buffers 312n, reconfigurable processor sender buffers 412a, and reconfigurable processor sender buffers 412n. At operation six, the sender buffers 732 provide the outputs to the debugging logic 502a. At operation seven, the debugging logic 502a detects errors in the execution of the configuration files based on comparison of the outputs to expected outputs. At operation eight, the debugging logic 502a reports the errors to a debugging console or a debug output file on the first host processor 102a. Other implementations may perform the operations in different orders and/or with different, fewer, or additional operations than the ones illustrated in FIG. 7. Multiple operations can be combined in some implementations.

One skilled in the art will appreciate that, in FIG. 7, operations three and six comprise streaming network packets between one or more reconfigurable processors (e.g., RPs 142n) on the second processing node and a host processor (e.g., host 102a) on the first processing node over the network fabric 136 (e.g., Ethernet, InfiniBand (IB)) using protocols like RDMA over Converged Ethernet (RoCE), TCP, User Datagram Protocol (UDP), and Quick UDP Internet Connections (QUIC).

Figure 8:
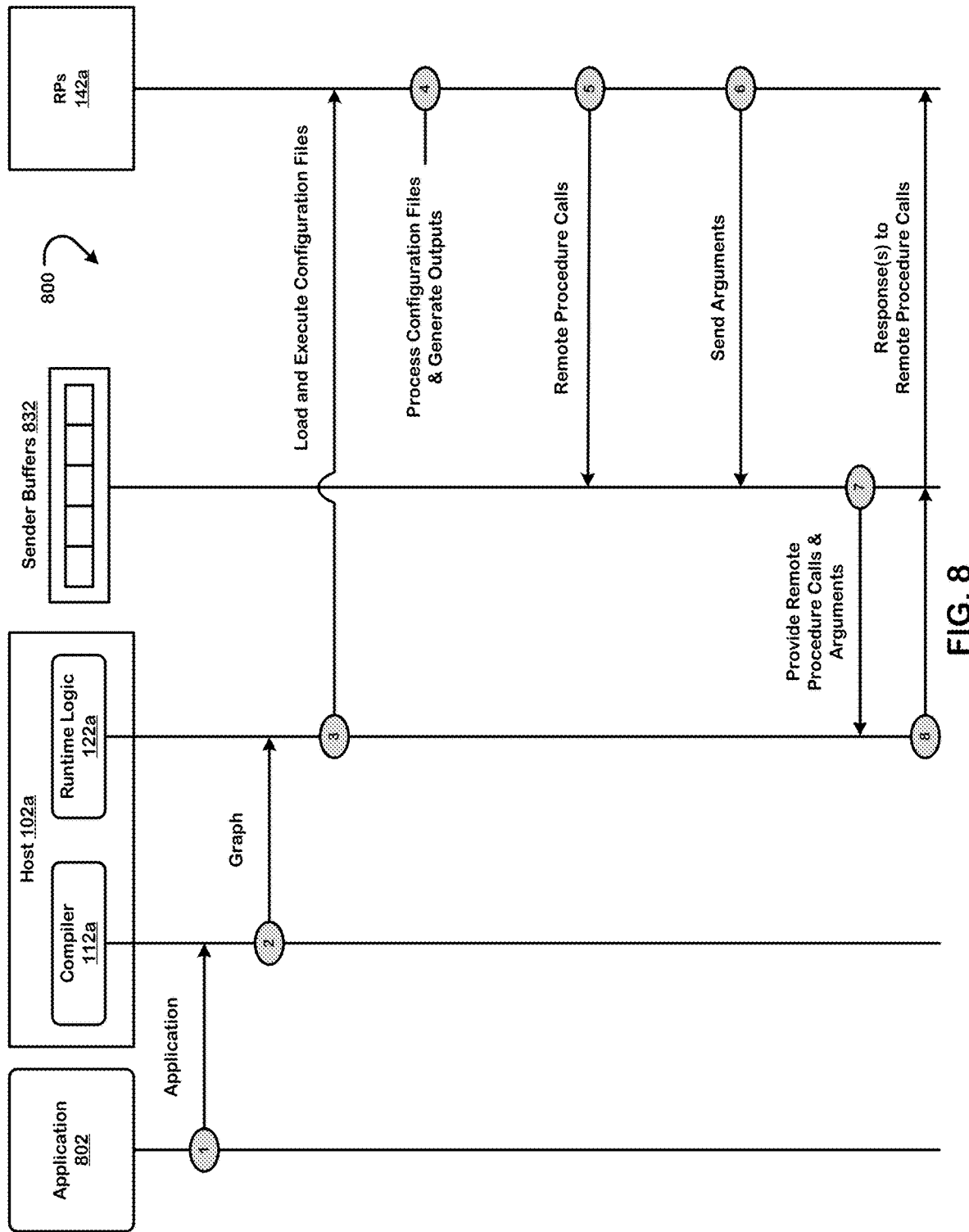
FIG. 8 is a message sequence chart illustrating one implementation of one or more of the reconfigurable processors operatively coupled to the first processing node issuing remote procedure calls to the first host processor.

FIG. 8 is a message sequence chart 800 illustrating one implementation of one or more of the reconfigurable processors (RP) 142a issuing remote procedure calls to the first host processor 102a. At operation one, the compiler 112a compiles an application 802 to generate a graph that includes one or more configuration files for the application 802. At operation two, the compiler 112a sends the graph to the runtime logic 122a for execution. At operation three, the runtime logic 122a loads and executes the configuration files on one or more of the reconfigurable processors 142a. At operation four, the reconfigurable processors 142a process the configuration files and generate outputs (e.g., vectors, tensors). At operation five, the reconfigurable processors 142a issue one or more remote procedure calls to the first host processor 102a using sender buffers 832 (or reconfigurable processors-to-host processor buffers). Examples of the sender buffers 832 include host sender buffers 212a, host sender buffers 212n, interface sender buffers 312a, interface sender buffers 312n, reconfigurable processor sender buffers 412a, and reconfigurable processor sender buffers 412n. In one implementation, the reconfigurable processors 142a notify the first host processor 102a of error reporting using the remote procedure calls. At operation six, the reconfigurable processors 142a use at least one of the sender buffers 832 to send one or more argument values to the first host processor 102a for execution of the remote procedure calls.

At operation seven, the sender buffers 832 provide the remote procedure calls and the argument values to the runtime logic 122a. At operation 8, one or more responses to the remote procedure calls are sent to the reconfigurable processors 142n via the buffers (e.g., sender buffers of the first host processor 102a and receiver buffers of the reconfigurable processors 142a). Other implementations may perform the operations in different orders and/or with different, fewer, or additional operations than the ones illustrated in FIG. 8. Multiple operations can be combined in some implementations.

One skilled in the art will appreciate that, in FIG. 8, operations three and seven comprise streaming network packets between reconfigurable processors (e.g., RPs 142a) and a host processor (e.g., host 102a) on a same processing node 1 over local buses (e.g., PCIe buses) using a protocol like Transmission Control Protocol (TCP).

Figure 9:
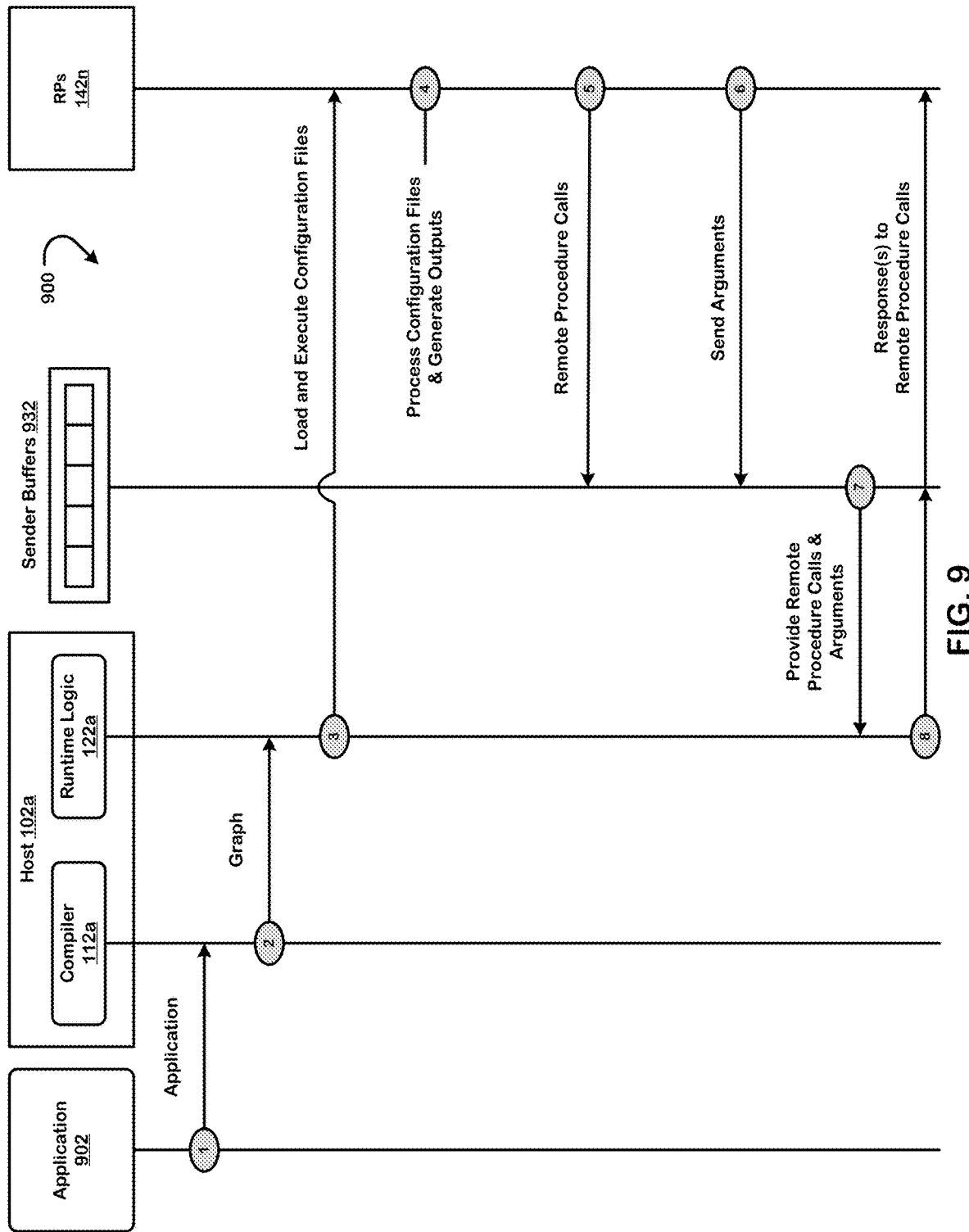
FIG. 9 is a message sequence chart illustrating one implementation of one or more of the reconfigurable processors operatively coupled to the second processing node issuing remote procedure calls to the first host processor.

FIG. 9 is a message sequence chart 900 illustrating one implementation of one or more of the reconfigurable processors (RP) 142n issuing remote procedure calls to the first host processor 102a. At operation one, the compiler 112a compiles an application 902 to generate a graph that includes one or more configuration files for the application 902. At operation two, the compiler 112a sends the graph to the runtime logic 122a for execution. At operation three, the runtime logic 122a loads and executes the configuration files on one or more of the reconfigurable processors 142n. At operation four, the reconfigurable processors 142n process the configuration files and generate outputs (e.g., vectors, tensors). At operation five, the reconfigurable processors 142n issue one or more remote procedure calls to the first host processor 102a using sender buffers 932 (or reconfigurable processors-to-host processor buffers). Examples of the sender buffers 932 include host sender buffers 212a, host sender buffers 212n, interface sender buffers 312a, interface sender buffers 312n, reconfigurable processor sender buffers 412a, and reconfigurable processor sender buffers 412n. In one implementation, the reconfigurable processors 142n notify the first host processor 102a of error reporting using the remote procedure calls. At operation six, the reconfigurable processors 142n use at least one of the sender buffers 932 to send one or more argument values to the first host processor 102a for execution of the remote procedure calls. At operation seven, the sender buffers 932 provide the remote procedure calls and the argument values to the runtime logic 122a. At operation 8, one or more responses to the remote procedure calls are sent to the reconfigurable processors 142n via the buffers (e.g., sender buffers of the first host processor 102a and receiver buffers of the reconfigurable processors 142n). Other implementations may perform the operations in different orders and/or with different, fewer, or additional operations than the ones illustrated in FIG. 9. Multiple operations can be combined in some implementations.

One skilled in the art will appreciate that, in FIG. 9, operations three and seven comprise streaming network packets between one or more reconfigurable processors (e.g., RPs 142n) on the second processing node and a host processor (e.g., host 102a) on the first processing node over the network fabric 136 (e.g., Ethernet, InfiniBand (IB)) using protocols like RDMA over Converged Ethernet (RoCE), TCP, User Datagram Protocol (UDP), and Quick UDP Internet Connections (QUIC).

Figure 10:
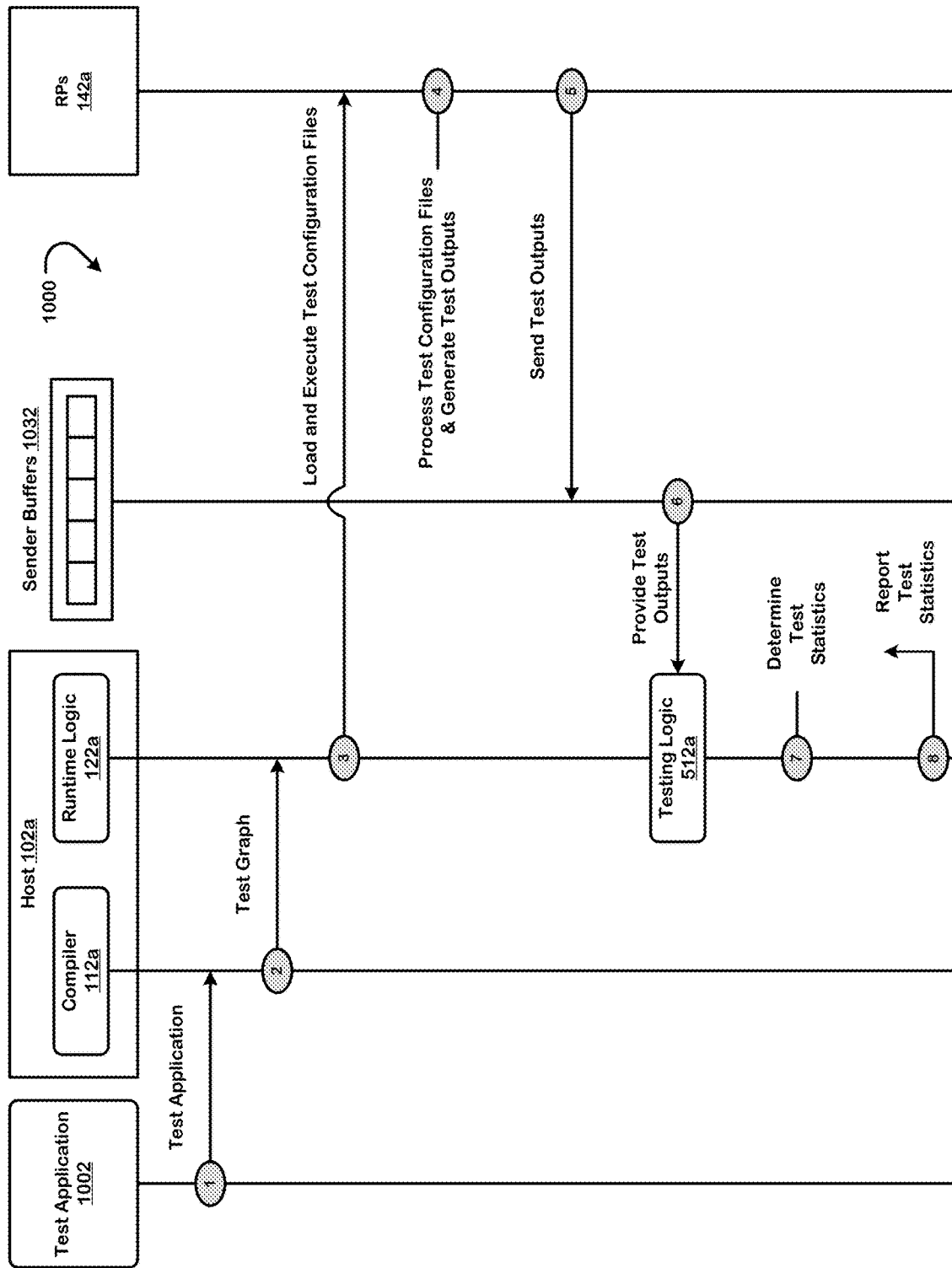
FIG. 10 is a message sequence chart illustrating one implementation of a testing logic running at the first host processor and determining and reporting test statistics for execution of test configuration files on one or more of the reconfigurable processors operatively coupled to the first processing node.

FIG. 10 is a message sequence chart 1000 illustrating one implementation of the testing logic 512a reporting test statistics for execution of test configuration files on one or more of the reconfigurable processors (RP) 142a. At operation one, the compiler 112a compiles a test application 1002 to generate a test graph that includes one or more test configuration files for the test application 1002. At operation two, the compiler 112a sends the test graph to the runtime logic 122a for execution. At operation three, the runtime logic 122a loads and executes the test configuration files on one or more of the reconfigurable processors 142a. At operation four, the reconfigurable processors 142a process the test configuration files and generate test outputs (e.g., vectors, tensors). At operation five, the reconfigurable processors 142a send the test outputs to sender buffers 1032 (or reconfigurable processors-to-host processor buffers). Examples of the sender buffers 1032 include host sender buffers 212a, host sender buffers 212n, interface sender buffers 312a, interface sender buffers 312n, reconfigurable processor sender buffers 412a, and reconfigurable processor sender buffers 412n. At operation six, the sender buffers 1032 provide the test outputs to the testing logic 512a. At operation seven, the testing logic 512a determines test statistics based on the test outputs. At operation eight, the testing logic 512a reports the test statistics to a test output file on the first host processor 102a. Other implementations may perform the operations in different orders and/or with different, fewer, or additional operations than the ones illustrated in FIG. 10. Multiple operations can be combined in some implementations.

One skilled in the art will appreciate that, in FIG. 10, operations three and six comprise streaming network packets between reconfigurable processors (e.g., RPs 142a) and a host processor (e.g., host 102a) on a same processing node 1 over local buses (e.g., PCIe buses) using a protocol like Transmission Control Protocol (TCP).

Figure 11:
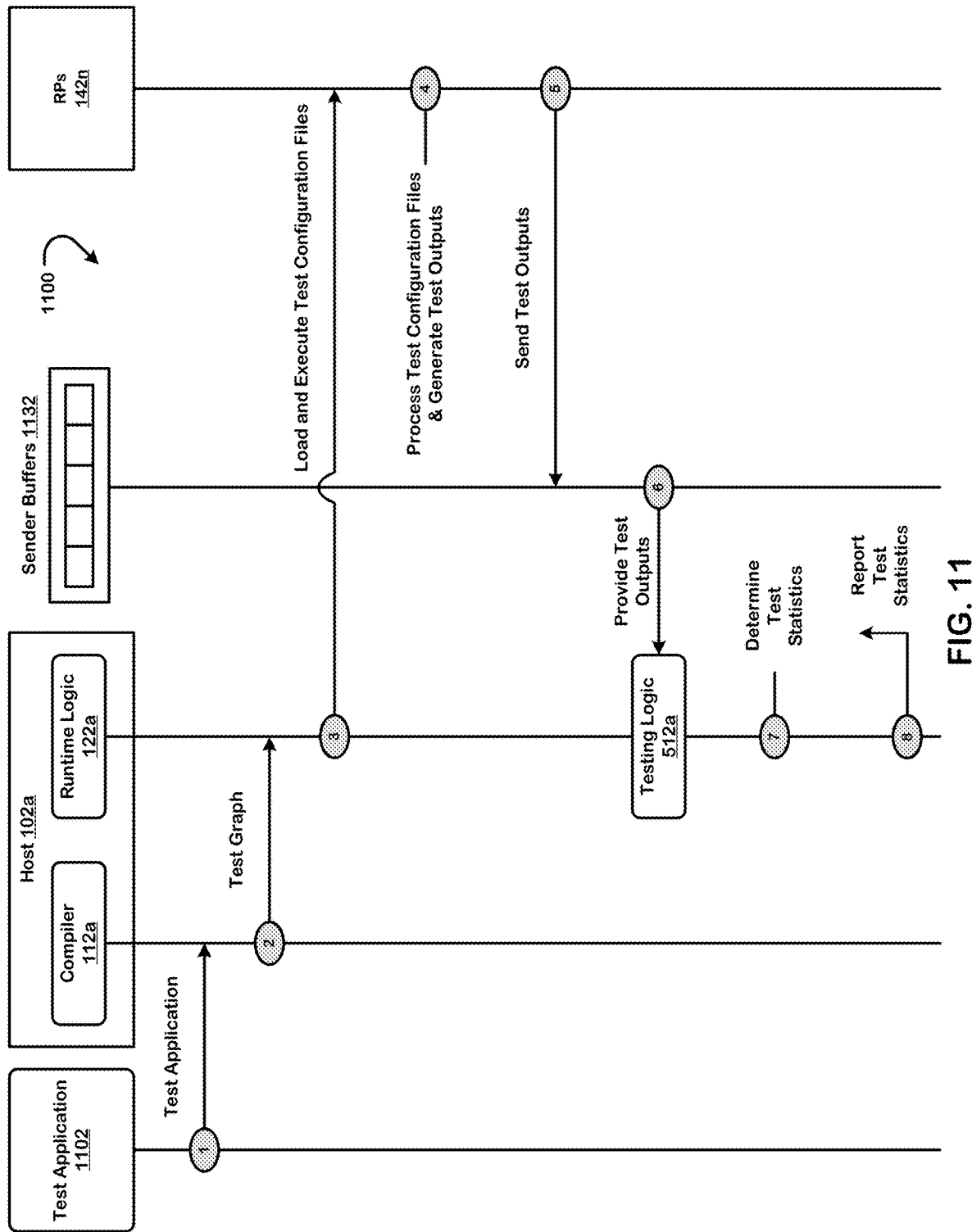
FIG. 11 is a message sequence chart illustrating one implementation of the testing logic of FIG. 10 determining and reporting test statistics for execution of test configuration files on one or more of the reconfigurable processors operatively coupled to the second processing node.

FIG. 11 is a message sequence chart 1100 illustrating one implementation of the testing logic 512a reporting test statistics for execution of test configuration files on one or more of the reconfigurable processors (RP) 142n. At operation one, the compiler 112a compiles a test application 1102 to generate a test graph that includes one or more test configuration files for the test application 1102. At operation two, the compiler 112a sends the test graph to the runtime logic 122a for execution. At operation three, the runtime logic 122a loads and executes the test configuration files on one or more of the reconfigurable processors 142n. At operation four, the reconfigurable processors 142n process the test configuration files and generate test outputs (e.g., vectors, tensors). At operation five, the reconfigurable processors 142n send the test outputs to sender buffers 1132 (or reconfigurable processors-to-host processor buffers). Examples of the sender buffers 1132 include host sender buffers 212a, host sender buffers 212n, interface sender buffers 312a, interface sender buffers 312n, reconfigurable processor sender buffers 412a, and reconfigurable processor sender buffers 412n. At operation six, the sender buffers 1132 provide the test outputs to the testing logic 512a. At operation seven, the testing logic 512a determines test statistics based on the test outputs. At operation eight, the testing logic 512a reports the test statistics to a test output file on the first host processor 102a. Other implementations may perform the operations in different orders and/or with different, fewer, or additional operations than the ones illustrated in FIG. 11. Multiple operations can be combined in some implementations.

One skilled in the art will appreciate that, in FIG. 11, operations three and six comprise streaming network packets between one or more reconfigurable processors (e.g., RPs 142n) on the second processing node and a host processor (e.g., host 102a) on the first processing node over the network fabric 136 (e.g., Ethernet, InfiniBand (IB)) using protocols like RDMA over Converged Ethernet (RoCE), TCP, User Datagram Protocol (UDP), and Quick UDP Internet Connections (QUIC).

Having described the debugging logic and the testing logic, the discussion now turns to the reconfigurable processor-to-host processor workload sharing disclosed by the technology disclosed.

Reconfigurable Processor-to-Host Processor Workload Sharing

Figure 12:
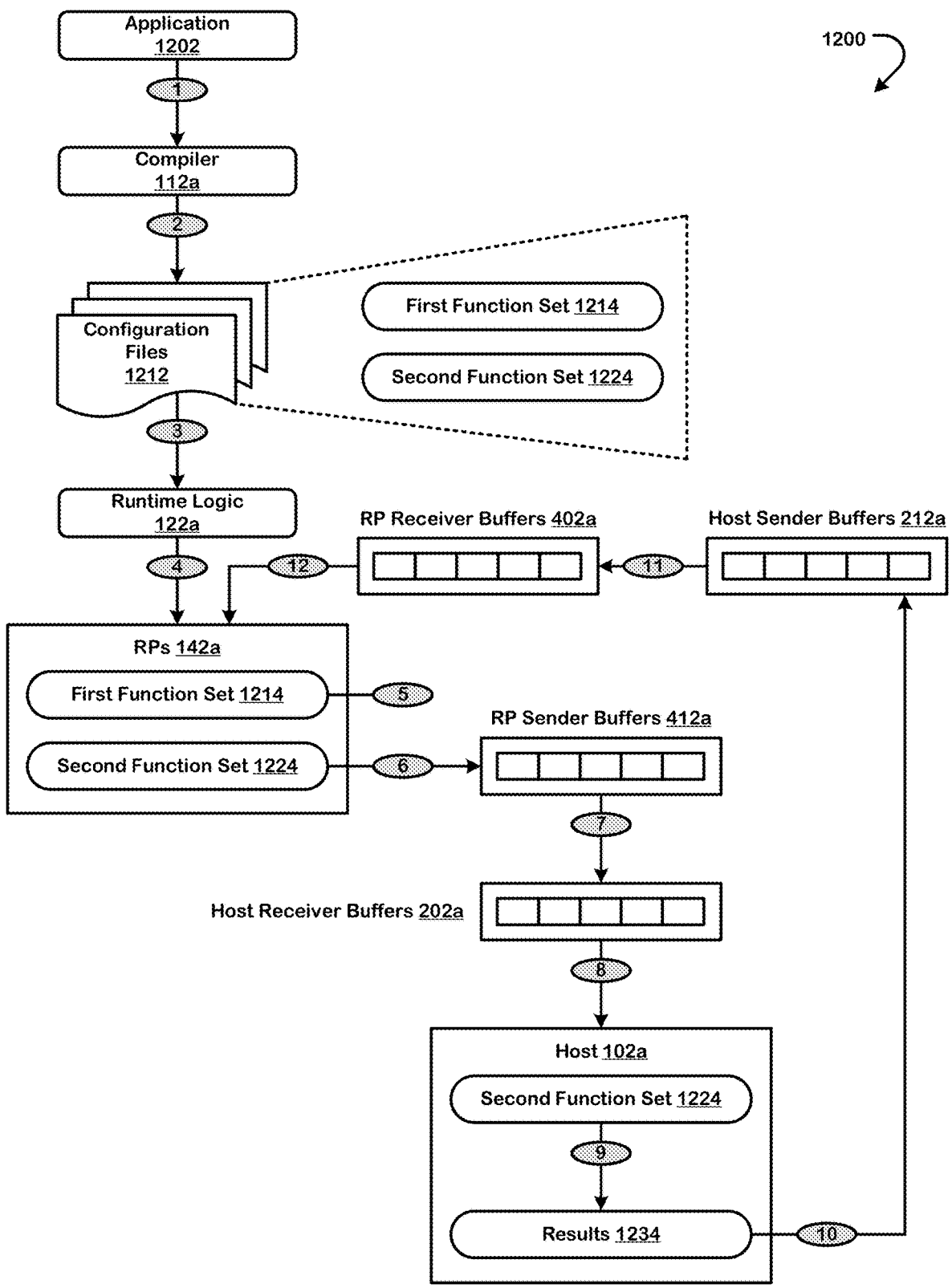
FIG. 12 is a message sequence chart illustrating one implementation of executing a first set of functions in configuration files on one or more of the reconfigurable processors operatively coupled to the first processing node and executing a second set of functions in the configuration files on the first host processor.

FIG. 12 is a message sequence chart 1200 illustrating one implementation of executing a first set of functions in configuration files and/or data therefor (e.g., weights, coefficients, vectors, tensors (image data, audio data, natural language processing (NLP data), control data (e.g., control tokens)) on one or more of the reconfigurable processors (RP) 142*a* and executing a second set of functions and/or data therefor (e.g., weights, coefficients, vectors, tensors (image data, audio data, natural language processing (NLP data), control data (e.g., control tokens)) in the configuration files on the first host processor 102*a*. At operation one, the compiler 112*a* receives an application 1202 for compilation. At operation two, the compiler 112*a* compiles the application 1202 to generate one or more configuration files 1212. The configuration files 1212 include a plurality of functions. The plurality of functions includes a first set of functions 1214 and a second set of functions 1224. Examples of functions in the plurality of functions include non-linearities like Rectified Linear Unit (ReLU) and its variants (e.g., leaky ReLU), hyperbolic tangent, sigmoid, and softmax, element-wise addition, matrix multiplication (e.g., General Matrix Multiply (GeMM)), layer normalization (e.g., batch normalization), loss functions like cross-entropy, and tensor shape modifiers like transpose. At operation three, the compiler 112*a* sends the configuration files 1212 to the runtime logic 122*a* for execution. At operation four, the runtime logic 122*a* loads the first set of functions 1214 and/or the data therefor (e.g., weights, coefficients, vectors, tensors (image data, audio data, natural language processing (NLP data), control data (e.g., control tokens)) and the second set of functions 1224 and/or the data therefor (e.g., weights, coefficients, vectors, tensors (image data, audio data, natural language processing (NLP data), control data (e.g., control tokens)) on one or more of the reconfigurable processors 142*a*. At operation five, the reconfigurable processors 142*a* process the first set of functions 1214 and/or the data therefor (e.g., weights, coefficients, vectors, tensors (image data, audio data, natural language processing (NLP data), control data (e.g., control tokens)) and generate a first set of outputs (e.g., vectors, tensors). The reconfigurable processors 142*a* transmit functions in the second set of functions 1224 and/or the data therefor (e.g., weights, coefficients, vectors, tensors (image data, audio data, natural language processing (NLP data), control data (e.g., control tokens)) to the first host processor 102*a* using one or more reconfigurable processors-to-host processor buffers. This is referred to herein as "reconfigurable processor-to-host processor workload sharing." In one implementation, data on which the functions in the second set of functions 1224 are executed is transmitted to the first host processor 102*a* using the reconfigurable processors-to-host processor buffers. In some implementations, respective ones of the reconfigurable processors-to-host processor buffers are used to transmit respective functions in the second set of functions 1224 and/or data therefor (e.g., weights, coefficients, vectors, tensors (image data, audio data, natural language processing (NLP data), control data (e.g., control tokens)) to the first host processor 102*a*. One example workload sharing flow includes using one or more of the reconfigurable processor sender buffers 412*a* and one or more of the host receiver buffers 202*a*. At operation six, the reconfigurable processors 142*a* transmit the functions in the second set of functions 1224 and/or the data therefor (e.g., weights, coefficients, vectors, tensors (image data, audio data, natural language processing (NLP data), control data (e.g., control tokens)) to the reconfigurable processor sender buffers 412*a*. At operation seven, the reconfigurable processor sender buffers 412*a* transmit the functions in the second set of functions 1224 and/or the data therefor (e.g., weights, coefficients, vectors, tensors (image data, audio data, natural language processing (NLP data), control data (e.g., control tokens)) to the host receiver buffers 202*a*. At operation eight, the host receiver buffers 202*a* transmit the functions in the second set of functions 1224 and/or the data therefor (e.g., weights, coefficients, vectors, tensors (image data, audio data, natural language processing (NLP data), control data (e.g., control tokens)) to the first host processor 102*a*. At operation nine, the first host processor 102*a* executes the functions in the second set of functions 1224 and/or the data therefor (e.g., weights, coefficients, vectors, tensors (image data, audio data, natural language processing (NLP data), control data (e.g., control tokens)) to generate a second set of outputs (or results 1234) (e.g., vectors, tensors). The first host processor 102*a* transmits the results 1234 to one or more of the reconfigurable processors 142*a* using one or more host processor-to-reconfigurable processors buffers. In some implementations, respective ones of the host processor-to-reconfigurable processors buffers are used to transmit respective results of executing respective functions in the second set of functions 1224 and/or data therefor (e.g., weights, coefficients, vectors, tensors (image data, audio data, natural language processing (NLP data), control data (e.g., control tokens)) to the reconfigurable processors 142*a*. One workload sharing flow includes using one or more of the host sender buffers 212*a* and one or more of the reconfigurable processor receiver buffers 402*a*. At operation ten, the first host processor 102*a* transmits the results 1234 to the host sender buffers 212*a*. At operation eleven, the host sender buffers 212*a* transmit the results 1234 to the reconfigurable processor receiver buffers 402*a*. At operation twelve, the reconfigurable processor receiver buffers 402*a* transmit the results 1234 to the reconfigurable processors 142*a*. In some implementations, one or more functions in the first set of functions 1214 waits for results of execution of one or more functions in the second set of functions 1224 and/or the data therefor (e.g., weights, coefficients, vectors, tensors (image data, audio data, natural language processing (NLP data), control data (e.g., control tokens)) on the first host processor 102*a* to combine the results with results of execution of one or more functions in the first set of functions 1214 and/or the data therefor (e.g., weights, coefficients, vectors, tensors (image data, audio data, natural language processing (NLP data), control data (e.g., control tokens)) on the reconfigurable processors 142*a*. In other implementations, the first set of functions 1214 and the second set of functions 1224 operate separately and in parallel. In one implementation, one or more functions in the second set of functions 1224 daisy chains the results to one or more functions in the first set of functions 1214, and vice-versa. In another implementation, one or more functions in the second set of functions 1224 executes for a certain number of iterations before returning the results to the reconfigurable processors 142*a*. Other implementations may perform the operations in different orders and/or with different, fewer, or additional operations than the ones illustrated in FIG. 12. Multiple operations can be combined in some implementations.

One skilled in the art will appreciate that, in FIG. 12, operations six, seven, eight, ten, eleven, and twelve comprise streaming network packets between reconfigurable processors (e.g., RPs 142a) and a host processor (e.g., host 102a) on a same processing node 1 over local buses (e.g., PCIe buses) using a protocol like Transmission Control Protocol (TCP).

Figure 13:
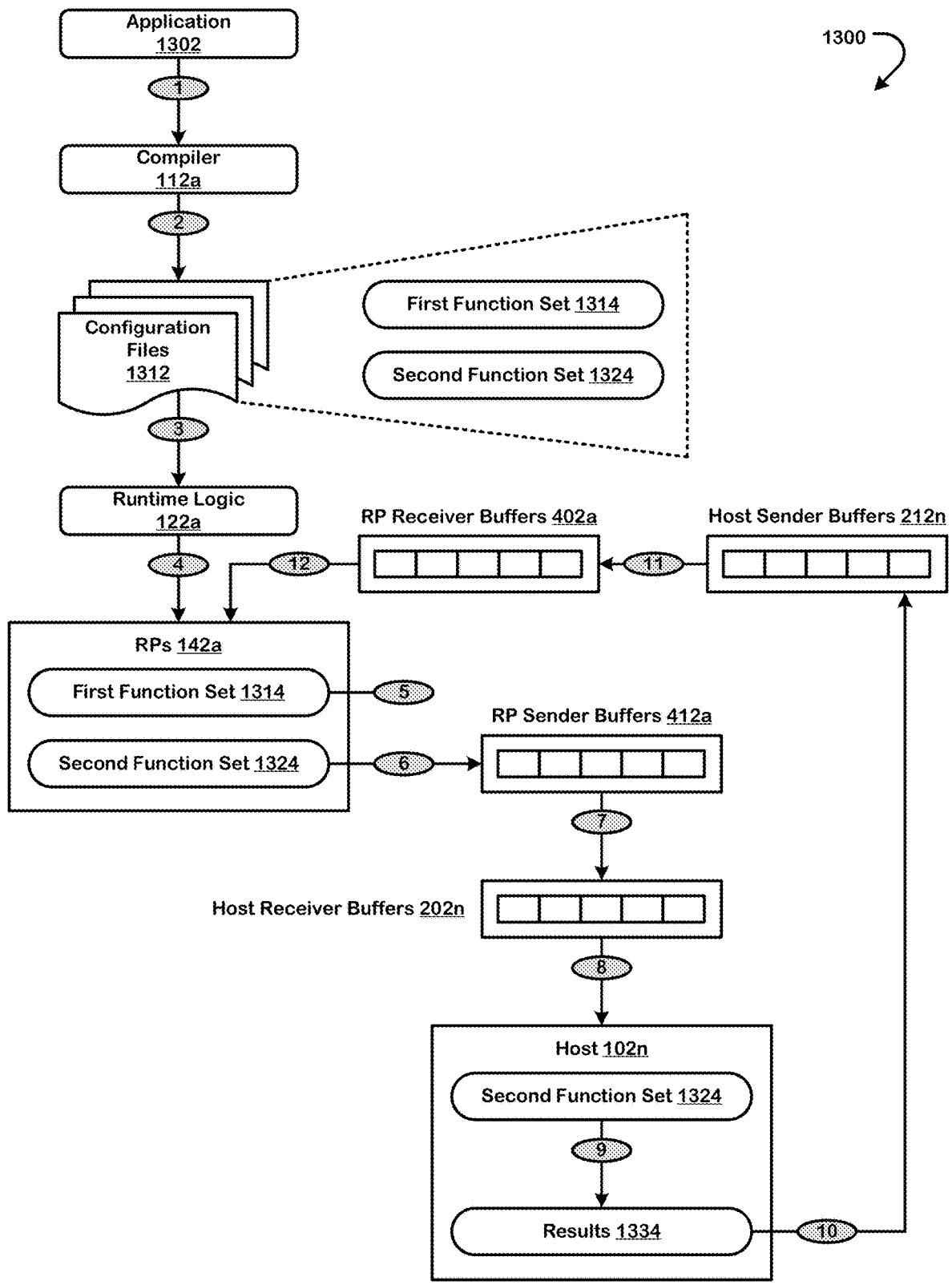
FIG. 13 is a message sequence chart illustrating one implementation of executing a first set of functions in configuration files on one or more of the reconfigurable processors operatively coupled to the first processing node and executing a second set of functions in the configuration files on the second host processor.

FIG. 13 is a message sequence chart 1300 illustrating one implementation of executing a first set of functions in configuration files and/or data therefor (e.g., weights, coefficients, vectors, tensors (image data, audio data, natural language processing (NLP data), control data (e.g., control tokens)) on one or more of the reconfigurable processors (RP) 142a and executing a second set of functions and/or data therefor (e.g., weights, coefficients, vectors, tensors (image data, audio data, natural language processing (NLP data), control data (e.g., control tokens)) in the configuration files on the second host processor 102n. At operation one, the compiler 112a receives an application 1302 for compilation. At operation two, the compiler 112a compiles the application 1302 to generate one or more configuration files 1312. The configuration files 1312 include a plurality of functions. The plurality of functions includes a first set of functions 1314 and a second set of functions 1324. Examples of functions in the plurality of functions include non-linearities like Rectified Linear Unit (ReLU) and its variants (e.g., leaky ReLU), hyperbolic tangent, sigmoid, and softmax, element-wise addition, matrix multiplication (e.g., General Matrix Multiply (GeMM)), layer normalization (e.g., batch normalization), loss functions like cross-entropy, and tensor shape modifiers like transpose. At operation three, the compiler 112a sends the configuration files 1312 to the runtime logic 122a for execution. At operation four, the runtime logic 122a loads the first set of functions 1314 and/or the data therefor (e.g., weights, coefficients, vectors, tensors (image data, audio data, natural language processing (NLP data), control data (e.g., control tokens)) and the second set of functions 1324 and/or the data therefor (e.g., weights, coefficients, vectors, tensors (image data, audio data, natural language processing (NLP data), control data (e.g., control tokens)) on one or more of the reconfigurable processors 142a. At operation five, the reconfigurable processors 142a process the first set of functions 1314 and/or the data therefor (e.g., weights, coefficients, vectors, tensors (image data, audio data, natural language processing (NLP data), control data (e.g., control tokens)) and generate a first set of outputs (e.g., vectors, tensors). The reconfigurable processors 142a transmit functions in the second set of functions 1324 and/or data therefor (e.g., weights, coefficients, vectors, tensors (image data, audio data, natural language processing (NLP data), control data (e.g., control tokens)) to the second host processor 102n using one or more reconfigurable processors-to-host processor buffers. This is referred to herein as "reconfigurable processor-to-host processor workload sharing." In one implementation, data on which the functions in the second set of functions 1324 are executed is transmitted to the second host processor 102n using the reconfigurable processors-to-host processor buffers. In some implementations, respective ones of the reconfigurable processors-to-host processor buffers are used to transmit respective functions in the second set of functions 1324 and/or data therefor (e.g., weights, coefficients, vectors, tensors (image data, audio data, natural language processing (NLP data), control tokens)) to the second host processor 102n. One example workload sharing flow includes using one or more of the reconfigurable processor sender buffers 412a and one or more of the host receiver buffers 202n. At operation six, the reconfigurable processors 142a transmit the functions in the second set of functions 1324 and/or the data therefor (e.g., weights, coefficients, vectors, tensors (image data, audio data, natural language processing (NLP data), control data (e.g., control tokens)) to the reconfigurable processor sender buffers 412a. At operation seven, the reconfigurable processor sender buffers 412a transmit the functions in the second set of functions 1324 and/or the data therefor (e.g., weights, coefficients, vectors, tensors (image data, audio data, natural language processing (NLP data), control data (e.g., control tokens)) to the host receiver buffers 202n. At operation eight, the host receiver buffers 202n transmit the functions in the second set of functions 1324 and/or the data therefor (e.g., weights, coefficients, vectors, tensors (image data, audio data, natural language processing (NLP data), control data (e.g., control tokens)) to the second host processor 102n. At operation nine, the second host processor 102n executes the functions in the second set of functions 1324 and/or the data therefor (e.g., weights, coefficients, vectors, tensors (image data, audio data, natural language processing (NLP data), control data (e.g., control tokens)) to generate a second set of outputs (or results 1334) (e.g., vectors, tensors). The second host processor 102n transmits the results 1334 to one or more of the reconfigurable processors 142a using one or more host processor-to-reconfigurable processors buffers. In some implementations, respective ones of the host processor-to-reconfigurable processors buffers are used to transmit respective results of executing respective functions in the second set of functions 1324 and/or data therefor (e.g., weights, coefficients, vectors, tensors (image data, audio data, natural language processing (NLP data), control data (e.g., control tokens)) to the reconfigurable processors 142a. One workload sharing flow includes using one or more of the host sender buffers 212n and one or more of the reconfigurable processor receiver buffers 402a. At operation ten, the second host processor 102n transmits the results 1334 to the host sender buffers 212n. At operation eleven, the host sender buffers 212n transmit the results 1334 to the reconfigurable processor receiver buffers 402a. At operation twelve, the reconfigurable processor receiver buffers 402a transmit the results 1334 to the reconfigurable processors 142a. In some implementations, one or more functions in the first set of functions 1314 waits for results of execution of one or more functions in the second set of functions 1324 on the second host processor 102n to combine the results with results of execution of one or more functions in the first set of functions 1314 and/or the data therefor (e.g., weights, coefficients, vectors, tensors (image data, audio data, natural language processing (NLP data), control data (e.g., control tokens)) on the reconfigurable processors 142a. In other implementations, the first set of functions 1314 and the second set of functions 1324 operate separately and in parallel. In one implementation, one or more functions in the second set of functions 1324 daisy chains the results to one or more functions in the first set of functions 1314, and vice-versa. In another implementation, one or more functions in the second set of functions 1324 executes for a certain number of iterations before returning the results to the reconfigurable processors 142a. Other implementations may perform the operations in different orders and/or with different, fewer, or additional operations than the ones illustrated in FIG. 13. Multiple operations can be combined in some implementations.

One skilled in the art will appreciate that, in FIG. 13, operations six, seven, eight, ten, eleven, and twelve comprise streaming network packets between one or more reconfigurable processors (e.g., RPs 142a) on the first processing node and a host processor (e.g., host 102n) on the second processing node over the network fabric 136 (e.g., Ethernet, InfiniBand (IB)) using protocols like RDMA over Converged Ethernet (RoCE), TCP, User Datagram Protocol (UDP), and Quick UDP Internet Connections (QUIC).

Having described the reconfigurable processor-to-host processor workload sharing, the discussion now turns to the reconfigurable processor-to-reconfigurable processor workload sharing disclosed by the technology disclosed.

Reconfigurable Processor-to-Reconfigurable Processor Workload Sharing

Figure 14A:
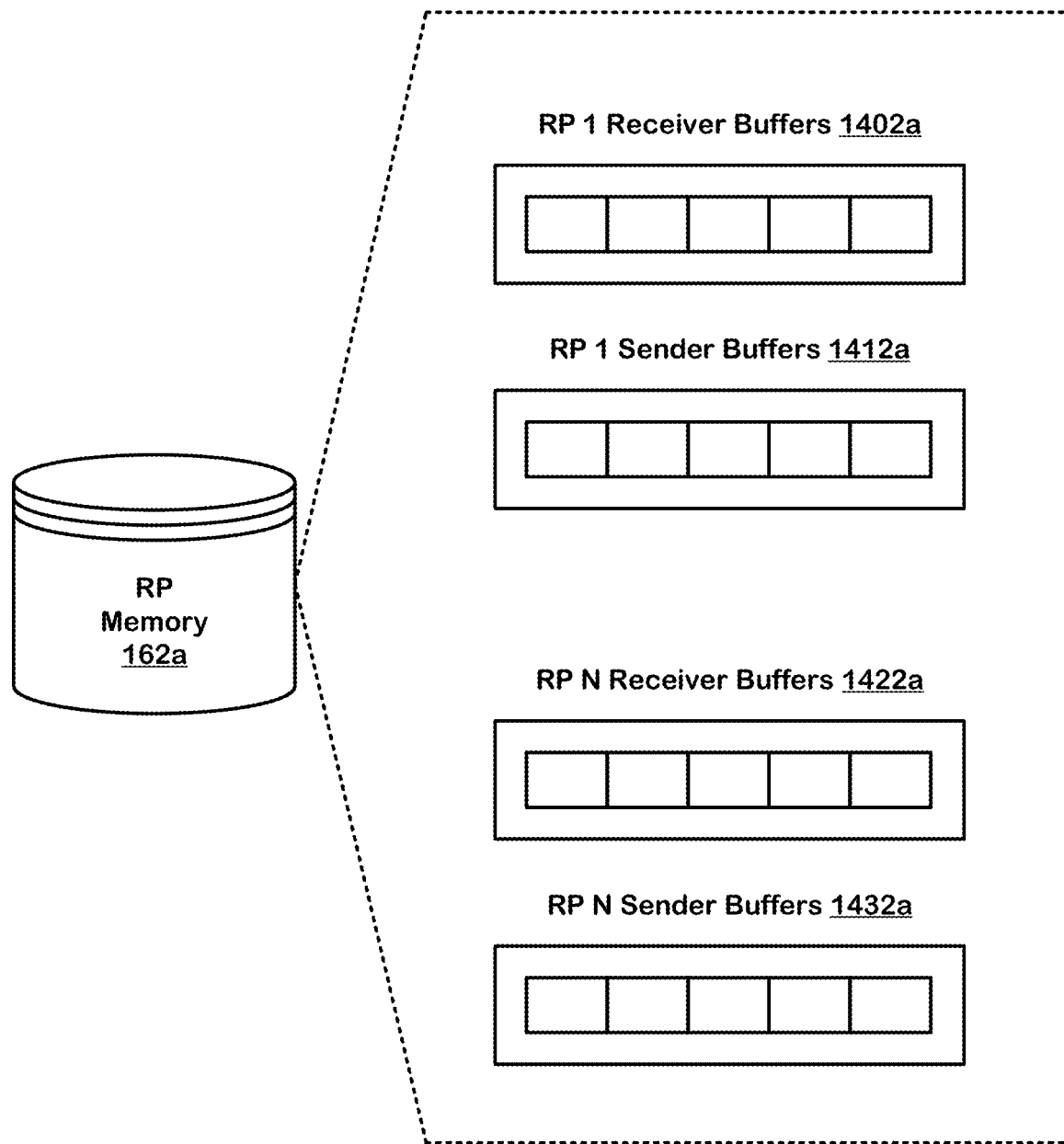
FIG. 14A shows sender and receiver buffers used by individual reconfigurable processors in the reconfigurable processors operatively coupled to the first processing node for data streaming.

FIG. 14A shows sender and receiver buffers used by individual reconfigurable processors in the reconfigurable processors 142a. Reconfigurable processor 1 (RP 1) receiver buffers 1402a and reconfigurable processor 1 (RP 1) sender buffers 1412a are used by a first reconfigurable processor in the reconfigurable processors 142a to receive data from and send data to another host processor or reconfigurable processor in the data center 100. Reconfigurable processor n (RP n) receiver buffers 1422a and reconfigurable processor n (RP n) sender buffers 1432a are used by a second reconfigurable processor in the reconfigurable processors 142a to receive data from and send data to another host processor or reconfigurable processor in the data center 100. The reconfigurable processor 1 receiver buffers 1402a, the reconfigurable processor 1 sender buffers 1412a, the reconfigurable processor n receiver buffers 1422a, and the reconfigurable processor n sender buffers 1432a are located in the reconfigurable processor memory 162a.

Figure 14B:
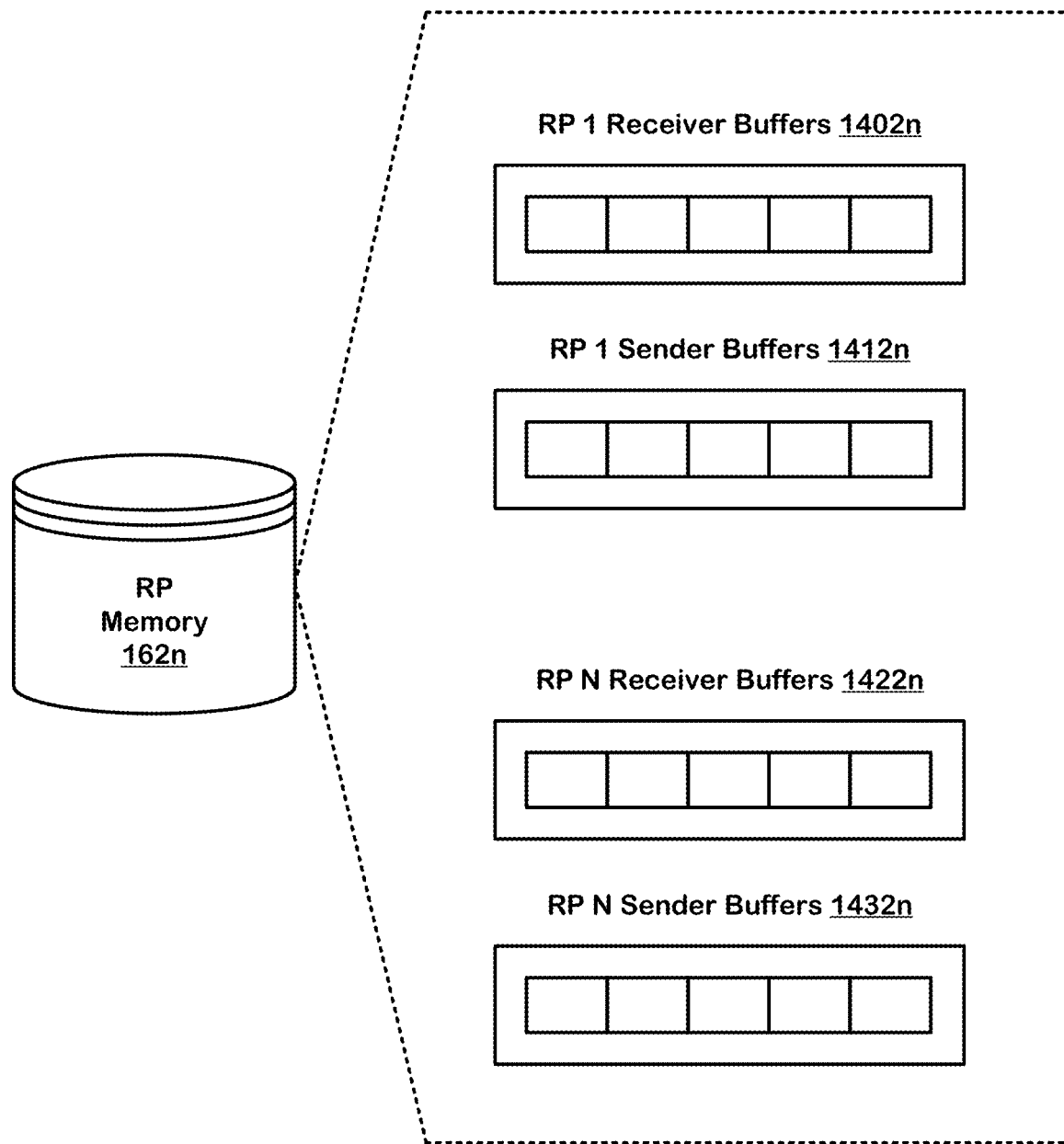
FIG. 14B shows sender and receiver buffers used by individual reconfigurable processors in the reconfigurable processors operatively coupled to the second processing node for data streaming.

FIG. 14B shows sender and receiver buffers used by individual reconfigurable processors in the reconfigurable processors 142n. Reconfigurable processor 1 (RP 1) receiver buffers 1402n and reconfigurable processor 1 (RP 1) sender buffers 1412n are used by a first reconfigurable processor in the reconfigurable processors 142n to receive data from and send data to another host processor or reconfigurable processor in the data center 100. Reconfigurable processor n (RP n) receiver buffers 1422n and reconfigurable processor n (RP n) sender buffers 1432n are used by a second reconfigurable processor in the reconfigurable processors 142n to receive data from and send data to another host processor or reconfigurable processor in the data center 100. The reconfigurable processor 1 receiver buffers 1402n, the reconfigurable processor 1 sender buffers 1412n, the reconfigurable processor n receiver buffers 1422n, and the reconfigurable processor n sender buffers 1432n are located in the reconfigurable processor memory 162n.

Intra-Node Processing

Figure 15:
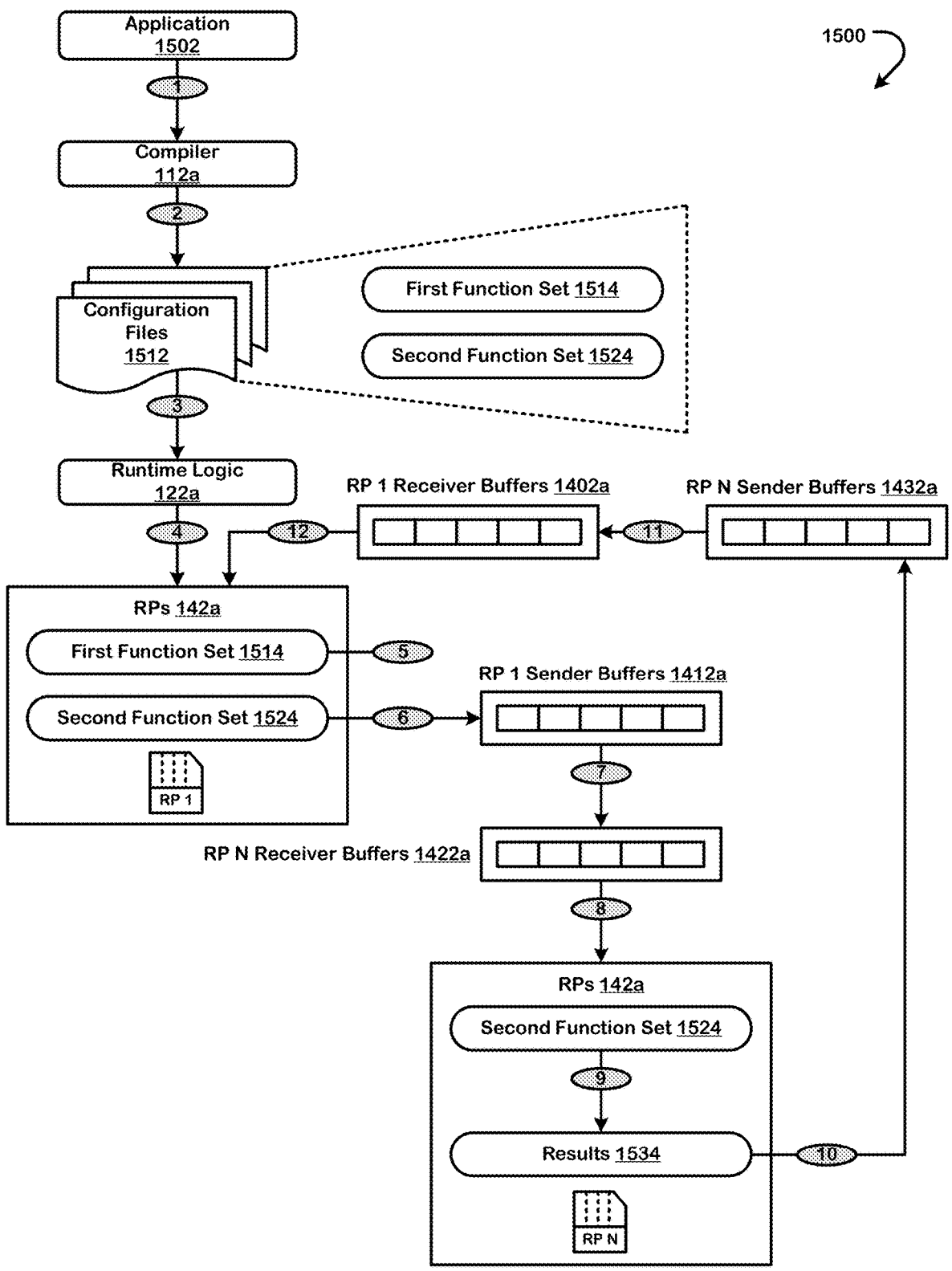
FIG. 15 is a message sequence chart illustrating one implementation of executing a first set of functions in configuration files on a first reconfigurable processor operatively coupled to the first processing node and executing a second set of functions in the configuration files on a second reconfigurable processor operatively coupled to the first processing node.

FIG. 15 is a message sequence chart 1500 illustrating one implementation of executing a first set of functions in configuration files and/or data therefor (e.g., weights, coefficients, vectors, tensors (image data, audio data, natural language processing (NLP data), control data (e.g., control tokens)) on a first reconfigurable processor in the reconfigurable processors 142a and executing a second set of functions in the configuration files and/or data therefor (e.g., weights, coefficients, vectors, tensors (image data, audio data, natural language processing (NLP data), control data (e.g., control tokens)) on a second reconfigurable processor in the reconfigurable processors 142a. In FIG. 15, the first reconfigurable processor is identified as "RP 1" and the second reconfigurable processor is identified as "RP N." Note that the first reconfigurable processor and the second reconfigurable processor are operatively coupled to a same processing node, i.e., the first processing node. This is referred to herein as "intra-node processing." At operation one, the compiler 112a receives an application 1502 for compilation. At operation two, the compiler 112a compiles the application 1502 to generate one or more configuration files 1512. The configuration files 1512 include a plurality of functions. The plurality of functions includes a first set of functions 1514 and a second set of functions 1524. Examples of functions in the plurality of functions include non-linearities like Rectified Linear Unit (ReLU) and its variants (e.g., leaky ReLU), hyperbolic tangent, sigmoid, and softmax, element-wise addition, matrix multiplication (e.g., General Matrix Multiply (GeMM)), layer normalization (e.g., batch normalization), loss functions like cross-entropy, and tensor shape modifiers like transpose. At operation three, the compiler 112a sends the configuration files 1512 to the runtime logic 122a for execution. At operation four, the runtime logic 122a loads the first set of functions 1514 and/or the data therefor (e.g., weights, coefficients, vectors, tensors (image data, audio data, natural language processing (NLP data), control data (e.g., control tokens)) and the second set of functions 1524 and/or the data therefor (e.g., weights, coefficients, vectors, tensors (image data, audio data, natural language processing (NLP data), control data (e.g., control tokens)) on the first reconfigurable processor. At operation five, the first reconfigurable processor processes the first set of functions 1514 and/or the data therefor (e.g., weights, coefficients, vectors, tensors (image data, audio data, natural language processing (NLP data), control data (e.g., control tokens)) and generates a first set of outputs (e.g., vectors, tensors). The first reconfigurable processor transmits functions in the second set of functions 1524 and/or data therefor (e.g., weights, coefficients, vectors, tensors (image data, audio data, natural language processing (NLP data), control data (e.g., control tokens)) to the second reconfigurable processor using one or more reconfigurable processors-to-reconfigurable processors buffers. This is referred to herein as "reconfigurable processor-to-reconfigurable processor workload sharing." In one implementation, data on which the functions in the second set of functions 1524 and/or the data therefor (e.g., weights, coefficients, vectors, tensors (image data, audio data, natural language processing (NLP data), control data (e.g., control tokens)) are executed is transmitted to the second reconfigurable processor using the reconfigurable processors-to-reconfigurable processors buffers. In some implementations, respective ones of the reconfigurable processors-to-reconfigurable processors buffers are used to transmit respective functions in the second set of functions 1524 and/or data therefor (e.g., weights, coefficients, vectors, tensors (image data, audio data, natural language processing (NLP data), control data (e.g., control tokens)) to the second reconfigurable processor. One example workload sharing flow includes using one or more of the reconfigurable processor 1 (RP 1) sender buffers 1412a and one or more of the reconfigurable processor N (RP N) receiver buffers 1422a. At operation six, the first reconfigurable processor transmits the functions in the second set of functions 1524 and/or the data therefor (e.g., weights, coefficients, vectors, tensors (image data, audio data, natural language processing (NLP data), control data (e.g., control tokens)) to the reconfigurable processor 1 sender buffers 1412a. At operation seven, the reconfigurable processor 1 sender buffers 1412a transmit the functions in the second set of functions 1524 and/or the data therefor (e.g., weights, coefficients, vectors, tensors (image data, audio data, natural language processing (NLP data), control data (e.g., control tokens)) to the reconfigurable processor N receiver buffers 1422a. At operation eight, the reconfigurable processor N receiver buffers 1422a transmit the functions in the second set of functions 1524 and/or the data therefor (e.g., weights, coefficients, vectors, tensors (image data, audio data, natural language processing (NLP data), control data (e.g., control tokens)) to the second reconfigurable processor. At operation nine, the second reconfigurable processor executes the functions in the second set of functions 1524 and/or the data therefor (e.g., weights, coefficients, vectors, tensors (image data, audio data, natural language processing (NLP data), control data (e.g., control tokens)) to generate a second set of outputs (or results 1534) (e.g., vectors, tensors). The second reconfigurable processor transmits the results 1534 to the first reconfigurable processor using one or more of the reconfigurable processors-to-reconfigurable processors buffers. In some implementations, respective ones of the reconfigurable processors-to-reconfigurable processors buffers are used to transmit respective results of executing respective functions in the second set of functions 1524 and/or data therefor (e.g., weights, coefficients, vectors, tensors (image data, audio data, natural language processing (NLP data), control data (e.g., control tokens)) to the first reconfigurable processor. One workload sharing flow includes using one or more of the reconfigurable processor N (RP N) sender buffers 1432a and one or more of the reconfigurable processor 1 (RP 1) receiver buffers 1402a. At operation ten, the second reconfigurable processor transmits the results 1534 to the reconfigurable processor N sender buffers 1432a. At operation eleven, the reconfigurable processor N sender buffers 1432a transmit the results 1534 to the reconfigurable processor 1 receiver buffers 1402a. At operation twelve, the reconfigurable processor 1 receiver buffers 1402a transmit the results 1534 to the first reconfigurable processor. In some implementations, one or more functions in the first set of functions 1514 waits for results of execution of one or more functions in the second set of functions 1524 on the second reconfigurable processor to combine the results with results of execution of one or more functions in the first set of functions 1514 and/or the data therefor (e.g., weights, coefficients, vectors, tensors (image data, audio data, natural language processing (NLP data), control data (e.g., control tokens)) on the first reconfigurable processor. In other implementations, the first set of functions 1514 and the second set of functions 1524 operate separately and in parallel. In one implementation, one or more functions in the second set of functions 1524 daisy chains the results to one or more functions in the first set of functions 1514, and vice-versa. In another implementation, one or more functions in the second set of functions 1524 executes for a certain number of iterations before returning the results to the first reconfigurable processor. Other implementations may perform the operations in different orders and/or with different, fewer, or additional operations than the ones illustrated in FIG. 15. Multiple operations can be combined in some implementations.

One skilled in the art will appreciate that, in FIG. 15, operations six, seven, eight, ten, eleven, and twelve comprise streaming network packets between reconfigurable processors on a same processing node 1 over local buses (e.g., PCIe buses) using a protocol like Transmission Control Protocol (TCP).

Inter-Node Processing

Figure 16:
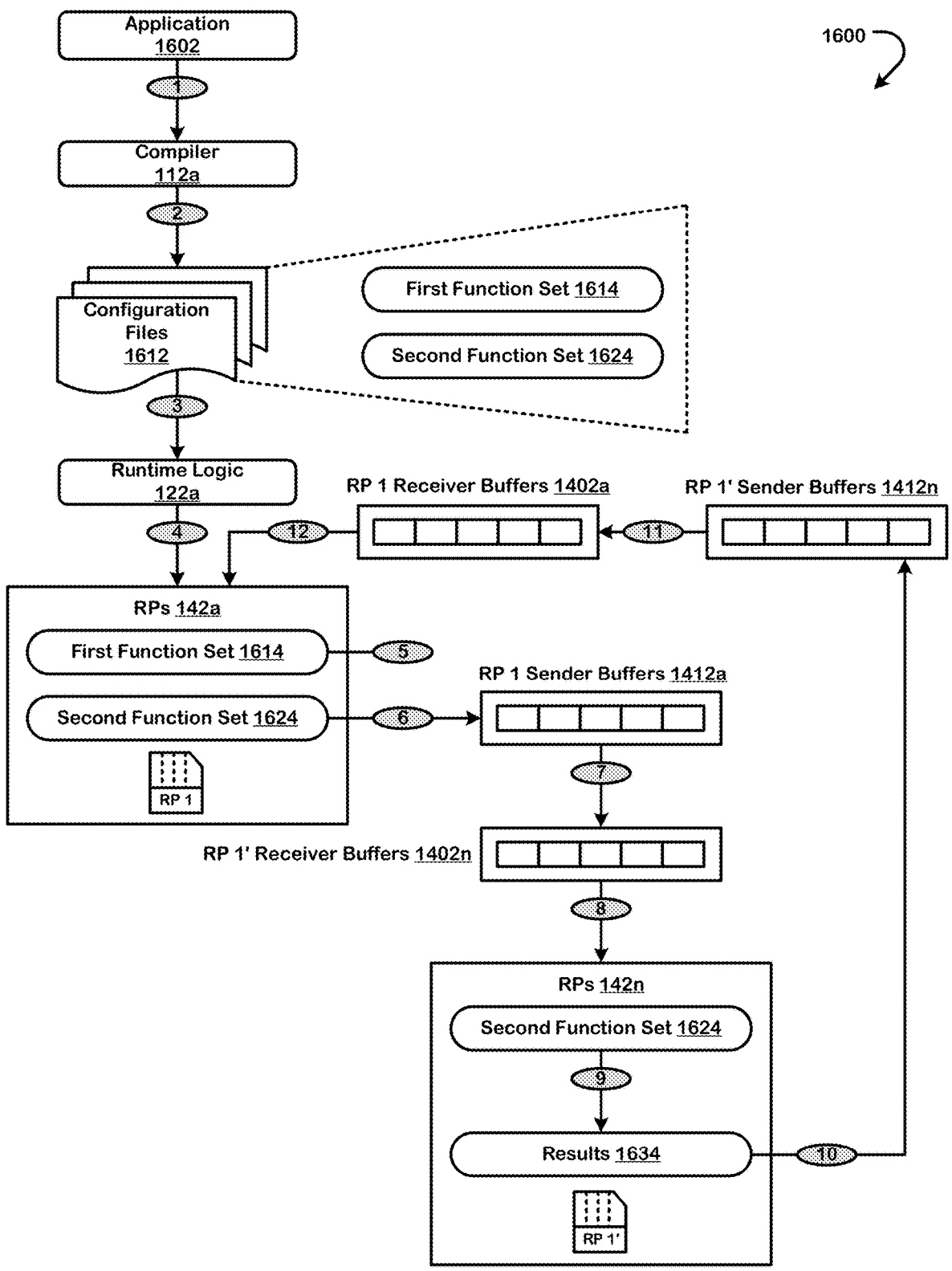
FIG. 16 is a message sequence chart illustrating one implementation of executing a first set of functions in configuration files on a first reconfigurable processor operatively coupled to the first processing node and executing a second set of functions in the configuration files on a first reconfigurable processor operatively coupled to the second processing node.

FIG. 16 is a message sequence chart 1600 illustrating one implementation of executing a first set of functions in configuration files and/or data therefor (e.g., weights, coefficients, vectors, tensors (image data, audio data, natural language processing (NLP data), control data (e.g., control tokens)) on a first reconfigurable processor in the reconfigurable processors 142a and executing a second set of functions in the configuration files and/or data therefor (e.g., weights, coefficients, vectors, tensors (image data, audio data, natural language processing (NLP data), control data (e.g., control tokens)) on a first reconfigurable processor in the reconfigurable processors 142n. In FIG. 16, the first reconfigurable processor in the reconfigurable processors 142a is identified as "RP 1" and the first reconfigurable processor in the reconfigurable processors 142n is identified as "RP 1'." Note that the first reconfigurable processor in the reconfigurable processors 142a and the first reconfigurable processor in the reconfigurable processors 142n are operatively coupled to different processing nodes, i.e., the first processing node and the second processing node. This is referred to herein as "inter-node processing." At operation one, the compiler 112a receives an application 1602 for compilation. At operation two, the compiler 112a compiles the application 1602 to generate one or more configuration files 1612. The configuration files 1612 include a plurality of functions. The plurality of functions includes a first set of functions 1614 and a second set of functions 1624. Examples of functions in the plurality of functions include non-linearities like Rectified Linear Unit (ReLU) and its variants (e.g., leaky ReLU), hyperbolic tangent, sigmoid, and softmax, element-wise addition, matrix multiplication (e.g., General Matrix Multiply (GeMM)), layer normalization (e.g., batch normalization), loss functions like cross-entropy, and tensor shape modifiers like transpose. At operation three, the compiler 112a sends the configuration files 1612 to the runtime logic 122a for execution. At operation four, the runtime logic 122a loads the first set of functions 1614 and/or the data therefor (e.g., weights, coefficients, vectors, tensors (image data, audio data, natural language processing (NLP data), control data (e.g., control tokens)) and the second set of functions 1624 and/or the data therefor (e.g., weights, coefficients, vectors, tensors (image data, audio data, natural language processing (NLP data), control data (e.g., control tokens)) on the first reconfigurable processor in the reconfigurable processors 142a. At operation five, the first reconfigurable processor in the reconfigurable processors 142a processes the first set of functions 1614 and/or the data therefor (e.g., weights, coefficients, vectors, tensors (image data, audio data, natural language processing (NLP data), control data (e.g., control tokens)) and generates a first set of outputs (e.g., vectors, tensors). The first reconfigurable processor in the reconfigurable processors 142a transmits functions in the second set of functions 1624 and/or data therefor (e.g., weights, coefficients, vectors, tensors (image data, audio data, natural language processing (NLP data), control data (e.g., control tokens)) to the first reconfigurable processor in the reconfigurable processors 142n using one or more reconfigurable processors-to-reconfigurable processors buffers. This is referred to herein as "reconfigurable processor-to-reconfigurable processor workload sharing." In one implementation, data on which the functions in the second set of functions 1624 and/or the data therefor (e.g., weights, coefficients, vectors, tensors (image data, audio data, natural language processing (NLP data), control data (e.g., control tokens)) are executed is transmitted to the first reconfigurable processor in the reconfigurable processors 142n using the reconfigurable processors-to-reconfigurable processors buffers. In some implementations, respective ones of the reconfigurable processors-to-reconfigurable processors buffers are used to transmit respective functions in the second set of functions 1624 and/or data therefor (e.g., weights, coefficients, vectors, tensors (image data, audio data, natural language processing (NLP data), control data (e.g., control tokens)) to the first reconfigurable processor in the reconfigurable processors 142n. One example workload sharing flow includes using one or more of the reconfigurable processor 1 (RP 1) sender buffers 1412a and one or more of the reconfigurable processor 1' (RP 1') receiver buffers 1402n. At operation six, the first reconfigurable processor in the reconfigurable processors 142a transmits the functions in the second set of functions 1624 and/or the data therefor (e.g., weights, coefficients, vectors, tensors (image data, audio data, natural language processing (NLP data), control data (e.g., control tokens)) to the reconfigurable processor 1 sender buffers 1412a. At operation seven, the reconfigurable processor 1 sender buffers 1412a transmit the functions in the second set of functions 1624 and/or the data therefor (e.g., weights, coefficients, vectors, tensors (image data, audio data, natural language processing (NLP data), control data (e.g., control tokens)) to the reconfigurable processor 1' receiver buffers 1402n. At operation eight, the reconfigurable processor 1' receiver buffers 1402n transmit the functions in the second set of functions 1624 and/or the data therefor (e.g., weights, coefficients, vectors, tensors (image data, audio data, natural language processing (NLP data), control data (e.g., control tokens)) to the first reconfigurable processor in the reconfigurable processors 142n. At operation nine, the first reconfigurable processor in the reconfigurable processors 142n executes the functions in the second set of functions 1624 and/or the data therefor (e.g., weights, coefficients, vectors, tensors (image data, audio data, natural language processing (NLP data), control data (e.g., control tokens)) to generate a second set of outputs (or results 1634) (e.g., vectors, tensors). The first reconfigurable processor in the reconfigurable processors 142n transmits the results 1634 to the first reconfigurable processor in the reconfigurable processors 142a using one or more of the reconfigurable processors-to-reconfigurable processors buffers. In some implementations, respective ones of the reconfigurable processors-to-reconfigurable processors buffers are used to transmit respective results of executing respective functions in the second set of functions 1624 and/or data therefor (e.g., weights, coefficients, vectors, tensors (image data, audio data, natural language processing (NLP data), control data (e.g., control tokens)) to the first reconfigurable processor in the reconfigurable processors 142a. One workload sharing flow includes using one or more of the reconfigurable processor 1' (RP 1') sender buffers 1412n and one or more of the reconfigurable processor 1 (RP 1) receiver buffers 1402a. At operation ten, the first reconfigurable processor in the reconfigurable processors 142n transmits the results 1634 to the reconfigurable processor 1' sender buffers 1412n. At operation eleven, the reconfigurable processor 1' sender buffers 1412n transmit the results 1634 to the reconfigurable processor 1 receiver buffers 1402a. At operation twelve, the reconfigurable processor 1 receiver buffers 1402a transmit the results 1634 to the first reconfigurable processor in the reconfigurable processors 142a. In some implementations, one or more functions in the first set of functions 1614 waits for results of execution of one or more functions in the second set of functions 1624 on the first reconfigurable processor in the reconfigurable processors 142n to combine the results with results of execution of one or more functions in the first set of functions 1614 and/or the data therefor (e.g., weights, coefficients, vectors, tensors (image data, audio data, natural language processing (NLP data), control data (e.g., control tokens)) on the first reconfigurable processor in the reconfigurable processors 142a. In other implementations, the first set of functions 1614 and the second set of functions 1624 operate separately and in parallel. In one implementation, one or more functions in the second set of functions 1624 daisy chains the results to one or more functions in the first set of functions 1614, and vice-versa. In another implementation, one or more functions in the second set of functions 1624 executes for a certain number of iterations before returning the results to the first reconfigurable processor in the reconfigurable processors 142a. Other implementations may perform the operations in different orders and/or with different, fewer, or additional operations than the ones illustrated in FIG. 16. Multiple operations can be combined in some implementations.

One skilled in the art will appreciate that, in FIG. 16, operations six, seven, eight, ten, eleven, and twelve comprise streaming network packets between reconfigurable processors on different processing nodes 1 and n over the network fabric 136 (e.g., Ethernet, InfiniBand (IB)) using protocols like RDMA over Converged Ethernet (RoCE), TCP, User Datagram Protocol (UDP), and Quick UDP Internet Connections (QUIC).

Having described the reconfigurable processor-to-reconfigurable processor workload sharing, the discussion now turns to the asynchronous tensor streaming disclosed by the technology disclosed.

Asynchronous Tensor Streaming

Figure 17A:
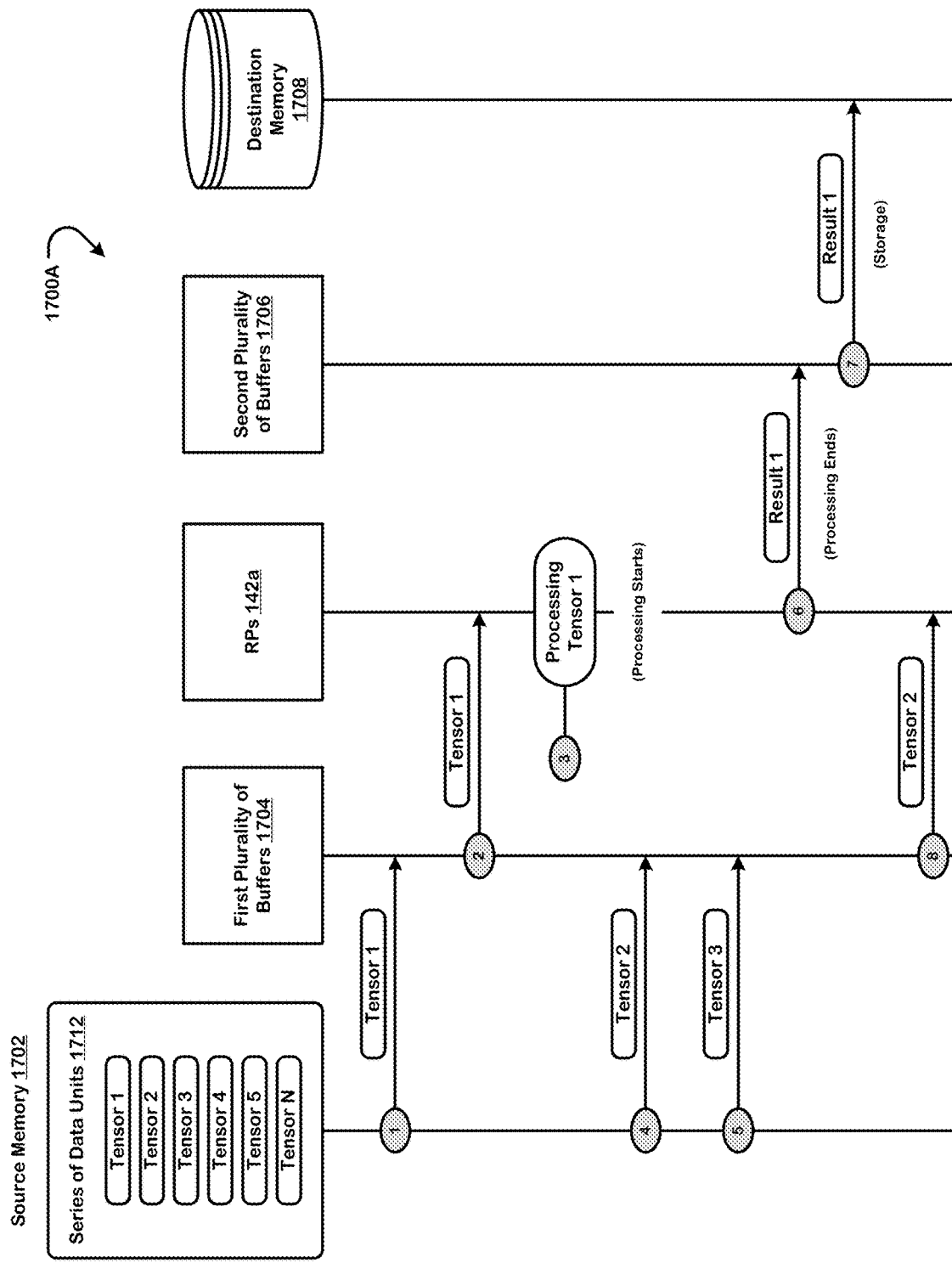
FIG. 17A is a message sequence chart illustrating one implementation of asynchronous tensor streaming in which a next tensor is buffered while a reconfigurable processor is processing a current tensor.

FIG. 17A is a message sequence chart 1700A illustrating one implementation of asynchronous tensor streaming in which a next tensor is buffered while a reconfigurable processor is processing a current tensor. A reconfigurable processor in the data center 100 (e.g., one or more of the reconfigurable processors 142a) is configured to execute one or more configuration files using a series of data units 1712. In one implementation, the series of data units 1712 includes a sequence of tensors 1 to N. A first plurality of buffers 1704 is configured to receive data units in the series of data units 1712 from a source memory 1702 (e.g., host memory 134a, host memory 134n), and to stream the data units to the reconfigurable processor for processing. Examples of buffers in the first plurality of buffers 1704 First-In, First-Out (FIFO) buffers, First-In, Last-Out (FILO) buffers, Last-In, First-Out (LIFO) buffers, Last-In, Last-Out (LILO) buffers, and circular buffers. The buffers in the first plurality of buffers 1704 can be of size 8 bytes, 16 bytes, 32 bytes, 64 bytes, 128 bytes, 256 bytes, and so on, or any convenient size appropriate for the transfer of data between the host processor, the network interface controllers, and the reconfigurable processors. A second plurality of buffers 1706 is configured to stream results of processing the data units from the reconfigurable processor, and to send the results to a destination memory 1708 (e.g., reconfigurable processor memory 162a, reconfigurable processor memory 162n) for storage. Examples of buffers in the second plurality of buffers 1706 include First-In, First-Out (FIFO) buffers, First-In, Last-Out (FILO) buffers, Last-In, First-Out (LIFO) buffers, Last-In, Last-Out (LILO) buffers, and circular buffers. The buffers in the second plurality of buffers 1706 can be of size 8 bytes, 16 bytes, 32 bytes, 64 bytes, 128 bytes, 256 bytes, and so on, or any convenient size appropriate for the transfer of data between the host processor, the network interface controllers, and the reconfigurable processors.

A runtime logic (e.g., runtime 122a, runtime 122n) is configured to cause the buffers in the first plurality of buffers 1704 to receive a next data unit in the series of data units 1712 from the source memory 1702 while the reconfigurable processor processes a current data unit in the series of data units 1712. The runtime logic is further configured to stream the next data unit to the reconfigurable processor for processing after the buffers in the second plurality of buffers 1706 stream results of processing the current data unit from the reconfigurable processor.

Turning to the example illustrated in FIG. 17A. Consider that tensor 1 is the current data unit and tensors 2 and 3 are next data units. At timestep one, the buffers in the first plurality of buffers 1704 receive tensor 1 from the source memory 1702. At timestep two, the buffers in the first plurality of buffers 1704 stream tensor 1 to the reconfigurable processor. At timestep three, the reconfigurable processor starts processing tensor 1. While the reconfigurable processor is processing tensor 1, the buffers in the first plurality of buffers 1704 receive tensors 2 and 3 from the source memory 1702 at timesteps four and five, respectively. At timestep six, the reconfigurable processor streams results of processing tensor 1 (result 1) to the buffers in the second plurality of buffers 1706. At timestep seven, the buffers in the second plurality of buffers 1706 stream the results of processing tensor 1 to the destination memory 1708 for storage. At timestep eight, the buffers in the first plurality of buffers 1704 stream tensor 2 to the reconfigurable processor. In other implementations, streaming of tensor 2 from the buffers in the first plurality of buffers 1704 to the reconfigurable processor precedes the streaming of the results of processing tensor 1 from the buffers in the second plurality of buffers 1706 to the destination memory 1708. Other implementations may perform the steps in different orders and/or with different, fewer, or additional steps than the ones illustrated in FIG. 17A. In some implementations, processing of tensors in one or more previous timesteps/iterations (e.g., tensors 2 and 3) by the reconfigurable processors 142a overlaps with the processing of a tensor in a current timestep/iteration (e.g., tensor 1) by the reconfigurable processors 142a. This is referred to herein as "meta-pipelining." Multiple steps can be combined in some implementations.

Figure 17B:
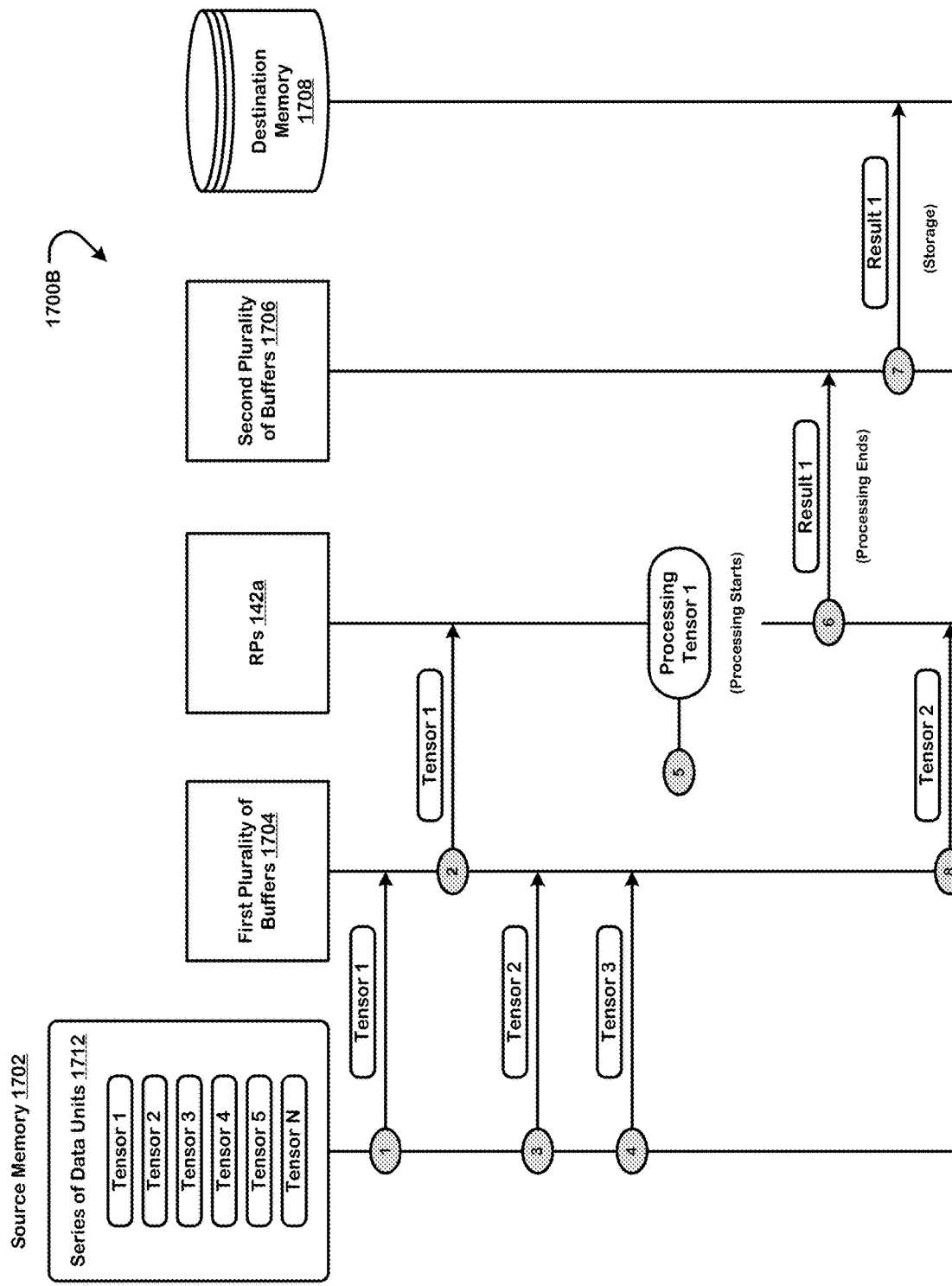
FIG. 17B is a message sequence chart illustrating one implementation of asynchronous tensor streaming in which a next tensor is buffered before a reconfigurable processor processes a current tensor.

FIG. 17B is a message sequence chart 1700B illustrating one implementation of asynchronous tensor streaming in which a next tensor is buffered before a reconfigurable processor processes a current tensor. The runtime logic is further configured to cause the buffers in the first plurality of buffers 1704 to receive the next data unit from the source memory 1702 before the reconfigurable processor starts processing the current data unit.

Turning to the example illustrated in FIG. 17B. At timestep one, the buffers in the first plurality of buffers 1704 receive tensor 1 from the source memory 1702. At timestep two, the buffers in the first plurality of buffers 1704 stream tensor 1 to the reconfigurable processor. Before the reconfigurable processor starts processing tensor 1, the buffers in the first plurality of buffers 1704 receive tensors 2 and 3 from the source memory 1702 at timesteps three and four, respectively. At timestep five, the reconfigurable processor starts processing tensor 1. At timestep six, the reconfigurable processor streams results of processing tensor 1 (result 1) to the buffers in the second plurality of buffers 1706. At timestep seven, the buffers in the second plurality of buffers 1706 stream the results of processing tensor 1 to the destination memory 1708 for storage. At timestep eight, the buffers in the first plurality of buffers 1704 stream tensor 2 to the reconfigurable processor. In other implementations, streaming of tensor 2 from the buffers in the first plurality of buffers 1704 to the reconfigurable processor precedes the streaming of the results of processing tensor 1 from the buffers in the second plurality of buffers 1706 to the destination memory 1708. Other implementations may perform the steps in different orders and/or with different, fewer, or additional steps than the ones illustrated in FIG. 17B. Multiple steps can be combined in some implementations.

Figure 17C:
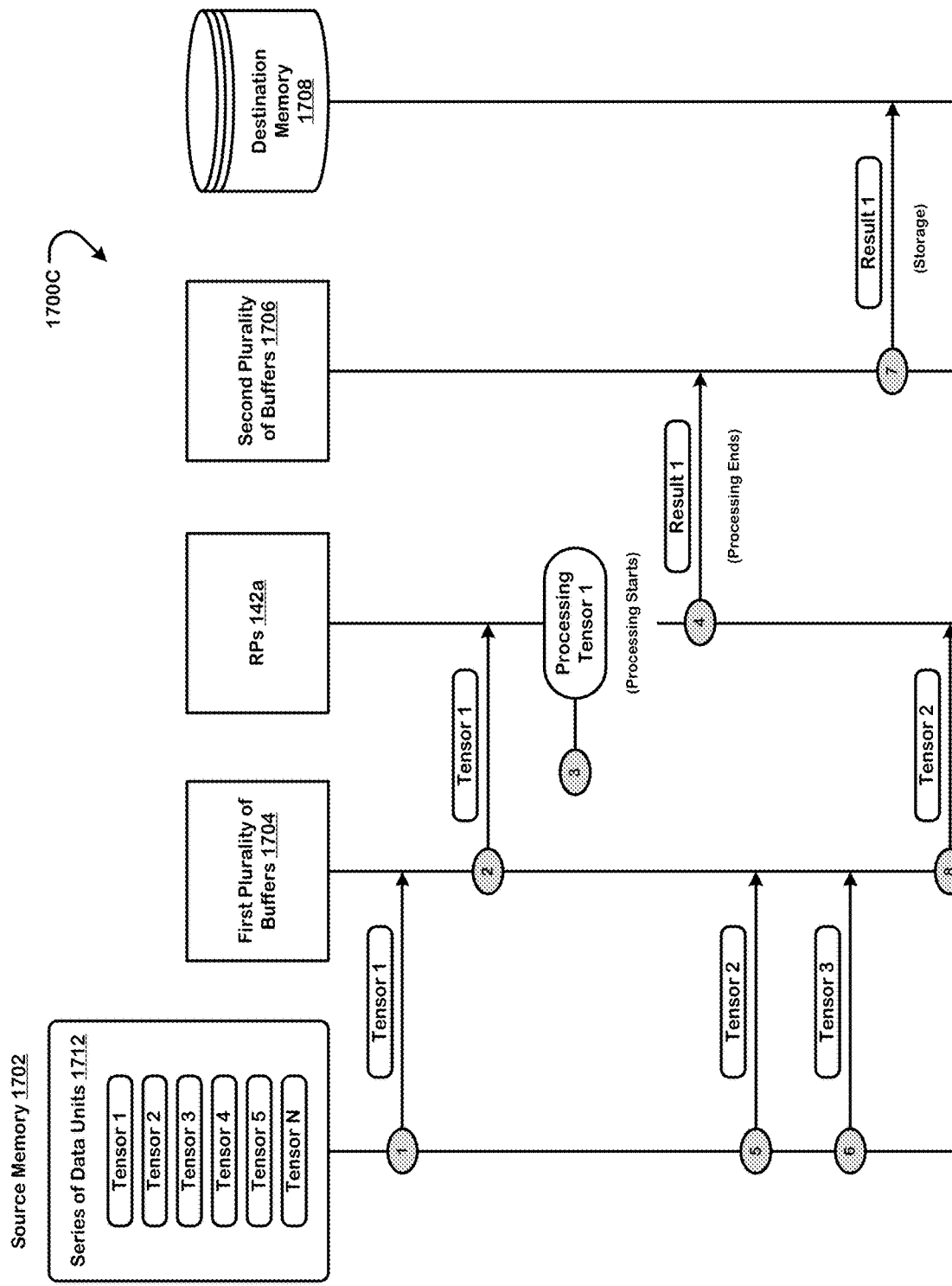
FIG. 17C is a message sequence chart illustrating one implementation of asynchronous tensor streaming in which a next tensor is buffered after a reconfigurable processor has processed a current tensor.

FIG. 17C is a message sequence chart 1700C illustrating one implementation of asynchronous tensor streaming in which a next tensor is buffered after a reconfigurable processor has processed a current tensor. The runtime logic is further configured to cause the buffers in the first plurality of buffers 1704 to receive the next data unit from the source memory 1702 after the buffers in the second plurality of buffers 1706 stream the results of processing the current data unit from the reconfigurable processor.

Turning to the example illustrated in FIG. 17C. At timestep one, the buffers in the first plurality of buffers 1704 receive tensor 1 from the source memory 1702. At timestep two, the buffers in the first plurality of buffers 1704 stream tensor 1 to the reconfigurable processor. At timestep three, the reconfigurable processor starts processing tensor 1. At timestep four, the reconfigurable processor streams results of processing tensor 1 (result 1) to the buffers in the second plurality of buffers 1706. After the buffers in the second plurality of buffers 1706 stream the results of processing tensor 1 from the reconfigurable processor, the buffers in the first plurality of buffers 1704 receive tensors 2 and 3 from the source memory 1702 at timesteps five and six, respectively. At timestep seven, the buffers in the second plurality of buffers 1706 stream the results of processing tensor 1 to the destination memory 1708 for storage. At timestep eight, the buffers in the first plurality of buffers 1704 stream tensor 2 to the reconfigurable processor. In other implementations, streaming of tensor 2 from the buffers in the first plurality of buffers 1704 to the reconfigurable processor precedes the streaming of the results of processing tensor 1 from the buffers in the second plurality of buffers 1706 to the destination memory 1708. Other implementations may perform the steps in different orders and/or with different, fewer, or additional steps than the ones illustrated in FIG. 17C. Multiple steps can be combined in some implementations.

Having described the asynchronous tensor streaming, the discussion now turns to how the technology disclosed executes configuration files on reconfigurable processors that are on different processing nodes in the data center 100. This is referred to herein as "inter-node execution of configuration files."

Inter-Node Execution of Configuration Files

Figure 18:
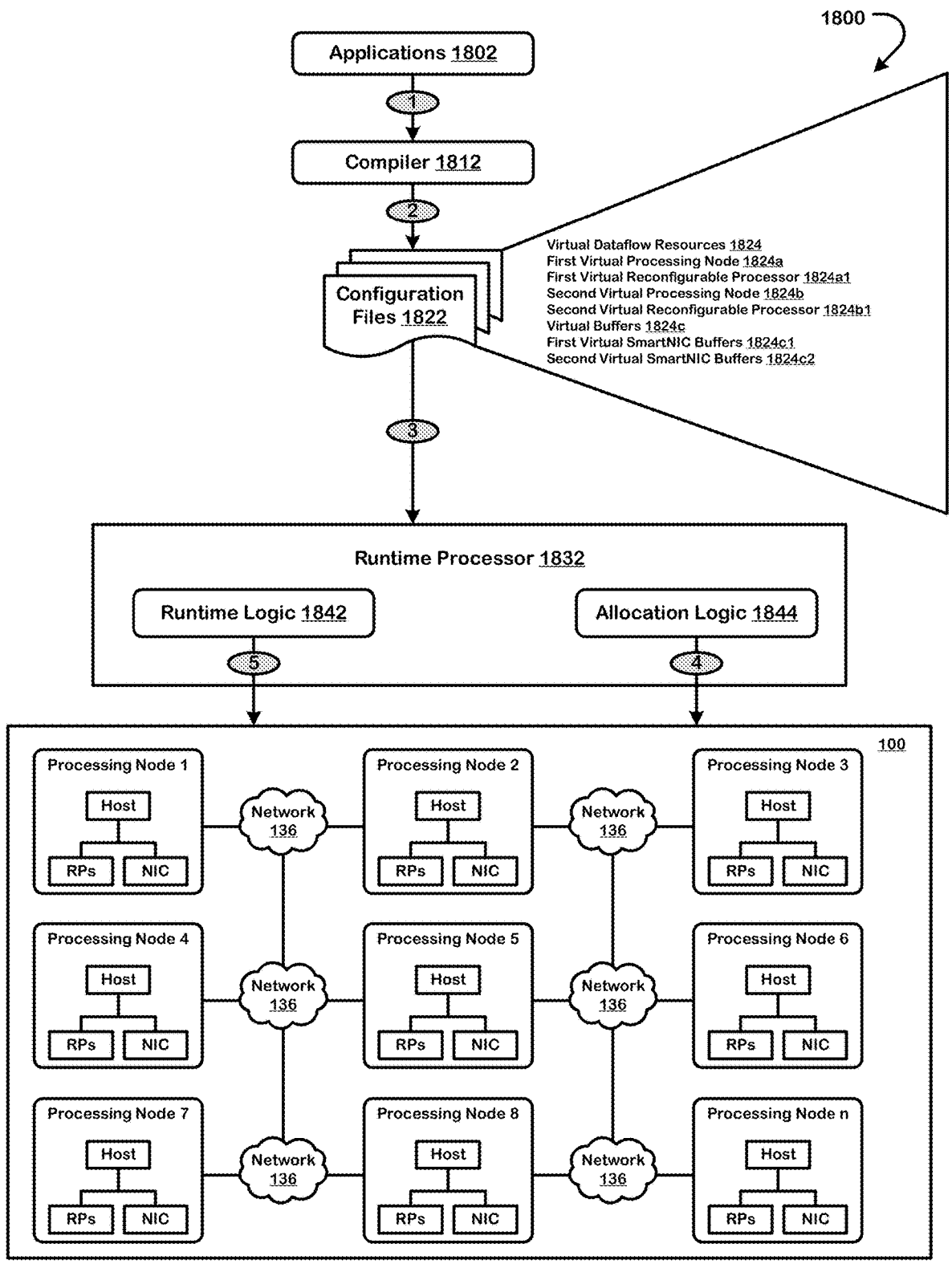
FIG. 18 is a message sequence chart illustrating one implementation of executing configuration files on reconfigurable processors that are on different processing nodes in the data center.

FIG. 18 is a message sequence chart 1800 illustrating one implementation of executing configuration files on reconfigurable processors that are on different processing nodes in the data center 100. This is referred to herein as "inter-node execution of configuration files." The data center 100 comprises a pool of reconfigurable dataflow resources. The pool of reconfigurable dataflow resources includes a plurality of processing nodes (e.g., processing nodes 1 to n). Respective processing nodes in the plurality of processing nodes are operatively coupled to respective pluralities of reconfigurable processors (RPs) and respective pluralities of buffers. The respective processing nodes are also operatively coupled to respective host processors. The respective processing nodes are also operatively coupled to respective pluralities of Network Interface Controllers (NICs) or Smart Network Interface Controllers (SmartNICs).

In one implementation, buffers in the respective pluralities of buffers are located in respective memories of the respective pluralities of reconfigurable processors. Examples of the respective memories of the respective pluralities of reconfigurable processors include off-chip and/or on-chip memories like DRAM, NAND flash, SRAM, latches, flops, bypass networks, and registers. In another implementation, the buffers are located in respective memories of NICs or SmartNICs in the respective pluralities of NICs or SmartNICs. In yet another implementation, the buffers are located in respective memories of host processors (e.g., RAM/ROM, caches) in the respective host processors. In other implementations, the buffers can be located in or attached to any network component of the data center 100 such as PCIe buses, Double Data Rate (DDR) channels, Dual In-Line Memory Modules (DIMMs), routers, and switches. The buffers can be First-In, First-Out (FIFO) buffers, First-In, Last-Out (FILO) buffers, Last-In, First-Out (LIFO) buffers, Last-In, Last-Out (LILO) buffers, or circular buffers. The buffers can be of size 8 bytes, 16 bytes, 32 bytes, 64 bytes, 128 bytes, 256 bytes, and so on, or any convenient size appropriate for the transfer of data between the host processor, the network interface controllers, and the reconfigurable processors.

A compiler 1812 compiles applications 1802 (operation one) and generates configuration files 1822 (operation two). The configuration files 1822 specify configurations of virtual dataflow resources 1824 required to execute the configuration files 1822. In one implementation, the virtual dataflow resources 1824 include a first virtual reconfigurable processor 1824$a1$ in a first virtual processing node 1824$a$, a second virtual reconfigurable processor 1824$b1$ in a second virtual processing node 1824$b$, and virtual buffers 1824$c$ that stream data between the first virtual reconfigurable processor 1824$a1$ and the second virtual reconfigurable processor 1824$b1$. The virtual buffers 1824$c$ comprise first virtual SmartNIC buffers 1824$c1$ and second virtual SmartNIC buffers 1824$c2$.

A runtime processor 1832 is operatively coupled to the pool of reconfigurable dataflow resources and configured to receive the configuration files 1822 (operation three). The runtime processor 1832 comprises a runtime logic 1842 and an allocation logic 1844. The allocation logic 1844 is configured to allocate reconfigurable dataflow resources in the pool of reconfigurable dataflow resources to the virtual dataflow resources 1824 (operation four). The allocated reconfigurable dataflow resources include a first processing node in the respective processing nodes allocated to the first virtual processing node 1824$a$, a second processing node in the respective processing nodes allocated to the second virtual processing node 1824$b$, a first reconfigurable processor, operatively coupled to the first processing node, allocated to the first virtual reconfigurable processor 1824$a1$, a second reconfigurable processor operatively coupled to the second processing node allocated to the second virtual reconfigurable processor 1824$b1$, and a first plurality of buffers, operatively coupled to the first processing node, and a second plurality of buffers, operatively coupled to the second processing node, allocated to the virtual buffers 1824$c$. The runtime logic 1842 is configured to execute the configuration files 1822 using the allocated reconfigurable dataflow resources (operation five).

The discussion now turns to how buffers can be allocated for inter-node streaming of configuration data (e.g., bit stream) by mapping physical memory addresses of the buffers to memories of different network components in the data center 100 (e.g., host memories, reconfigurable processor memories, NIC memories, SmartNIC memories, PCIe bus memories, DDR channel memories, DIMM memories, etc.).

Buffer Allocation

The buffers are programmable and can be allocated by specifying physical memory addresses. The physical memory addresses of the buffers specify memory locations of the buffers. The physical memory addresses of the buffers can be designated by the host processors and/or by the reconfigurable processors. The configurations of the virtual buffers 1824$c$ specify virtual memory segments of the buffers allocated for execution of the applications 1802 (e.g., the first and second plurality of buffers), including virtual address spaces (e.g., starting or base addresses) of the virtual memory segments and sizes of the virtual address spaces (e.g., sizes of the memory blocks in bytes). The runtime processor 1832 maps the virtual address spaces of the virtual memory segments to physical address spaces of physical memory segments in memory where the allocated buffers are located. The memory can be host processor memory, reconfigurable processor memory (off-chip or on-chip), NIC memory, SmartNIC memory, PCIe memory, DMA memory, DIMM memory, or any other network component memory in the data center 100.

Figure 19:
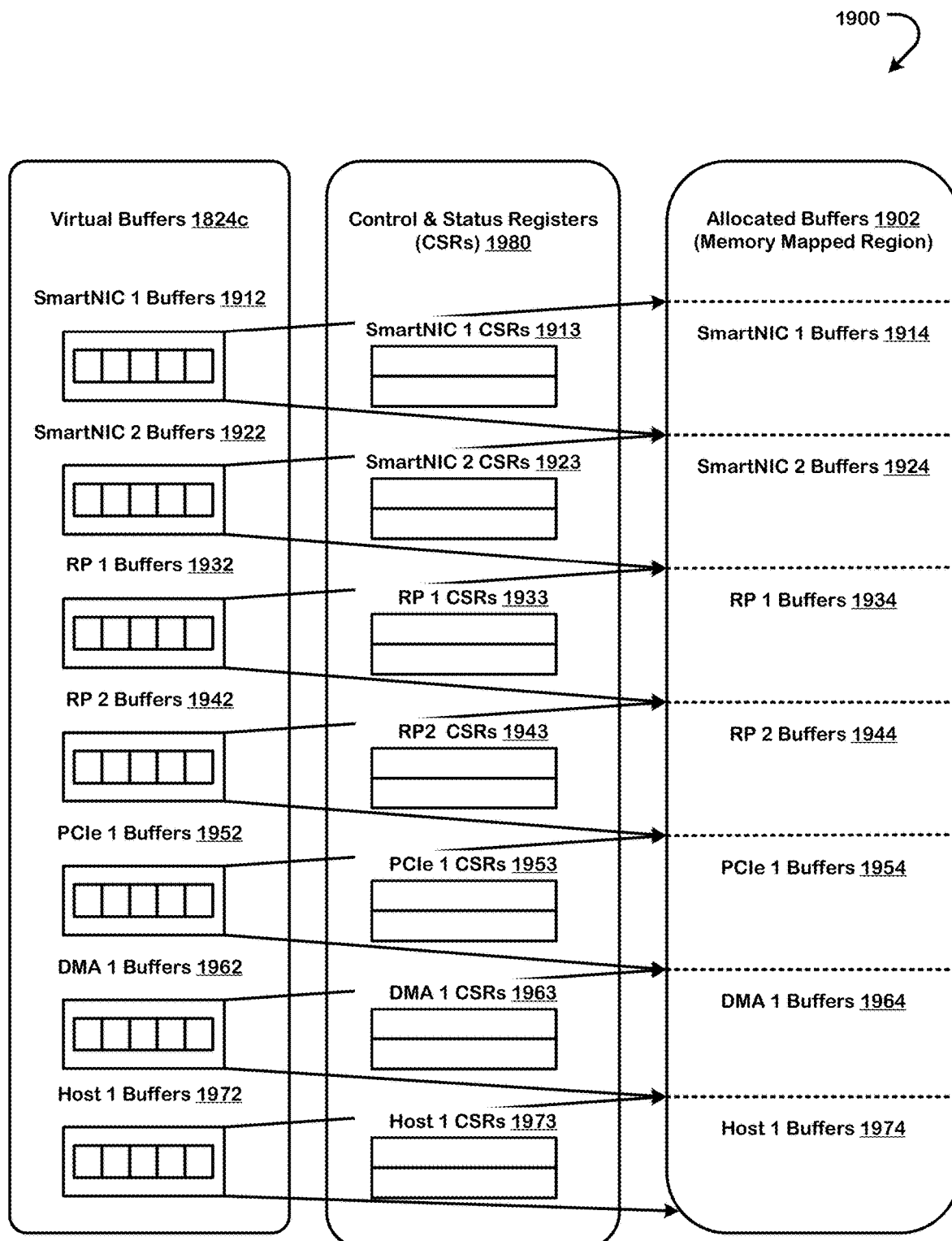
FIG. 19 shows one implementation of memory mapping and allocating virtual buffers to physical buffers located in memories of different network components in the data center.

FIG. 19 shows one implementation of memory mapping 1900 the virtual buffers 1824$c$ to allocated buffers 1902/physical buffers 1902 located in respective physical memories of example reconfigurable dataflow resources such as SmartNIC one (SmartNIC 1) memory, SmartNIC two (SmartNIC 2) memory, reconfigurable processor one (RP 1) memory, reconfigurable processor two (RP 2) memory, PCIe 1 memory, DMA 1 memory, and host processor 1 memory. FIG. 19 shows that Control and Status Registers (CSRs) 1980 of the example reconfigurable dataflow resources are used for memory mapping the virtual buffers 1824$c$ in a virtual memory space to physical memory space. CSRs 1913, 1923, 1933, 1943, 1953, 1963, and 1973 in the allocated physical element (e.g., SmartNIC, RP, DMA engine of PCIe device, etc.) are used to map the application virtual buffer addresses to the appropriate physical addresses by having the runtime logic program them. (e.g., SmartNIC 1 buffers 1912, SmartNIC 2 buffers 1922, RP 1 buffers 1932, RP 2 buffers 1942, PCIe 1 buffers 1952, DMA 1 buffers 1962, host 1 buffers 1972) to the allocated buffers 1902 in a contiguous physical memory space (e.g., SmartNIC 1 buffers 1914 (first range of physical memory addresses), SmartNIC 2 buffers 1924 (second range of physical memory addresses), RP 1 buffers 1934 (third range of physical memory addresses), RP 2 buffers 1944 (fourth range of physical memory addresses), PCIe 1 buffers 1954 (fifth range of physical memory addresses), DMA 1 buffers 1964 (sixth range of physical memory addresses), host 1 buffers 1974 (seventh range of physical memory addresses)).

The discussion now turns to how buffer allocation is done independently for multiple applications being executed simultaneously or in parallel on a given set of reconfigurable dataflow resources (e.g., reconfigurable processors, NICs, SmartNICs, PCIe buses, DMA channels), and how allocated buffers are kept isolated on an application-by-application basis.

Application-Wise Buffer Allocation and Isolation

In one implementation, the runtime processor 1832 configures control and status registers of the reconfigurable dataflow resources with configuration data (e.g., bit stream) identifying the mapping between the virtual address spaces and the physical address spaces for the configuration files 1822 to access the physical memory segments during execution of the applications 1802. In some implementations, a first set of the physical memory segments mapped to buffers allocated to a first one of the applications 1802 are different from a second set of the physical memory segments mapped to buffers allocated to a second one of the applications 1802. Also, access of the buffers allocated to the first one of the applications 1802 is confined to the first set of the physical memory segments, and access of the buffers allocated to the second one of the applications 1802 is confined to the second set of the physical memory segments.

In some implementations, the reconfigurable processors have respective pluralities of buffers for respective applications such that a first plurality of buffers can be used to stream configuration data (e.g., bit stream) to execute configuration files for a first application, a second plurality of buffers can be used to stream configuration data (e.g., bit stream) to execute configuration files for a second application, a third plurality of buffers can be used to stream configuration data (e.g., bit stream) to execute configuration files for a third application, and so on. The configuration files for the first, second, and third applications can be executed in parallel or sequence using the first, second, and third plurality of buffers, respectively. In one implementation, the configuration files for the first, second, and third applications can be executed, in parallel or in sequence, on a single reconfigurable processor using the first, second, and third plurality of buffers, respectively. In another implementation, the configuration files for the first, second, and third applications can be executed, in parallel or in sequence, across reconfigurable processors on a same processing node using the first, second, and third plurality of buffers, respectively, such that, in some implementations, each of the first, second, and third plurality of buffers includes a set of sender (TX) buffers and receiver (RX) buffers for each reconfigurable processor or NIC or SmartNIC on the same processing node used to execute the configuration files. In yet another implementation, the configuration files for the first, second, and third applications can be executed, in parallel or in sequence, across reconfigurable processors on different processing nodes using the first, second, and third plurality of buffers, respectively, such that, in some implementations, each of the first, second, and third plurality of buffers includes a set of sender (TX) buffers and receiver (RX) buffers for each reconfigurable processor or NIC or SmartNIC on the different processing nodes used to execute the configuration files.

In one implementation, the runtime processor 1832 runs on each host processor in the data center 100 and provides unified access to the pool of reconfigurable dataflow resources in the data center 100. Additional details about how the allocation logic 1844 spans the userspace and kernel space of a host processor on which a runtime processor or runtime logic runs can be found in U.S. Nonprovisional patent application Ser. No. 16/922,975, filed Jul. 7, 2020, entitled, "RUNTIME VIRTUALIZATION OF RECONFIGURABLE DATAFLOW RESOURCES,", which is incorporated herein by reference (specific reference is made to the runtime library 312, the kernel module 322, the resource manager 471, the device driver 474, and other allocation logic and components in the application incorporated by reference).

The discussion now turns to how various aspects of the technology disclosed described in this application can be executed without the use of hosts or host processors. Such implementations are referred to herein as "host-less implementations."

Hypervisor and Host-Less Implementations

In another implementation, the runtime processor 1832 runs on each reconfigurable processor in the data center 100 and provides unified access to the pool of reconfigurable dataflow resources in the data center 100. In yet another implementation, the runtime processor 1832 runs as a hypervisor only on a subset of the host processors in the data center 100 (e.g., only on one host processor). In yet another implementation, the runtime processor 1832 runs as a hypervisor only on a subset of the reconfigurable processors in the data center 100 (e.g., only on one reconfigurable processor).

Figure 20:
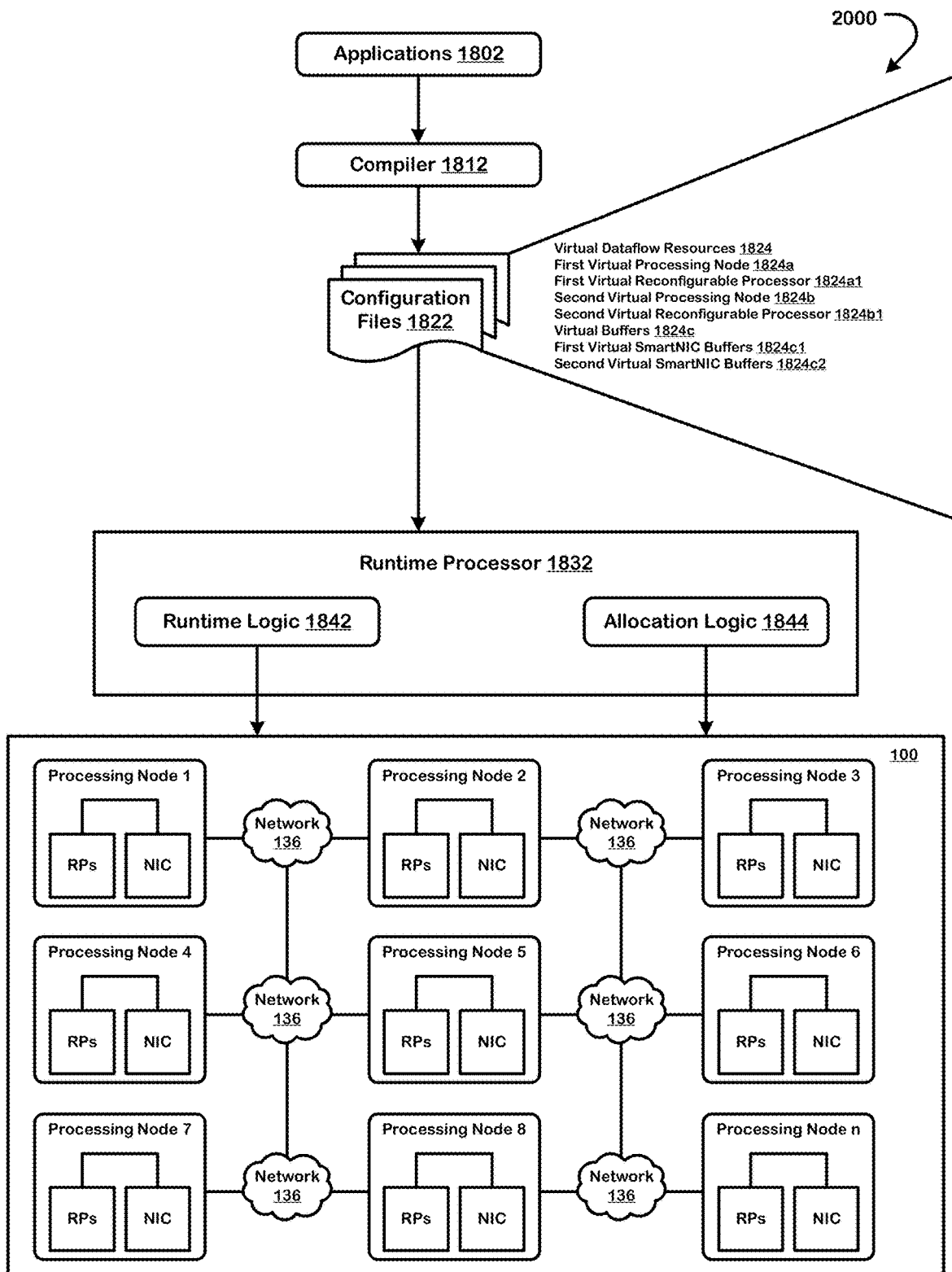
FIG. 20 shows an architectural level schematic of one implementation of the data center in which the processing nodes of the data center do not include host processors.

FIG. 20 shows an architectural level schematic 2000 of one implementation of the data center 100 in which the processing nodes of the data center 100 do not include host processors. The implementation shown in the architectural level schematic 2000 is configured to execute other implementations discussed in this application (e.g., intra-node processing, inter-node execution of configuration files), except that the other implementations are executed without using the host processors. In many host-less implementations, functionalities that are otherwise performed by host processors are instead performed by the reconfigurable processors in the data center 100. Some examples of functionalities performed by the reconfigurable processors in host-less implementations include hosting the compiler 1812, compiling the applications 1802, generating the configuration files 1822, generating configurations of the virtual dataflow resources 1824, hosting the runtime processor 1832, memory mapping, resource allocation (e.g., designating and allocating physical memory addresses of the buffers and other reconfigurable dataflow resources), execution of the configuration files 1822, parsing incoming network packets and running anomaly detection in ultra-low and deterministic latency, etc.). In other host-less implementations, the functionalities that are otherwise performed by the host processors are obviated by other network components in the data center 100, for example, by the SmartNICs that comprise microcontrollers to locally trigger host-like commands without requiring an external host.

In the hypervisor and the host-less implementations, the runtime processor 1832 can be considered a distributed runtime processor, a distributed runtime logic, a distributed resource manager, and/or a distributed resource allocator that provides unified access to the pool of reconfigurable dataflow resources in the data center 100.

The discussion now turns to how, for efficient execution of the configuration files, the technology disclosed uses buffers to stream, over a network fabric, configuration data (e.g., bit stream) between reconfigurable processors that are on different processing nodes in the data center 100. This is referred to herein as "buffer-based inter-node streaming of configuration data (e.g., bit stream) over network fabric."

Figure 21:
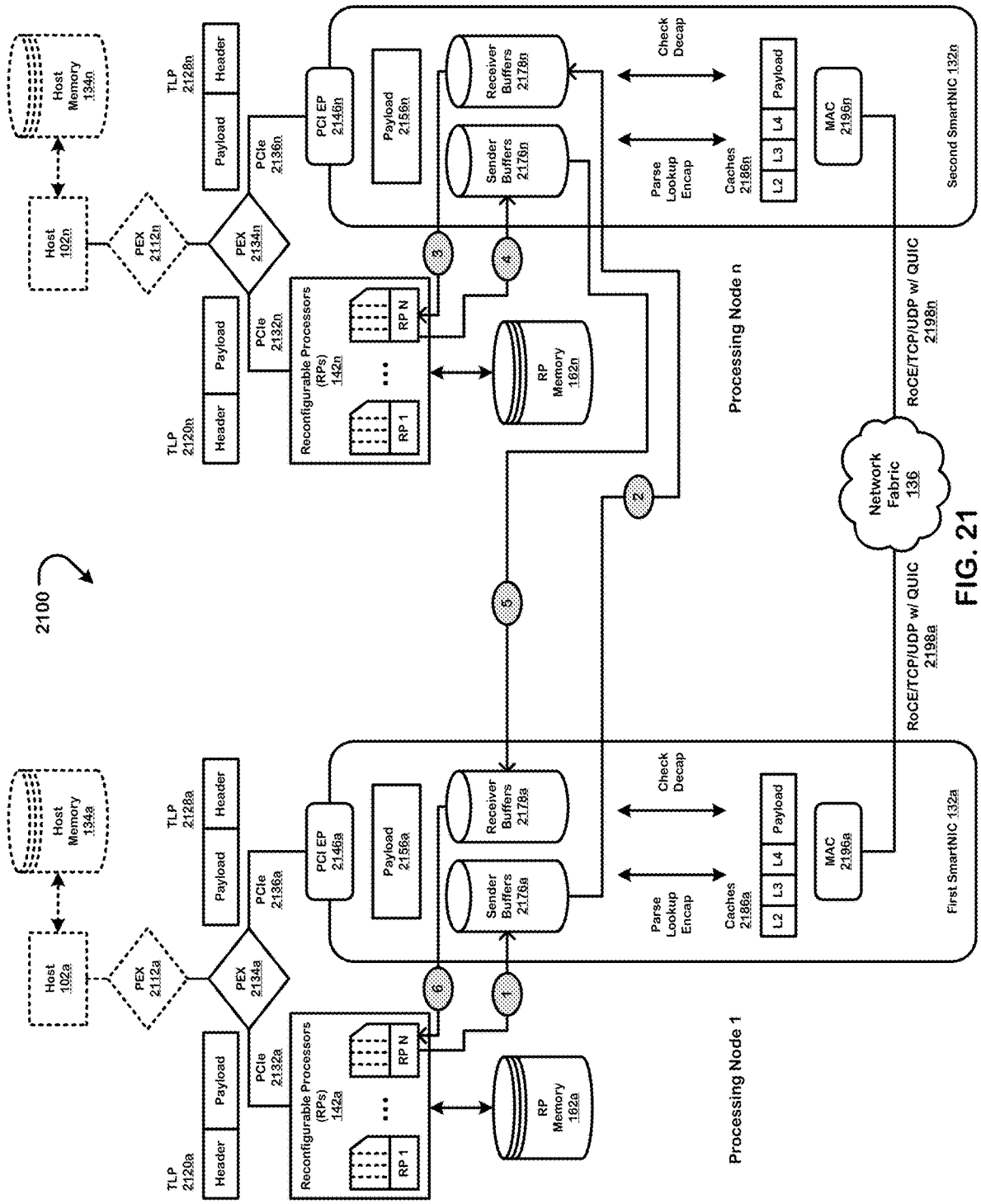
FIG. 21 is a message sequence chart illustrating one implementation of buffer-based inter-node streaming of configuration data over the network fabric.

Buffer-Based Inter-Node Streaming of Configuration Data (e.g., Bit Stream) Over Network Fabric FIG. 21 is a message sequence chart 2100 illustrating one implementation of buffer-based inter-node streaming of configuration data (e.g., bit stream) over the network fabric 136. In the implementation illustrated in FIG. 21, buffers used for the inter-node streaming, i.e., sender buffers 2176a, receiver buffers 2178a, sender buffers 2176n, and receiver buffers 2178n, are located in respective memories of the SmartNIC devices 132a and 132n. However, these buffers can be located in any network component of the data center 100 (e.g., memories of host processors, memories of reconfigurable processors, memories of NIC devices, memories on PCIe buses, memories on DDR channels, memories of DIMMs, etc.).

In the implementation illustrated in FIG. 21, the local buses 125a, 126a, 127a, 125n, 126n, and 127n and bus switches 124a and 124n that operatively couple reconfigurable processors on a same processing node to a host processor of the same processing node and to a NIC device or a SmartNIC device attached to the same processing node are PCIe buses 2132a, 2136a, 2132n, and 2136n and PCIe switches (PEX) 2112a, 2134a, 2112n, and 2134n, respectively. In other implementations, the PCIe protocol can be replaced by or supplemented with other bus protocols such as Cache Coherent Interconnect for Accelerators (CCIX), Compute Express Link (CXL), and Open Coherent Accelerator Processor Interface (OpenCAPI).

Even though the message sequence chart 2100 begins at operation one, some preceding operations are omitted for the sake of clarity. Turning to the example illustrated in FIG. 18, some examples of the omitted operations include the applications 1802 requesting execution, the compiler 1812 compiling the applications 1802 and generating the configuration files 1822, the runtime processor 1832 allocating physical resources, i.e., reconfigurable dataflow resources, for execution of the configuration files 1822, and the runtime processor 1832 loading the configuration files 1812 on the allocated reconfigurable dataflow resources. These omitted operations can be executed on any host processor or any reconfigurable processor in the data center 100.

Continuing with the example illustrated in FIG. 18, consider that the virtual dataflow resources 1824 and the virtual buffers 1824c are allocated reconfigurable dataflow resources of the processing node 1 and the processing node n in the data center 100. The first virtual processing node 1824a is allocated the processing node 1 (hereinafter "a first processing node"). The first virtual reconfigurable processor 1824a1 is allocated reconfigurable processor N (RP N) on the processing node 1 (hereinafter "a first reconfigurable processor"). The second virtual processing node 1824b is allocated the processing node n (hereinafter "a second processing node"). The second virtual reconfigurable processor 1824b1 is allocated reconfigurable processor N (RP N) on the processing node n (hereinafter "a second reconfigurable processor"). The first virtual SmartNIC buffers 1824c1 are allocated the sender buffers 2176a and the receiver buffers 2178a (hereinafter "a first plurality of buffers"). The second virtual SmartNIC buffers 1824c2 are allocated the sender buffers 2176n and the receiver buffers 2178n (hereinafter "a second plurality of buffers").

The first plurality of buffers includes a first set of sender buffers 2176a configured to receive data from the first reconfigurable processor and provide the data to a second set of receiver buffers 2178n in the second plurality of buffers. The second set of receiver buffers 2178n are configured to provide the data to the second reconfigurable processor. The second plurality of buffers includes a second set of sender buffers 2176n configured to receive data from the second reconfigurable processor and provide the data to a first set of receiver buffers 2178a in the first plurality of buffers. The first set of receiver buffers 2178a are configured to provide the data to the first reconfigurable processor.

The runtime processor 1832 is configured to configure the first SmartNIC 132a with a routing table that specifies the first reconfigurable processor as a local reconfigurable processor, and the second reconfigurable processor as a destination reconfigurable processor. The runtime processor 1832 is configured to configure the second SmartNIC 132n with a routing table that specifies the second reconfigurable processor as a local reconfigurable processor, and the first reconfigurable processor as a destination reconfigurable processor.

In particular, FIG. 21 shows one implementation of how the runtime processor 1832 executes the configuration files 1822 on the first processing node (processing node 1) and the second processing node (processing node n). In one implementation, the execution includes streaming data (e.g., configuration data (e.g., bit stream) and application data (weights, coefficients, vectors, tensors, control data (e.g., control tokens), etc.) for the configuration files 1822 that define the applications 1802 between the first reconfigurable processor and the second reconfigurable processor using one or more buffers in the first plurality of buffers and one or more buffers in the second plurality of buffers, thereby the streaming bypassing the first host processor 102a and the second host processor 102n (as indicated by the dotted lines in FIG. 21). Accordingly, in some implementations, the message sequence chart 2100 can be executed without using host processors (e.g., as the host-less implementations discussed with respect to FIG. 20). This saves latency and improves throughput, and also does not require any processing time needed on the first and second host processors 102a and 102n (e.g., for processing by their respective operating systems).

In some implementations, the execution includes streaming input data for the applications 1802 from the first reconfigurable processor to the second reconfigurable processor. In some implementations, one or more of the sender buffers in the first set of sender buffers 2176a are configured to receive the input data from the first reconfigurable processor (operation one) and provide the input data to one or more receiver buffers in the second set of receiver buffers 2178n (operation two).

The first reconfigurable processor is configured to push the input data to the first SmartNIC 132a (e.g., via the PCIe Endpoint Port (EP) 2146a) (operation one). In some implementations, operation one is accomplished by an address generator of the first reconfigurable processor (e.g., Address Generation and Coalescing Units) (AGCU)) writing the input data to physical memory addresses mapped to the sender buffers in the first set of sender buffers 2176a (e.g., via a hardware write (HWRITE) command). In one implementation, the first SmartNIC 132a is configured to write the input data, after encapsulation, into the sender buffers in the first set of sender buffers 2176a. In one implementation, the first SmartNIC 132a is configured to update tail pointers of the sender buffers in the first set of sender buffers 2176a in response to the writing of the input data. In one implementation, the first SmartNIC 132a is configured to process the input data as payload 2156a, apply encapsulation, store it in caches 2186a, and stream it to the second SmartNIC 132n over the network fabric 136 (e.g., via the MAC port 2196a).

One skilled in the art will appreciate that operations one and six comprise streaming network packets between the first reconfigurable processor and the first SmartNIC 132a over the local buses PCIe 2132a and 2136a using a protocol like Transaction Layer Packet (TLP) (e.g., 2120a, 2128a). One skilled in the art will also appreciate that operation two comprises streaming network packets from the first SmartNIC 132a to the second SmartNIC 132n over the network fabric 136 (e.g., Ethernet, InfiniBand (IB)) using protocols like RDMA over Converged Ethernet (RoCE), TCP, User Datagram Protocol (UDP), and Quick UDP Internet Connections (QUIC) (e.g., 2198a, 2198n).

The receiver buffers in the second set of receiver buffers 2178n are configured to provide the input data to the second reconfigurable processor (operation three). In some implementations, operation three is accomplished by an address generator of the second reconfigurable processor (e.g., Address Generation and Coalescing Units) (AGCU)) reading the input data from physical memory addresses mapped to the receiver buffers in the second set of receiver buffers 2178n (e.g., via a hardware read (HWREAD) command). In one implementation, the first SmartNIC 132a is configured to send the input data to the second SmartNIC 132*n* in response to the updated tail pointers. In one implementation, the second SmartNIC 132*n* is configured to write the input data, after decapsulation, into the receiver buffers in the second set of receiver buffers 2178*n*. In one implementation, the second SmartNIC 132*n* is configured to update tail pointers of the receiver buffers in the second set of receiver buffers 2178*n* in response to the writing of the input data. The second reconfigurable processor is configured to pull the input data from the second SmartNIC 132*n* (e.g., via the PCIe Endpoint Port (EP) 2146*n*) by reading the input data from the receiver buffers in the second set of receiver buffers 2178*n* in response to the updated tail pointers.

In some implementations, the execution includes streaming output data for the applications 1802 from the second reconfigurable processor to the first reconfigurable processor. The output data is generated as a result of processing the input data (e.g., processing of the input data by the second reconfigurable processor). In some implementations, one or more of the sender buffers in the second set of sender buffers 2176*n* are configured to receive the output data from the second reconfigurable processor (operation four) and provide the output data to one or more receiver buffers in the first set of receiver buffers 2178*a* (operation five).

The second reconfigurable processor is configured to push the output data to the second SmartNIC 132*n* (e.g., via the PCIe Endpoint Port (EP) 2146*n*) (operation four). In some implementations, operation four is accomplished by an address generator of the second reconfigurable processor (e.g., Address Generation and Coalescing Units) (AGCU)) writing the output data to physical memory addresses mapped to the sender buffers in the second set of sender buffers 2176*n* (e.g., via a hardware write (HWRITE) command). In one implementation, the second SmartNIC 132*n* is configured to write the output data, after encapsulation, into the sender buffers in the second set of sender buffers 2176*n*. In one implementation, the second SmartNIC 132*n* is configured to update tail pointers of the sender buffers in the second set of sender buffers 2176*n* in response to the writing of the output data. In one implementation, the second SmartNIC 132*n* is configured to process the output data as payload 2156*n*, apply encapsulation, store it in caches 2186*n*, and stream it to the first SmartNIC 132*a* over the network fabric 136 (e.g., via the MAC port 2196*n*).

One skilled in the art will appreciate that operations three and four comprise streaming network packets between the second reconfigurable processor to the second SmartNIC 132*n* over the local buses PCIe 2132*n* and 2136*n* using a protocol like Transaction Layer Packet (TLP) (e.g., 2120*n*, 2128*n*). One skilled in the art will also appreciate that operation five comprises streaming network packets from the second SmartNIC 132*n* to the first SmartNIC 132*a* over the network fabric 136 (e.g., Ethernet, InfiniBand (IB)) using protocols like RDMA over Converged Ethernet (RoCE), TCP, User Datagram Protocol (UDP), and Quick UDP Internet Connections (QUIC) (e.g., 2198*a*, 2198*n*).

The receiver buffers in the first set of receiver buffers 2178*a* are configured to provide the output data to the first reconfigurable processor (operation six). In some implementations, operation six is accomplished by an address generator of the first reconfigurable processor (e.g., Address Generation and Coalescing Units) (AGCU)) reading the output data from physical memory addresses mapped to the receiver buffers in the first set of receiver buffers 2178*a* (e.g., via a hardware read (HWREAD) command). In one implementation, the second SmartNIC 132*n* is configured to send the output data to the first SmartNIC 132*a* in response to the updated tail pointers. In one implementation, the first SmartNIC 132*a* is configured to write the output data, after decapsulation, into the receiver buffers in the first set of receiver buffers 2178*a*. In one implementation, the first SmartNIC 132*a* is configured to update tail pointers of the receiver buffers in the first set of receiver buffers 2178*a* in response to the writing of the output data. The first reconfigurable processor is configured to pull the output data from the first SmartNIC 132*a* (e.g., via the PCIe Endpoint Port (EP) 2146*a*) by reading the output data from the receiver buffers in the first set of receiver buffers 2178*a* in response to the updated tail pointers.

In some implementations, the first reconfigurable processor notifies the second reconfigurable processor of remote invocations using one or more remote procedure calls. In one implementation, the first reconfigurable processor uses the sender buffers in the first set of sender buffers 2176*a* and the receiver buffers in the second set of receiver buffers 2178*n* to send, over the network fabric 136, one or more argument values to the second reconfigurable processor for execution of the remote procedure calls (similar to operation 2 in FIG. 21).

In some implementations, the second reconfigurable processor notifies the first reconfigurable processor of remote invocations using one or more remote procedure calls. In one implementation, the second reconfigurable processor uses the sender buffers in the second set of sender buffers 2176*n* and the receiver buffers in the first set of receiver buffers 2178*a* to send, over the network fabric 136, one or more argument values to the first reconfigurable processor for execution of the remote procedure calls (similar to operation 5 in FIG. 21).

Figure 22:
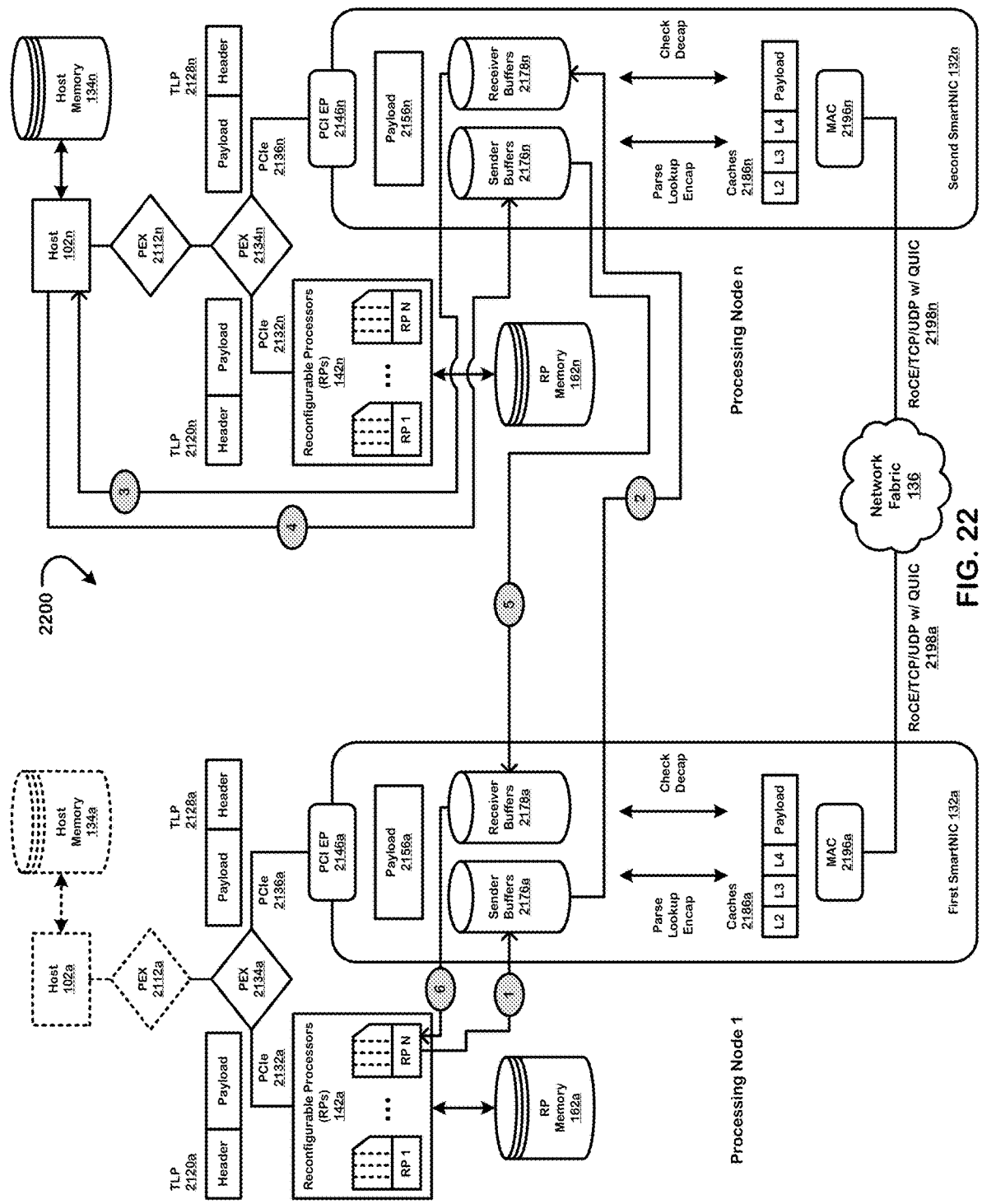
FIG. 22 is a message sequence chart illustrating another implementation of buffer-based inter-node streaming of configuration data over the network fabric.

FIG. 22 is a message sequence chart 2200 illustrating another implementation of buffer-based inter-node streaming of configuration data (e.g., bit stream) over the network fabric 136. In particular, FIG. 22 shows another implementation of how the runtime processor 1832 executes the configuration files 1822 on the first processing node (processing node 1) and the second processing node (processing node n). In one implementation, the execution includes streaming data (e.g., configuration data (e.g., bit stream) and application data (weights, coefficients, vectors, tensors, control data (e.g., control tokens), etc.) for the configuration files 1822 that define the applications 1802 between the first reconfigurable processor and the second host processor 102*n* using one or more buffers in the first plurality of buffers and one or more buffers in the second plurality of buffers, thereby the streaming bypassing the first host processor 102*a* (as indicated by the dotted lines in FIG. 22). This saves latency and improves throughput, and also does not require any processing time needed on the first host processor 102*a* (e.g., for processing by its operating system).

In some implementations, the execution includes streaming input data for the applications 1802 from the first reconfigurable processor to the second host processor 102*n*. In some implementations, one or more of the sender buffers in the first set of sender buffers 2176*a* are configured to receive the input data from the first reconfigurable processor (operation one) and provide the input data to one or more receiver buffers in the second set of receiver buffers 2178*n* (operation two).

The first reconfigurable processor is configured to push the input data to the first SmartNIC 132*a* (e.g., via the PCIe endpoint port (EP) 2146*a*) (operation one). In some implementations, operation one is accomplished by an address generator of the first reconfigurable processor (e.g., Address Generation and Coalescing Units) (AGCU)) writing the input data to physical memory addresses mapped to the sender buffers in the first set of sender buffers 2176a (e.g., via a hardware write (HWRITE) command). In one implementation, the first SmartNIC 132a is configured to write the input data, after encapsulation, into the sender buffers in the first set of sender buffers 2176a. In one implementation, the first SmartNIC 132a is configured to update tail pointers of the sender buffers in the first set of sender buffers 2176a in response to the writing of the input data. In one implementation, the first SmartNIC 132a is configured to process the input data as payload 2156a, apply encapsulation, store it in caches 2186a, and stream it to the second SmartNIC 132n over the network fabric 136 (e.g., via the MAC port 2196a).

One skilled in the art will appreciate that operations one and six comprise streaming network packets between the first reconfigurable processor and the first SmartNIC 132a over the local buses PCIe 2132a and 2136a using a protocol like Transaction Layer Packet (TLP) (e.g., 2120a, 2128a). One skilled in the art will also appreciate that operation two comprises streaming network packets from the first SmartNIC 132a to the second SmartNIC 132n over the network fabric 136 (e.g., Ethernet, InfiniBand (IB)) using protocols like RDMA over Converged Ethernet (RoCE), TCP, User Datagram Protocol (UDP), and Quick UDP Internet Connections (QUIC) (e.g., 2198a, 2198n).

The receiver buffers in the second set of receiver buffers 2178n are configured to provide the input data to the second host processor 102n (operation three). In some implementations, operation three is accomplished by an address generator of the second host processor 102n (e.g., the second host processor reads DMAed data once the DMA operation is complete.) reading the input data from physical memory addresses mapped to the receiver buffers in the second set of receiver buffers 2178n (e.g., via a hardware read (HWREAD) command). In one implementation, the first SmartNIC 132a is configured to send the input data to the second SmartNIC 132n in response to the updated tail pointers. In one implementation, the second SmartNIC 132n is configured to write the input data, after decapsulation, into the receiver buffers in the second set of receiver buffers 2178n. In one implementation, the second SmartNIC 132n is configured to update tail pointers of the receiver buffers in the second set of receiver buffers 2178n in response to the writing of the input data. The second host processor 102n is configured to pull the input data from the second SmartNIC 132n (e.g., via the PCIe Endpoint Port (EP) 2146n) by reading the input data from the receiver buffers in the second set of receiver buffers 2178n in response to the updated tail pointers. Generally SmartNIC would DMA the payload into host 102n memory 134n, then notify the host via a DMA completion mechanism.

In some implementations, the execution includes streaming output data for the applications 1802 from the second host processor 102n to the first reconfigurable processor. The output data is generated as a result of processing the input data (e.g., processing of the input data by the second host processor 102n). In some implementations, one or more of the sender buffers in the second set of sender buffers 2176n are configured to receive the output data from the second host processor 102n (operation four) and provide the output data to one or more receiver buffers in the first set of receiver buffers 2178a (operation five).

The second host processor 102n is configured to push the output data to the second SmartNIC 132n (e.g., via the PCIe Endpoint Port (EP) 2146n) (operation four). In some implementations, operation four is accomplished by a DMA operation. In one implementation, the second SmartNIC 132n is configured to write the output data, after encapsulation, into the sender buffers in the second set of sender buffers 2176n. In one implementation, the second SmartNIC 132n is configured to update tail pointers of the sender buffers in the second set of sender buffers 2176n in response to the writing of the output data. In one implementation, the second SmartNIC 132n is configured to process the output data as payload 2156n, apply encapsulation, store it in caches 2186n, and stream it to the first SmartNIC 132a over the network fabric 136 (e.g., via the MAC port 2196n).

One skilled in the art will appreciate that operations three and four comprise streaming network packets between the second host processor 102n to the second SmartNIC 132n over the local buses PCIe 2132n and 2136n using a protocol like Transaction Layer Packet (TLP) (e.g., 2120n, 2128n). One skilled in the art will also appreciate that operation five comprises streaming network packets from the second SmartNIC 132n to the first SmartNIC 132a over the network fabric 136 (e.g., Ethernet, InfiniBand (IB)) using protocols like RDMA over Converged Ethernet (RoCE), TCP, User Datagram Protocol (UDP), and Quick UDP Internet Connections (QUIC) (e.g., 2198a, 2198n).

The receiver buffers in the first set of receiver buffers 2178a are configured to provide the output data to the first reconfigurable processor (operation six). In some implementations, operation six is accomplished by an address generator of the first reconfigurable processor (e.g., Address Generation and Coalescing Units) (AGCU)) reading the output data from physical memory addresses mapped to the receiver buffers in the first set of receiver buffers 2178a (e.g., via a hardware read (HWREAD) command). In one implementation, the second SmartNIC 132n is configured to send the output data to the first SmartNIC 132a in response to the updated tail pointers. In one implementation, the first SmartNIC 132a is configured to write the output data, after decapsulation, into the receiver buffers in the first set of receiver buffers 2178a. In one implementation, the first SmartNIC 132a is configured to update tail pointers of the receiver buffers in the first set of receiver buffers 2178a in response to the writing of the output data. The first reconfigurable processor is configured to pull the output data from the first SmartNIC 132a (e.g., via the PCIe Endpoint Port (EP) 2146a) by reading the output data from the receiver buffers in the first set of receiver buffers 2178a in response to the updated tail pointers.

In some implementations, the first reconfigurable processor notifies the second host processor 102n of remote invocations using one or more remote procedure calls. In one implementation, the first reconfigurable processor uses the sender buffers in the first set of sender buffers 2176a and the receiver buffers in the second set of receiver buffers 2178n to send, over the network fabric 136, one or more argument values to the second host processor 102n for execution of the remote procedure calls (similar to operation 2 in FIG. 22).

In some implementations, the second host processor 102n notifies the first reconfigurable processor of remote invocations using one or more remote procedure calls. In one implementation, the second host processor 102n uses the sender buffers in the second set of sender buffers 2176n and the receiver buffers in the first set of receiver buffers 2178a to send, over the network fabric 136, one or more argument values to the first reconfigurable processor for execution of the remote procedure calls (similar to operation 5 in FIG. 22).

In the synchronous mode of a remote procedure call using a first set of buffers, the technology disclosed allows a remote entity which executed the remote procedure call to produce one or more result values and send them back to the remote caller using a distinct set of buffers. In one implementation, the two communicating entities may designate two buffer queues, one in each direction. The caller will send the data by copying it into a first buffer queue. The receiver will pull the data out of the first buffer queue, compute an operation, and then place the result in a second buffer queue. The original caller will simply wait until the second buffer queue has data available and will be able to use the result computed remotely as soon as it arrives over the second buffer queue.

In other implementations of the technology disclosed, SmartNICs can be replaced by NICs, which can be controlled by NIC DMAs or via the host processors to implement the flows illustrated in FIGS. 21 and 22 (e.g., updating the head and tail pointers of the buffers). For example, in the NIC implementations, operations two and five of FIGS. 21 and 22 are executed by the first and second host processors 102a and 102n by initiating Remote DMA (RDMA) of the networking packets between the first NIC 132a and the second NIC 132n, and updating the corresponding tail pointers of the buffers upon arrival of the network packets.

In some implementations, the SmartNICs and the NICs are embedded on-chip on the reconfigurable processors.

Model Parallelism

Figure 23:
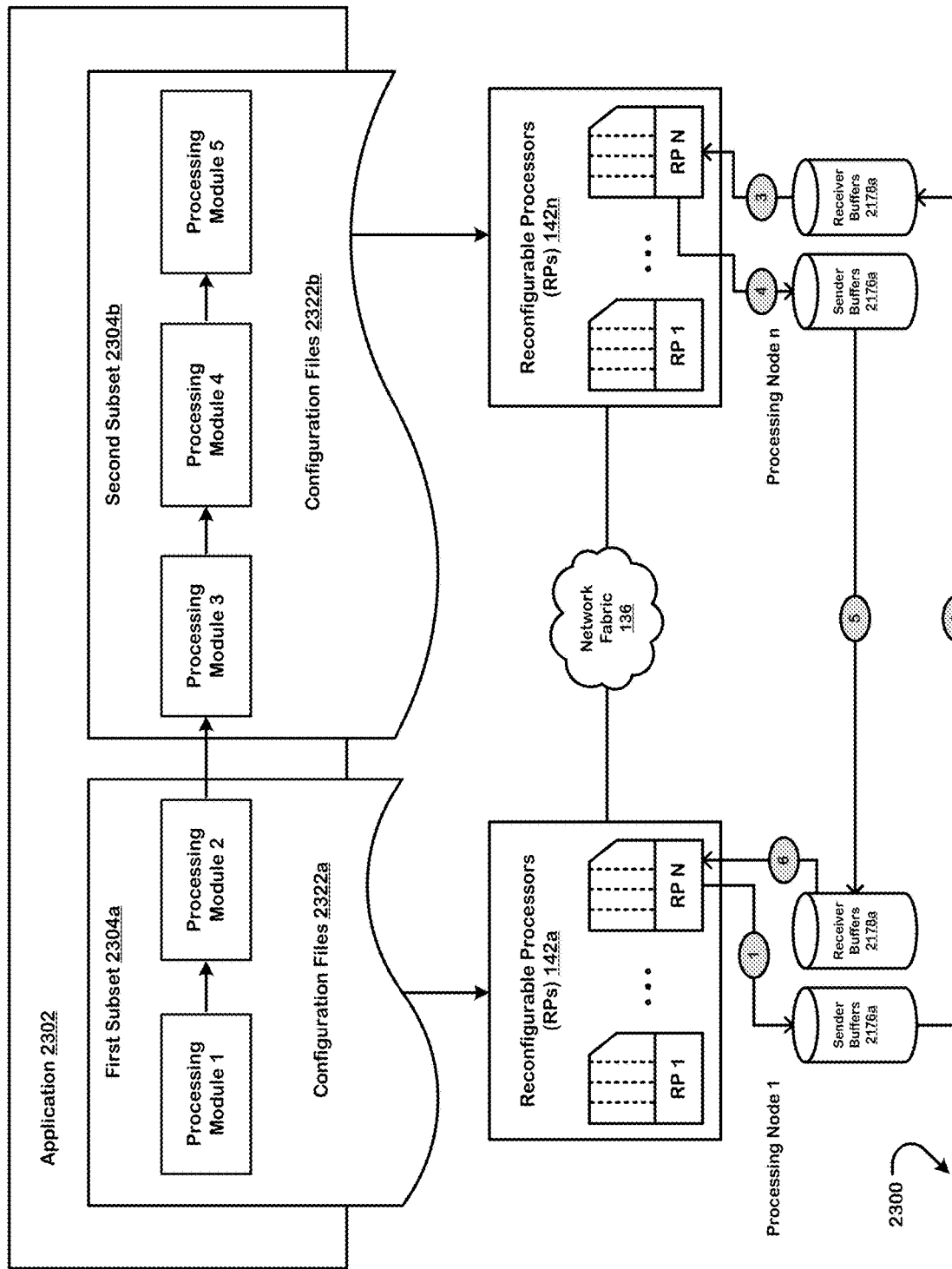
FIG. 23 illustrates one implementation of executing a model/application in parallel using the disclosed buffer-based inter-node streaming of configuration data over the network fabric 136. This is referred to herein as "model parallelism."

FIG. 23 illustrates one implementation of executing 2300 a model/application in parallel using the disclosed buffer-based inter-node streaming of configuration data (e.g., bit stream) over the network fabric 136. This is referred to herein as "model parallelism."

Application 2302 is a dataflow graph with a set of processing modules (e.g., processing modules 1 to 5). Examples of the processing modules include neurons or layers of deep neural networks. The runtime processor 1832 is configured to partition the set of processing modules into a first subset of processing modules 2304a and a second subset of processing modules 2304b. The runtime processor 1832 is configured to execute configuration files 2322a for the first subset of processing modules 2304a on the first reconfigurable processor (e.g., RP N from the RPs 142a on the processing node 1). The runtime processor 1832 is configured to execute configuration files 2322b for the second subset of processing modules 2304b on the second reconfigurable processor (e.g., RP N from the RPs 142n on the processing node n).

Deep neural network training, implemented, for example, by Stochastic Gradient Descent (SGD) comprises a forward pass and a backward pass. The backward pass comprises a delta pass and a chain pass. The forward pass propagates activations in a forward direction. The delta pass propagates deltas in a backward direction. The chain pass calculates gradients based on the deltas as the deltas are generated in the delta pass.

The runtime processor 1832 is configured to use the first plurality of buffers 2176a, 2178a and the second plurality of buffers 2176n, 2178n to stream data between the first subset of processing modules 2304a and the second subset of processing modules 2304b. The data includes feature maps and/or activations generated during a forward pass, and loss gradients generated during a backward pass.

The operations one to six depicted in FIG. 23 are similar to corresponding operations in FIG. 21.

Data Parallelism

Figure 24:
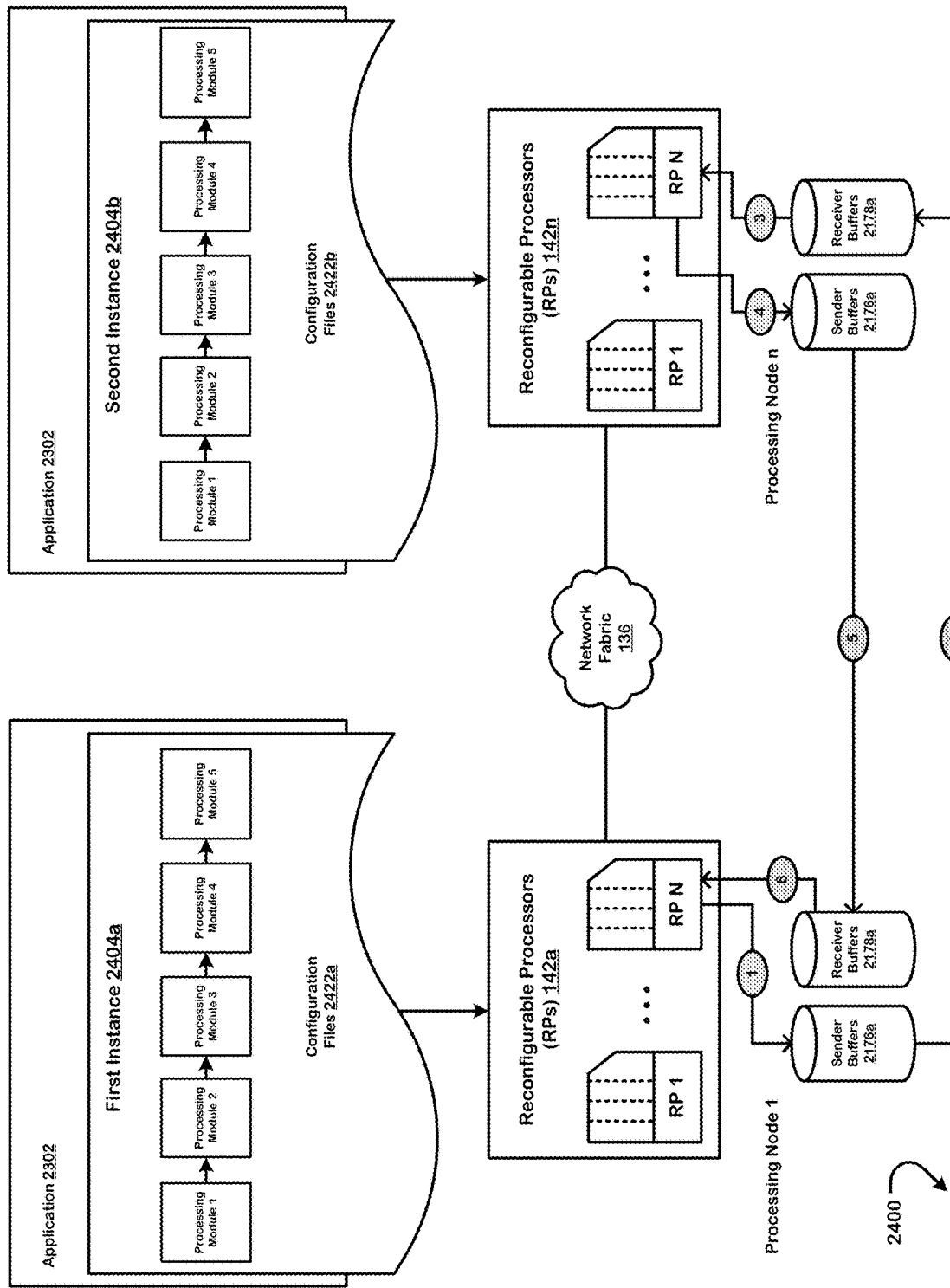
FIG. 24 illustrates one implementation of executing multiple instances of a model/application in parallel using the disclosed buffer-based inter-node streaming of configuration data over the network fabric 136. This is referred to herein as "data parallelism."

FIG. 24 illustrates one implementation of executing 2400 multiple instances of a model/application in parallel using the disclosed buffer-based inter-node streaming of configuration data (e.g., bit stream) over the network fabric 136. This is referred to herein as "data parallelism." The runtime processor 1832 is configured to initialize a first instance of the dataflow graph 2404a and a second instance of the dataflow graph 2404b.

The runtime processor 1832 is configured to execute configuration files 2422a for the first instance 2404a of the dataflow graph on the first reconfigurable processor (e.g., RP N from the RPs 142a on the processing node 1). The runtime processor 1832 is configured to execute configuration files 2422b for the second instance 2404b of the dataflow graph on the second reconfigurable processor (e.g., RP N from the RPs 142n on the processing node n).

The runtime processor 1832 is configured to use the first plurality of buffers 2176a, 2178a and the second plurality of buffers 2176n, 2178n to stream data between the first instance of the dataflow graph and the second instance of the dataflow graph. The data includes gradients generated during the backward pass.

The operations one to six depicted in FIG. 24 are similar to corresponding operations in FIG. 21.

Heterogeneous Reconfigurable Processors

Figure 25:
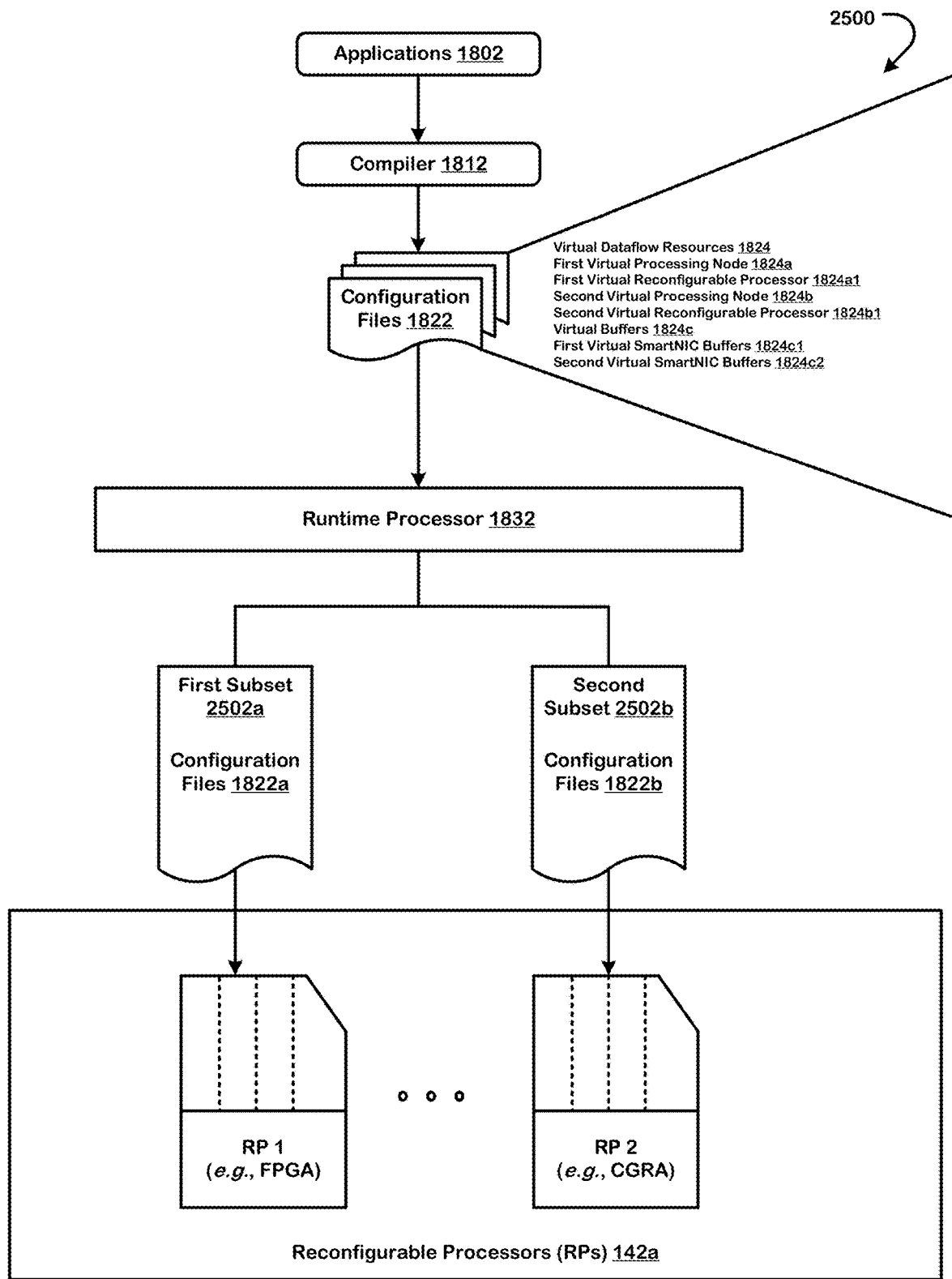
FIG. 25 illustrates one implementation of executing configuration files on heterogeneous reconfigurable processors.

FIG. 25 illustrates one implementation of executing 2500 configuration files on heterogeneous reconfigurable processors (e.g., RP 1 and RP 2 in FIG. 25). Examples of the heterogeneous reconfigurable processors include Central Processing Units (CPUs), Graphics Processing Units (GPUs), Field Programmable Gate Arrays (FPGAs), Coarse-Grained Reconfigurable Architectures (CGRAs), Application-Specific Integrated Circuits (ASICs), Application Specific Instruction-set Processor (ASIP), and Digital Signal Processors (DSPs).

The heterogeneous reconfigurable processors have different levels of configurable granularity. The runtime processor 1832 is configured to receive a set of configuration files (e.g., 1822) for an application (e.g., 1802). The runtime processor 1832 is configured to load and execute a first subset of configuration files 2502a in the set of configuration files on a first reconfigurable processor (RP 1) in the heterogeneous reconfigurable processors. The first reconfigurable processor has a first configuration and/or a first level of configurable granularity. The runtime processor 1832 is configured to load and execute a second subset of configuration files 2502b in the set of configuration files on a second reconfigurable processor (RP 2) in the heterogeneous reconfigurable processors. The second reconfigurable processor has a second configuration and/or a second level of configurable granularity that is different from the first configuration and/or the first level of configurable granularity.

The first level of configurable granularity is a bit-level configurable granularity, and the first reconfigurable processor is a Field-Programmable Gate Array (FPGA). The second level of configurable granularity is a word-level configurable granularity, and the second reconfigurable processor is a Coarse-Grained Reconfigurable Architecture (CGRA).

The first configuration is a bit-level configurable granularity, and the first reconfigurable processor is a Field-Programmable Gate Array (FPGA). The second configuration is a word-level configurable granularity, and the second reconfigurable processor is a Coarse-Grained Reconfigurable Architecture (CGRA). The first configuration is a gate-level reconfigurability, and the first reconfigurable processor is the FPGA. The second configuration is a register transfer-level reconfigurability, and the second reconfigurable processor is the CGRA. The first configuration uses bit-wise Look-Up Tables (LUTs) and switches, and the first reconfigurable processor is the FPGA. The second configuration uses word-wide Issue Slots (ISs)/Arithmetic Logic Units (ALUs)/Functional Units (FUs)/Processing Elements (PEs), Register Files (RFs), and interconnections, and the second reconfigurable processor is the CGRA. A number of the ISs used by the second reconfigurable processor is fewer than a number of the LUTs used by the first reconfigurable processor. A number of bits required to configure the second reconfigurable processor is orders of magnitude smaller than a number of bits required to configure the first reconfigurable processor.

On-Chip NIC/SmartNIC

Figure 26:
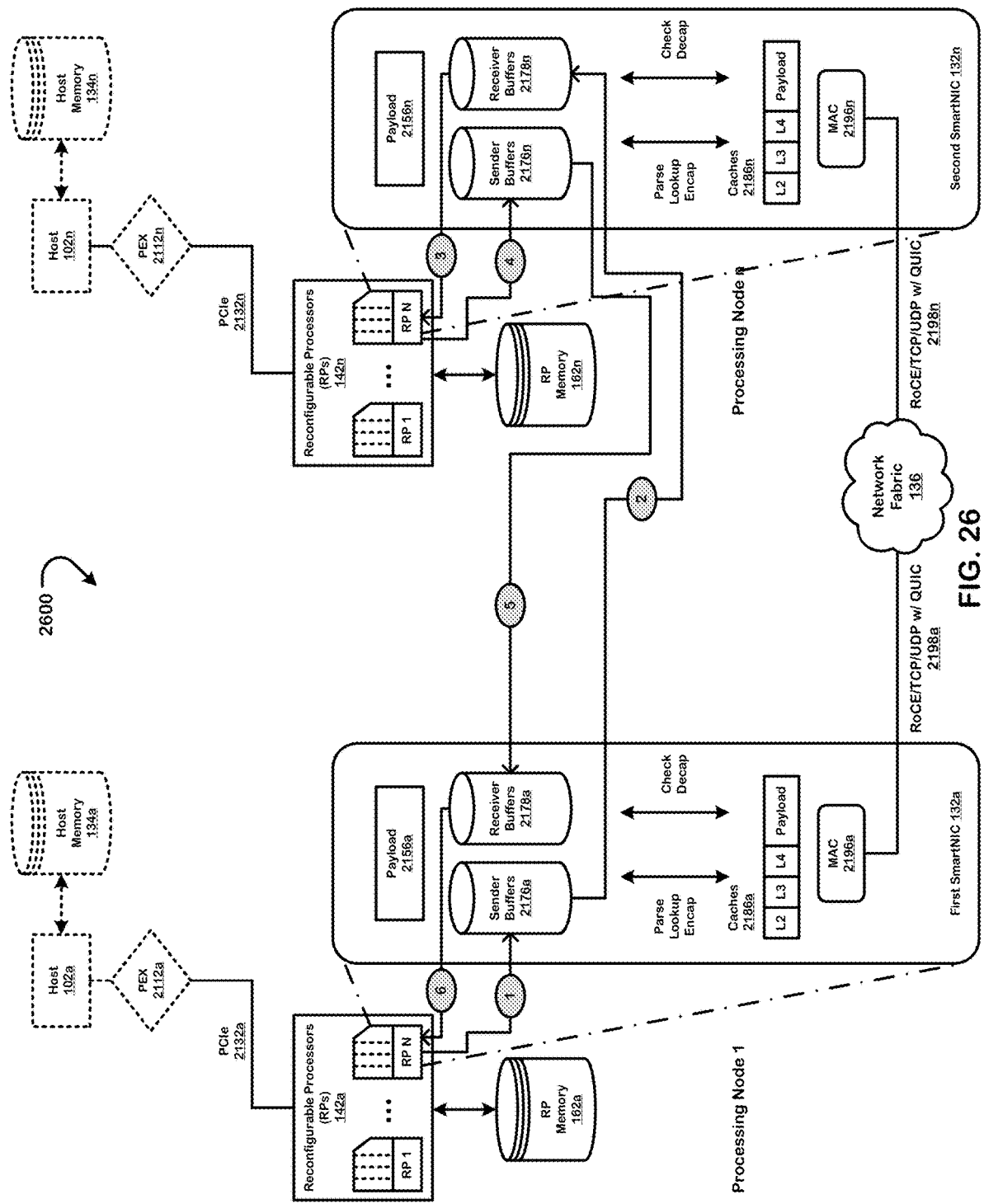
FIG. 26 illustrates one implementation of executing configuration files using NIC or SmartNIC devices that are embedded on the reconfigurable processors.

FIG. 26 illustrates one implementation of executing 2600 configuration files using NIC or SmartNIC devices that are embedded on the reconfigurable processors.

A first reconfigurable processor (e.g., RP N from the RPs 142a on the processing node 1) has a first Network Interface Controller (NIC), and the first NIC has a first plurality of buffers 2176a, 2178a. A second reconfigurable processor (e.g., RP N from the RPs 142n on the processing node n) has a second NIC, and the second NIC has a second plurality of buffers 2176n, 2178n. The runtime processor 1832 is configured to execute the configuration files 1812 for the applications 1802 using the first reconfigurable processor and the second reconfigurable processor. The execution includes streaming data (e.g., configuration data (e.g., bit stream) and application data (weights, coefficients, vectors, tensors, control data (e.g., control tokens), etc.) for the configuration files 1822 that define the applications 1802 between the first reconfigurable processor and the second reconfigurable processor using the first plurality of buffers of the first NIC and the second plurality of buffers of the second NIC.

The operations one to six depicted in FIG. 26 are similar to corresponding operations in FIG. 21.

Example Reconfigurable Processor

Figure 27:
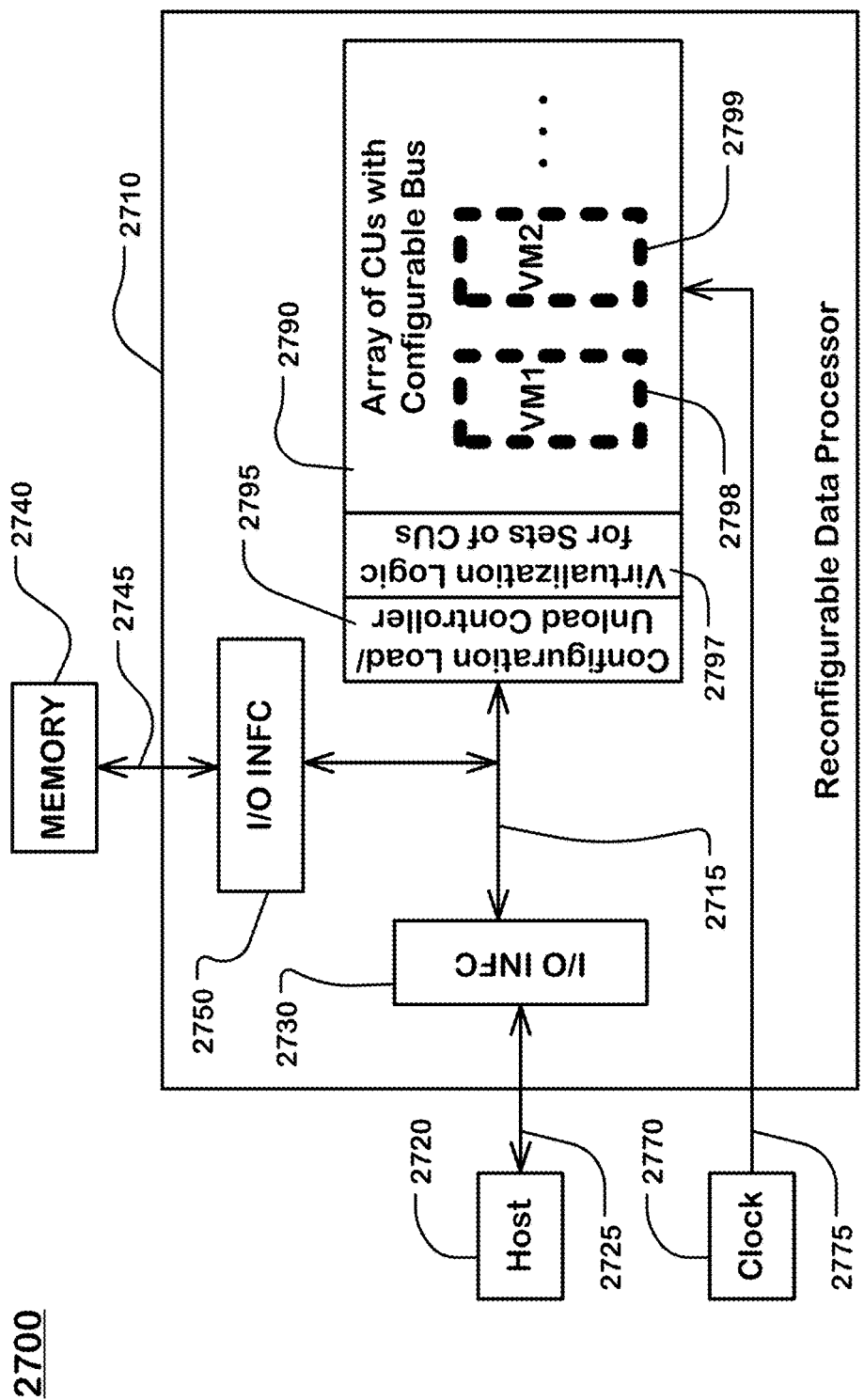
FIG. 27 is a system diagram illustrating a system including a host, a memory, and an example reconfigurable data processor on which the technology disclosed can be applied.

FIG. 27 is a diagram illustrating a system 2700 including a host 2720, a memory 2740, and an example reconfigurable data processor 2710 in which a computation unit as described herein is deployed by hardware or by configuration of reconfigurable components and configured with the virtualization logic 2797. As shown in the example of FIG. 27, the reconfigurable data processor 2710 includes an array 2790 of configurable units and a configuration load/unload controller 2795.

The virtualization logic 2797 can include resources that support or enable simultaneous execution of multiple, unrelated application graphs (or related ones) in an array of configurable units on one die or one multichip module. In the illustration, a first application graph is implemented in virtual machine VM1 in a particular set 2798 of configurable units, and a second application graph is implemented in virtual machine VM2 in another set 2799 of configurable units.

Figure 30:
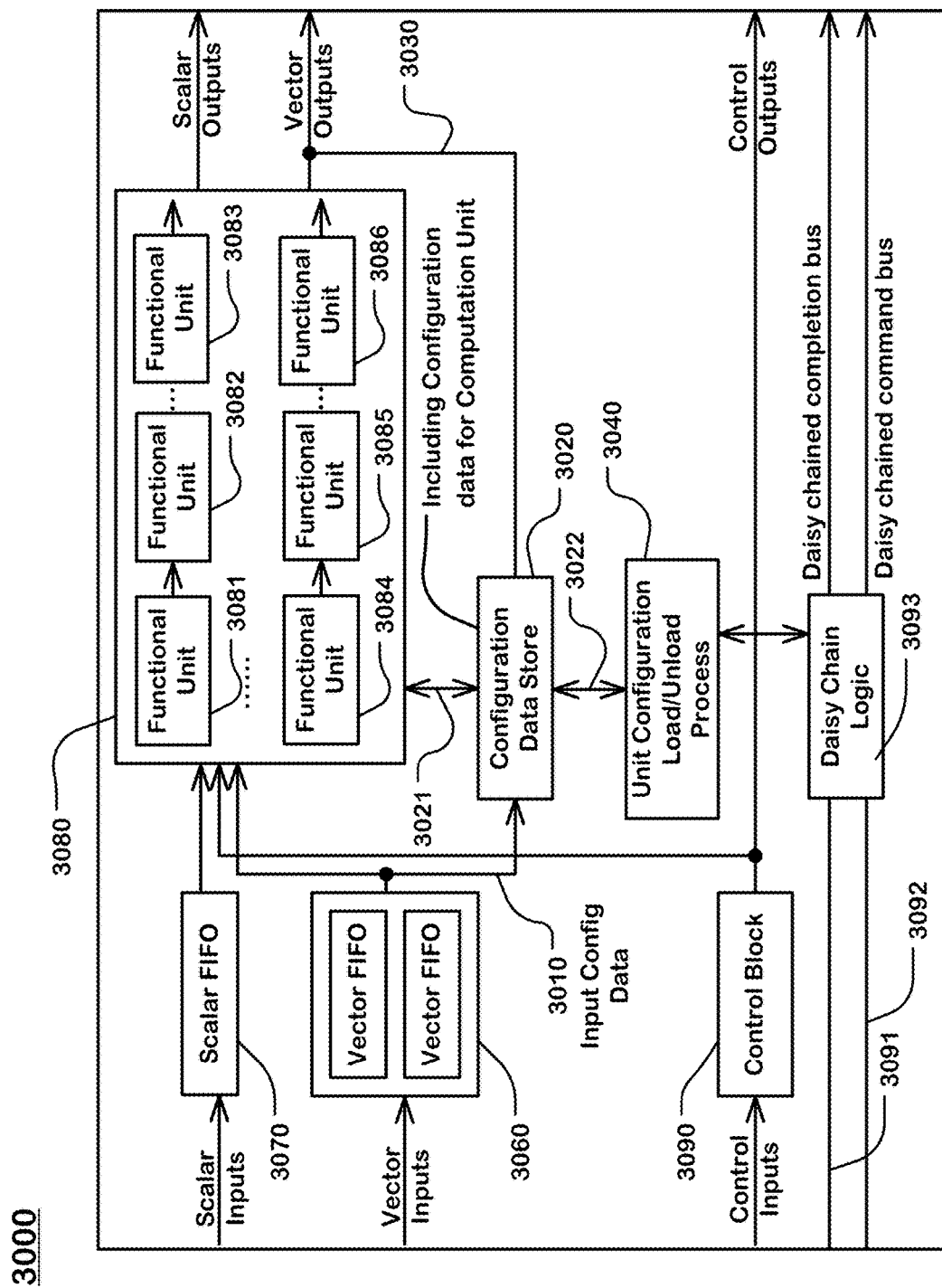
FIG. 30 is a block diagram illustrating an example configurable unit, such as a Pattern Compute Unit (PCU).
Figure 31:
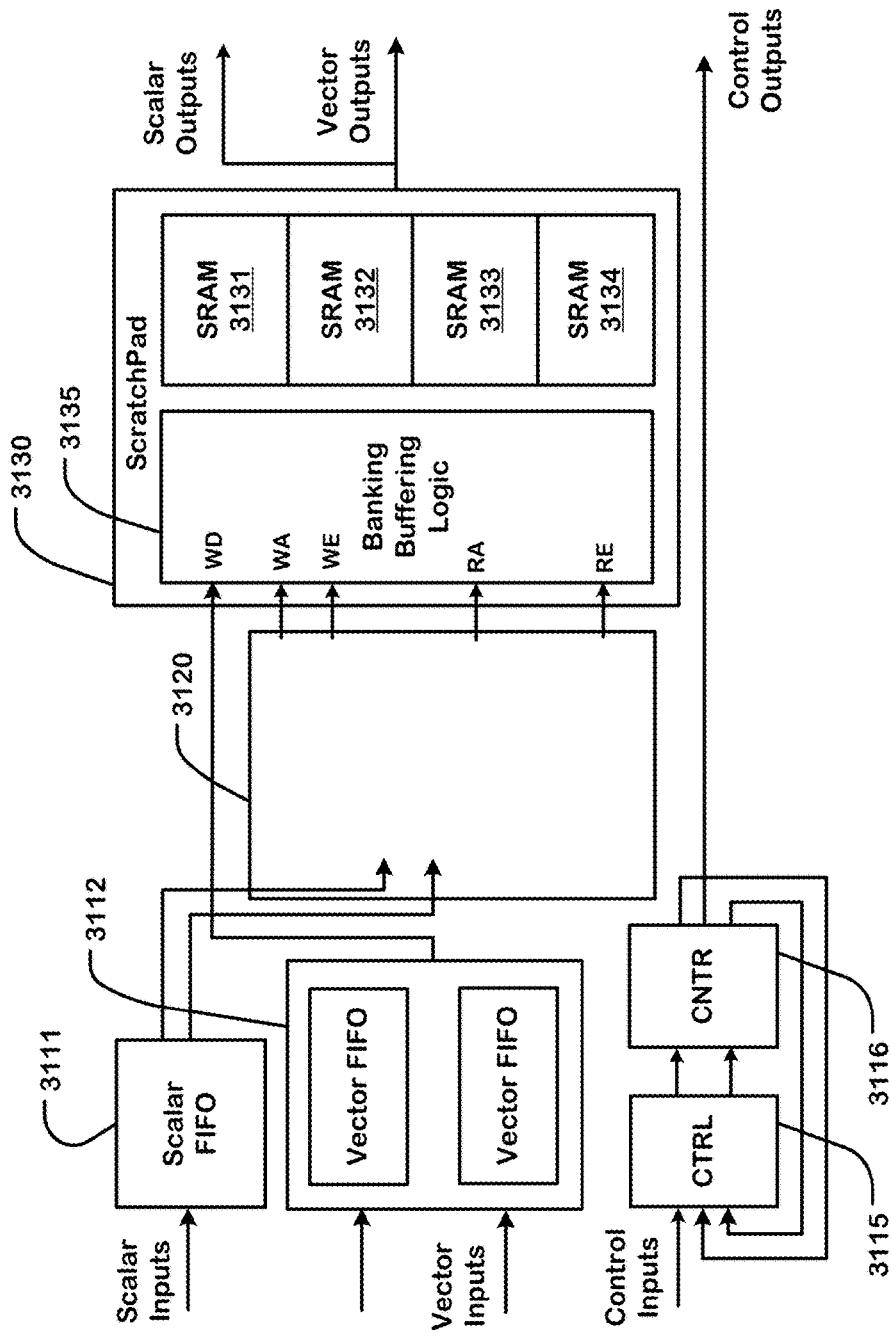
FIG. 31 is a block diagram illustrating an example configurable unit, such as a Pattern Memory Unit (PMU).

Configurable units in an array 2790 of configurable units are further described in reference to FIGS. 30 and 31 and configured with the virtualization logic 2797. Configurable units can include, or can have units configured to implement, a computation unit or computation units, as described herein.

The reconfigurable data processor 2710 includes an external I/O interface 2730 connected to the host 2720 by line 2725, and an external I/O interface 2750 connected to the memory 2740 by line 2745. The I/O interfaces 2730, 2750 connect via a bus system 2715 to the array 2790 of configurable units and to the configuration load/unload controller 2795. The bus system 2715 may have a bus width of carrying one chunk of data, which can be for this example one hundred and twenty-eight bits (references to one hundred and twenty-eight bits throughout can be considered as an example chunk size more generally).

To configure configurable units in the array 2790 of configurable units with a configuration file, the host 2720 can send the configuration file to the memory 2740 via the I/O interface 2730, the bus system 2715, and the I/O interface 2750 in the reconfigurable data processor 2710. The configuration file can be loaded in many ways, as suits a particular architecture, including in data paths outside the configurable processor 2710. The configuration file can be retrieved from the memory 2740 via the memory I/O interface 2750. Chunks of the configuration file can then be sent in a distribution sequence to configurable units in the array 2790 of configurable units in the reconfigurable data processor 2710.

An external clock generator 2770 or other clock line sources can provide a clock line 2775 or clock lines to elements in the reconfigurable data processor 2710, including the array 2790 of configurable units, and the bus system 2715, and the external data I/O interfaces. The bus system 2715 can communicate data at a processor clock rate via a clock line 2775 or clock lines.

Figure 28:
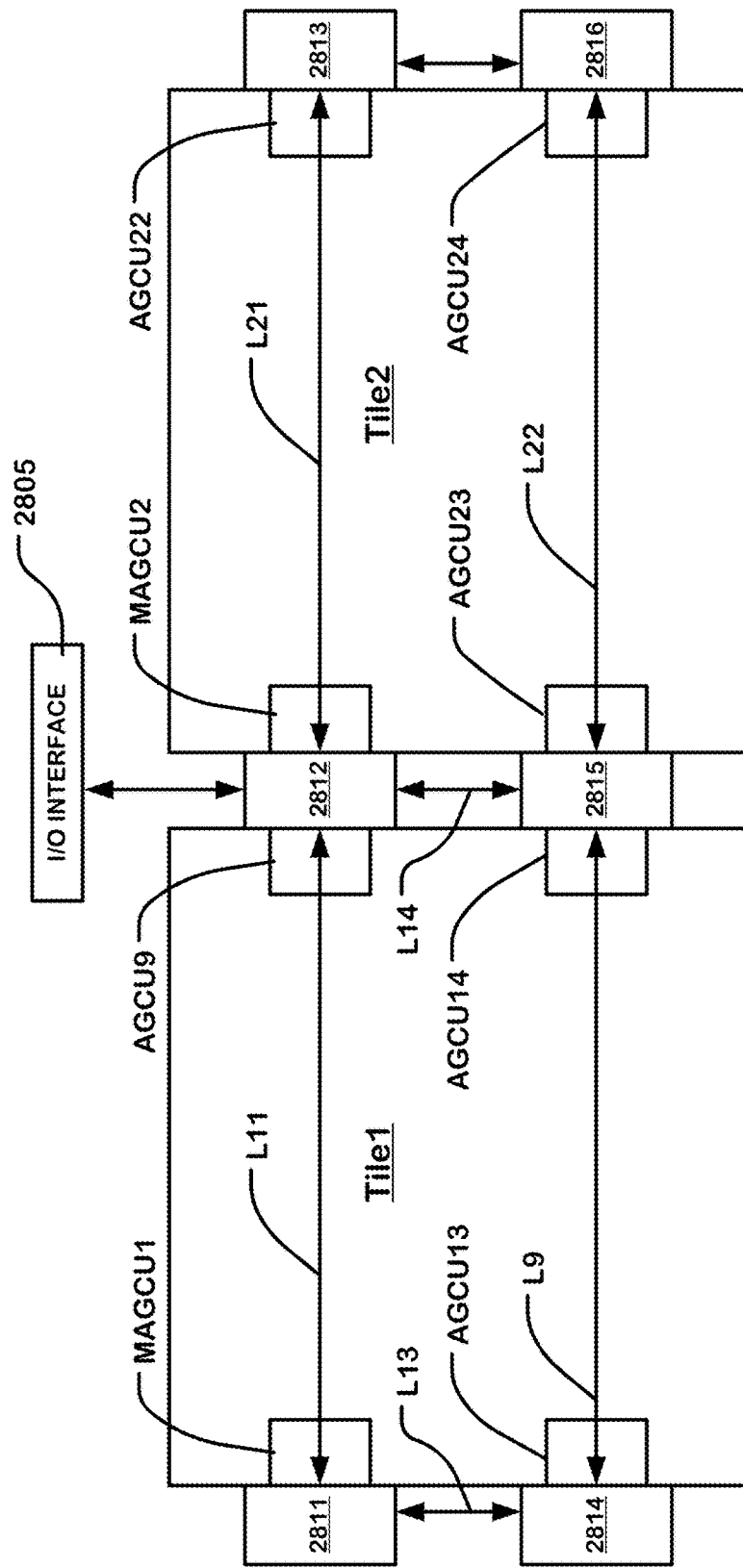
FIG. 28 is a simplified block diagram of a top-level network and components of a CGRA (Coarse-Grained Reconfigurable Architecture).

FIG. 28 is a simplified block diagram 2800 of components of a CGRA (Coarse-Grained Reconfigurable Architecture) processor. In this example, the CGRA processor has two tiles (Tile1, Tile2). The tile comprises an array of configurable units connected to a bus system, including array level networks in this example. An array of configurable units (e.g., 2790, FIG. 27) in the tile includes computation units in hardware or by configuration of reconfigurable components, which are configured with the virtualization logic 2797. The bus system includes a top-level network connecting the tiles to external I/O interface 2805 (or any number of interfaces). In other embodiments, different bus system configurations may be utilized. The configurable units in each tile are nodes on the array level network in this embodiment.

Each of the tiles has four AGCUs (Address Generation and Coalescing Units) (e.g., MAGCU1, AGCU9, AGCU13, AGCU14). The AGCUs are nodes on the top-level network and nodes on the array level networks and include resources for routing data among nodes on the top-level network and nodes on the array level network in each tile.

Nodes on the top-level network in this example include one or more external I/Os, including interface 2805. The interfaces to external devices include resources for routing data among nodes on the top-level network and external devices, such as high-capacity memory, host processors, other CGRA processors, FPGA devices and so on, that are connected to the interfaces.

One of the AGCUs in a tile is configured in this example to be a master AGCU, which includes an array configuration load/unload controller for the tile. In other embodiments, more than one array configuration load/unload controller can be implemented, and one array configuration load/unload controller may be implemented by logic distributed among more than one AGCU.

The MAGCU1 includes a configuration load/unload controller for Tile1, and MAGCU2 includes a configuration load/unload controller for Tile2. In other embodiments, a configuration load/unload controller can be designed for loading and unloading configuration of more than one tile. In other embodiments, more than one configuration controller can be designed for configuration of a single tile. Also, the configuration load/unload controller can be implemented in other portions of the system, including as a stand-alone node on the top-level network and the array level network or networks.

The top-level network is constructed using top-level switches (2811, 2813, 2814, and 2816) connecting to each other as well as to other nodes on the top-level network, including the AGCUs, and I/O interface 2805. The top-level network includes links (e.g., L11, L9, L21, L22) connecting the top-level switches. Data travels in packets between the top-level switches on the links, and from the switches to the nodes on the network connected to the switches. For example, top-level switches 2811 and 2812 are connected by a link L14, top-level switches 2814 and 2815 are connected by a link L9, top-level switches 2811 and 2814 are connected by a link L13, and top-level switches 2812 and 2813 are connected by a link L21. The links can include one or more buses and supporting control lines, including for example a chunk-wide bus (vector bus). For example, the top-level network can include data, request and response channels operable in coordination for transfer of data in a manner analogous to an AXI compatible protocol. See, AMBA® AXI and ACE Protocol Specification, ARM.

Top-level switches can be connected to AGCUs. For example, top-level switches 2811, 2812, 2814, and 2815 are connected to MAGCU1, AGCU9, AGCU13 and AGCU14 in the tile Tile1, respectively. Top-level switches 2812, 2813, 2815, and 2816 are connected to MAGCU2, AGCU22, AGCU23 and AGCU24 in the tile Tile2, respectively.

Top-level switches can be connected to one or more external I/O interfaces (e.g., interface 2805).

Figures 29, 29B:
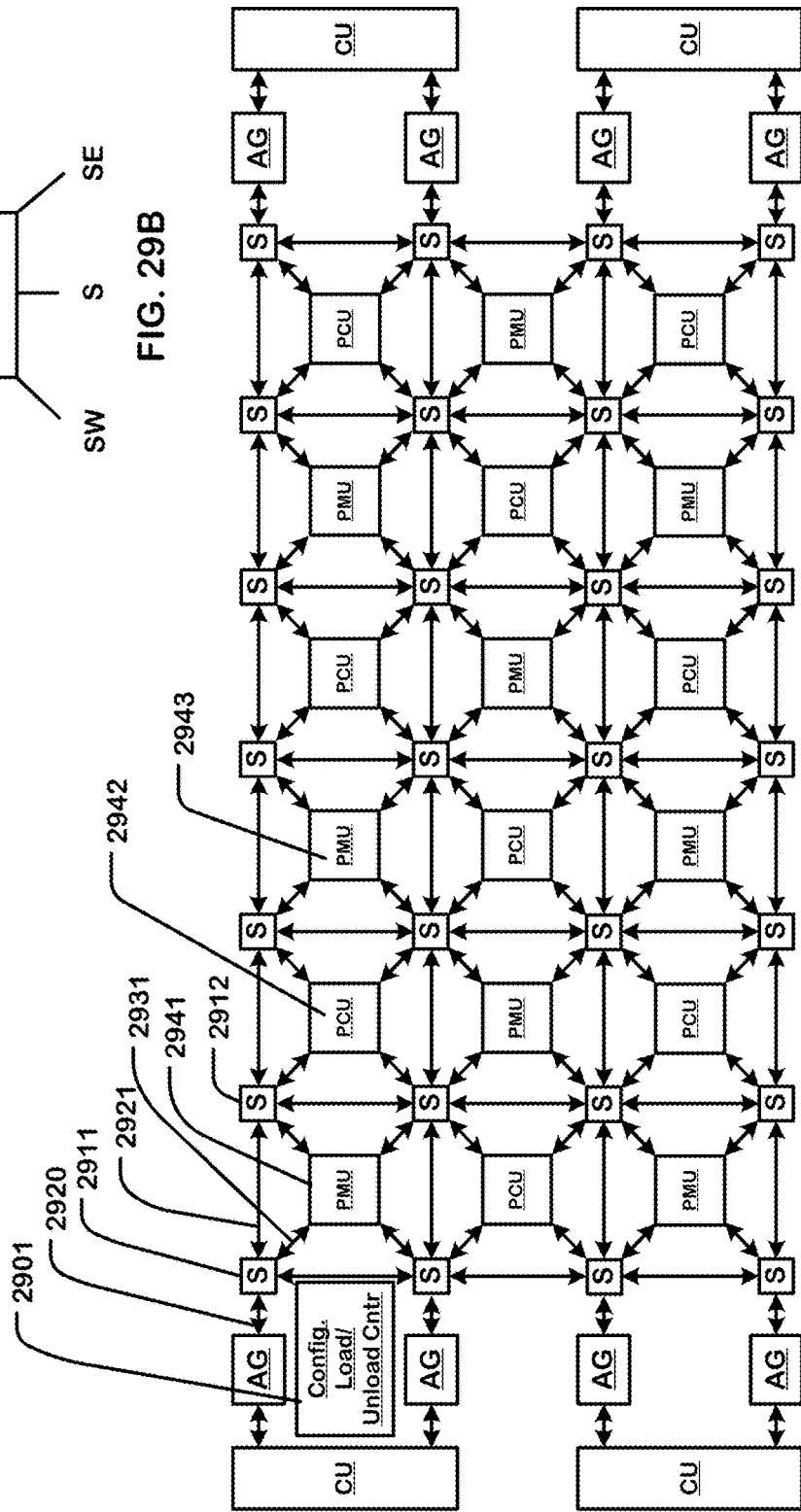
FIG. 29 is a simplified diagram of a tile and an array level network usable in the configuration of FIG. 27, where configurable units are nodes on the array level network and are configurable to implement a Look-Up Table with input offsetting.
FIG. 29B illustrates an example switch unit connecting elements in an array level network.

FIG. 29 is a simplified diagram of a tile and an array level network usable in the configuration of FIG. 28, where the configurable units in the array are nodes on the array level network and are configurable to implement the virtualization logic 2797.

In this example, the array of configurable units 2900 includes a plurality of types of configurable units, which are configured with the virtualization logic 2797. The types of configurable units in this example, include Pattern Compute Units (PCUs), Pattern Memory Units (PMUs), Switch units (S), and Address Generation and Coalescing Units (each including two address generators AG and a shared CU). For an example of the functions of these types of configurable units, see, Prabhakar et al., "Plasticine: A Reconfigurable Architecture For Parallel Patterns," ISCA '17, Jun. 24-28, 2017, Toronto, ON, Canada, which is incorporated by reference as if fully set forth herein. In this example, the PCUs (e.g., 2942) and PMUs (e.g., 2943) in the array of configurable units 2900 can include resources configurable for embodiment of a computation unit, an example configuration of which is described herein. Each of these configurable units contains a configuration store comprising a set of registers or flip-flops that represent either the setup or the sequence to run a program, and can include the number of nested loops, the limits of each loop iterator, the routes and/or instructions to be executed for each stage including stages, the source of the operands, and the network parameters for the input and output interfaces. The configuration file can include entries of Look-Up Tables as described herein.

Additionally, each of these configurable units contains a configuration store comprising a set of registers or flip-flops that store status usable to track progress in nested loops or otherwise. A configuration file in the configuration store contains a bit-stream representing the initial configuration, or starting state, of each of the components that execute the program. This bit-stream is referred to as a bit file. Program load is the process of setting up the configuration stores in the array of configurable units based on the contents of the bit file to allow the components to execute a program (i.e., a machine), including programs that utilize the virtualization logic 2797. Program Load may also require the load of all PMU memories.

The array level network includes links interconnecting configurable units in the array. The links in the array level network include one or more and, in this case, three kinds of physical buses: a chunk-level vector bus (e.g., one hundred and twenty-eight bits of data), a word-level scalar bus (e.g., thirty-two bits of data), and a multiple bit-level control bus. For instance, interconnect 2921 between switch units 2911 and 2912 includes a vector bus interconnect with a vector bus width of one hundred and twenty-eight bits, a scalar bus interconnect with a scalar bus width of thirty-two bits, and a control bus interconnect.

The three kinds of physical buses differ in the granularity of data being transferred. In one embodiment, the vector bus can carry a chunk that includes sixteen-bytes (=one hundred and twenty-eight bits) of data as its payload. The scalar bus can have a thirty-two-bit payload and carry scalar operands or control information. In some machines implemented using this system, data can be represented using floating point data formats, including standard or non-standard formats. Example formats include FP32 and BF16, among others. It can be understood that the number of data values carried on the scalar and vector buses is a function of the encoding format of the data values, with FP32 utilizing thirty-two bits per value and BF16 using sixteen bits per value.

The control bus can carry control handshakes such as tokens and other lines. The vector and scalar buses can be packet switched, including headers that indicate a destination of each packet and other information such as sequence numbers that can be used to reassemble a file when the packets are received out of order. Each packet header can contain a destination identifier that identifies the geographical coordinates of the destination switch unit (e.g., the row and column in the array), and an interface identifier that identifies the interface on the destination switch (e.g., North, South, East, West, etc.) used to reach the destination unit. The control network can be circuit switched based on timing circuits in the device, for example. The configuration load/unload controller can generate a header for each chunk of configuration data (e.g., bit stream) of one hundred and twenty-eight bits. The header is transmitted on a header bus to each configurable unit in the array of configurable unit.

In one example, a chunk of data of one hundred and twenty-eight bits is transmitted on the vector bus that provides the chunk as vector inputs to a configurable unit. The vector bus can include one hundred and twenty-eight payload lines, and a set of header lines. The header can include a sequence ID for each chunk, which can include:

A bit to indicate if the chunk is scratchpad memory or configuration store data.
Bits that form a chunk number.
Bits that indicate a column identifier.
Bits that indicate a row identifier.
Bits that indicate a component identifier.

For a load operation, the configuration load controller can send the number N of chunks to a configurable unit in order from N−1 to 0. If, for example, N=6, the chunks are sent out in most-significant-bit-first order of Chunk 5→Chunk 4→Chunk 3→Chunk 2→Chunk 1→Chunk 0. (Note that this most-significant-bit-first order results in Chunk 5 being distributed in round 0 of the distribution sequence from the array configuration load controller.) For an unload operation, the configuration unload controller can write the unload data out of order to the memory. For both load and unload operations, the shifting in the configuration serial chains in a configuration data (e.g., bit stream) store in a configurable unit is from LSB (Least-Significant-Bit) to MSB (Most-Significant-Bit), or MSB out first.

FIG. 29B illustrates an example switch unit connecting elements in an array level network. As shown in the example of FIG. 29B, a switch unit can have eight interfaces. The North, South, East and West interfaces of a switch unit are used for connections between switch units. The Northeast, Southeast, Northwest and Southwest interfaces of a switch unit are each used to make connections to PCU or PMU instances. A set of two switch units in each tile quadrant have connections to an Address Generation and Coalescing Unit (AGCU) that include multiple Address Generation (AG) units and a Coalescing Unit (CU) connected to the multiple address generation units. The Coalescing Unit (CU) arbitrates between the AGs and processes memory requests. Each of the eight interfaces of a switch unit can include a vector interface, a scalar interface, and a control interface to communicate with the vector network, the scalar network, and the control network.

During execution of a machine after configuration, data can be sent via one or more unit switches and one or more links between the unit switches to the configurable units using the vector bus and vector interface(s) of the one or more switch units on the array level network.

In embodiments described herein, a configuration file or bit file, before configuration of the tile, can be sent from the configuration load controller using the same vector bus, via one or more unit switches and one or more links between the unit switches to the configurable unit using the vector bus and vector interface(s) of the one or more switch units on the array level network. For instance, a chunk of configuration data (e.g., bit stream) in a unit file particular to a configurable unit PMU 2941 can be sent from the configuration load/unload controller 2901 to the PMU 2941, via a link 2920 between the configuration load/unload controller 2901 and the West (W) vector interface of the switch unit 2911, the switch unit 2911, and a link 2931 between the Southeast (SE) vector interface of the switch unit 2911 and the PMU 2941.

In this example, one of the AGCUs is configured to be a master AGCU, which includes a configuration load/unload controller (e.g., 2901). The master AGCU implements a register through which the host (2720, FIG. 27) can send commands via the bus system to the master AGCU. The master AGCU controls operations on an array of configurable units in a tile and implements a program control state machine to track the state of the tile based on the commands it receives from the host through writes to the register. For every state transition, the master AGCU issues commands to all components on the tile over a daisy-chained command bus (FIG. 30). The commands include a program reset command to reset configurable units in an array of configurable units in a tile, and a program load command to load a configuration file to the configurable units.

The configuration load controller in the master AGCU is responsible for reading the configuration file from the memory and sending the configuration data (e.g., bit stream) to every configurable unit of the tile. The master AGCU can read the configuration file from the memory at preferably the maximum throughput of the top-level network. The data read from memory are transmitted by the master AGCU over the vector interface on the array level network to the corresponding configurable unit according to a distribution sequence described herein.

In one embodiment, in a way that can reduce the wiring requirements within a configurable unit, configuration and status registers holding unit files to be loaded in a configuration load process, or unloaded in a configuration unload process, in a component are connected in a serial chain and can be loaded through a process of shifting bits through the serial chain. In some embodiments, there may be more than one serial chain arranged in parallel or in series. When a configurable unit receives, for example, one hundred and twenty-eight bits of configuration data (e.g., bit stream) from the master AGCU in one bus cycle, the configurable unit shifts this data through its serial chain at the rate of one bit per cycle, where shifter cycles can run at the same rate as the bus cycle. It will take one hundred and twenty-eight shifter cycles for a configurable unit to load one hundred and twenty-eight configuration bits with the one hundred and twenty-eight bits of data received over the vector interface. The one hundred and twenty-eight bits of configuration data (e.g., bit stream) are referred to as a chunk. A configurable unit can require multiple chunks of data to load all its configuration bits.

The configurable units interface with the memory through multiple memory interfaces (2750, FIG. 27). Each of the memory interfaces can be accessed using several AGCUs. Each AGCU contains a reconfigurable scalar data path to generate requests for the off-chip memory. Each AGCU contains FIFOs (First-In, First-Out buffers for organizing data) to buffer outgoing commands, data, and incoming responses from the off-chip memory.

FIG. 30 is a block diagram illustrating an example configurable unit 3000, such as a Pattern Compute Unit (PCU), which is configured with the virtualization logic 2797. A configurable unit can interface with the scalar, vector, and control buses, in this example using three corresponding sets of inputs and outputs (IO): scalar inputs/outputs, vector inputs/outputs, and control inputs/outputs. Scalar IOs can be used to communicate single words of data (e.g., thirty-two bits). Vector IOs can be used to communicate chunks of data (e.g., one hundred and twenty-eight bits), in cases such as receiving configuration data (e.g., bit stream) in a unit configuration load process and transmitting and receiving data during operation after configuration across a long pipeline between multiple PCUs. Control IOs can be used to communicate signals on control lines such as the start or end of execution of a configurable unit. Control inputs are received by control block 3090, and control outputs are provided by the control block 3090.

Each vector input is buffered in this example using a vector FIFO in a vector FIFO block 3060 which can include one or more vector FIFOs. Likewise, in this example, each scalar input is buffered using a scalar FIFO 3070. Using input FIFOs decouples timing between data producers and consumers and simplifies inter-configurable-unit control logic by making it robust to input delay mismatches.

A configurable unit includes multiple reconfigurable data paths in block 3080. A data path in a configurable unit can be organized as a multi-stage (Stage 1 . . . Stage N), reconfigurable SIMD (Single Instruction, Multiple Data) pipeline. The chunks of data pushed into the configuration serial chain in a configurable unit include configuration data (e.g., bit stream) for each stage of each data path in the configurable unit. The configuration serial chain in the configuration data (e.g., bit stream) store 3020 is connected to the multiple data paths in block 3080 via lines 3021.

A configurable data path organized as a multi-stage pipeline can include multiple functional units (e.g., 3081, 3082, 3083, 3084, 3085, 3086) at respective stages. A computation unit or parts of a computation unit can be implemented in multiple functional units at respective stages in a multi-stage pipeline or in multiple multi-stage pipelines. A circuit including the virtualization logic 2797 can be implemented in multiple functional units and multiple memory units. Input registers in functional units can register inputs from scalar FIFOs 3070 or Vector FIFOs 3060 or from previous stages in a multi-stage pipeline. A functional unit at a stage in a multi-stage pipeline can execute a function, e.g., logical shift, an arithmetic function, comparison, a logical operation, etc., and generate an output.

Configurable units in the array of configurable units include configuration data (e.g., bit stream) stores 3020 (e.g., serial chains) to store unit files comprising a plurality of chunks (or sub-files of other sizes) of configuration data (e.g., bit stream) particular to the corresponding configurable units. Configurable units in the array of configurable units each include unit configuration load logic 3040 connected to the configuration data (e.g., bit stream) store 3020 via line 3022, to execute a unit configuration load process. The unit configuration load process includes receiving, via the bus system (e.g., the vector inputs), chunks of a unit file particular to the configurable unit and loading the received chunks into the configuration data (e.g., bit stream) store 3020 of the configurable unit. The unit file loaded into the configuration data (e.g., bit stream) store 3020 can include configuration data (e.g., bit stream), including opcodes and routing configuration, for circuits (e.g., module) implementing the virtualization logic 2797 in multiple functional units and multiple memory units, as described herein.

The configuration data (e.g., bit stream) stores in configurable units in the plurality of configurable units in this example comprise serial chains of latches, where the latches store bits that control configuration of the resources in the configurable unit. A serial chain in a configuration data (e.g., bit stream) store can include a shift register chain for configuration data (e.g., bit stream) and a second shift register chain for state information and counter values connected in series.

Input configuration data (e.g., bit stream) 3010 can be provided to a vector FIFO as vector inputs, and then be transferred to the configuration data (e.g., bit stream) store 3020. Output configuration data (e.g., bit stream) 3030 can be unloaded from the configuration data (e.g., bit stream) store 3020 using the vector outputs.

The CGRA uses a daisy-chained completion bus to indicate when a load/unload command has been completed. The master AGCU transmits the program load and unload commands to configurable units in the array of configurable units over a daisy-chained command bus. As shown in the example of FIG. 30, a control block 3090, a daisy-chained completion bus 3091 and a daisy-chained command bus 3092 are connected to daisy-chain logic 3093, which communicates with the unit configuration load logic 3040. The daisy-chain logic 3093 can include load complete status logic, as described below. The daisy-chained completion bus is further described below. Other topologies for the command and completion buses are clearly possible but not described here.

FIG. 31 is a block diagram illustrating an example configurable unit 3100, such as a Pattern Memory Unit (PMU), which is configured with the virtualization logic 2797 (i.e., ready-to-read credit counters, write credit counters, and flow control logic for operating them). A PMU can contain scratchpad memory 3130 coupled with a reconfigurable scalar data path 3120 intended for address calculation (RA, WA) and control (WE, RE) of the scratchpad memory 3130, along with the bus interfaces used in the PCU.

The bus interfaces can include scalar inputs, vector inputs, scalar outputs and vector outputs, usable to provide write data WD. The data path can be organized as a multi-stage reconfigurable pipeline, including stages of functional units FUs and associated pipeline registers PRs that register inputs and outputs of the functional units. PMUs can be used to store distributed on-chip memory throughout the array of reconfigurable units.

A scratchpad is built with multiple SRAM banks (e.g., 3131, 3132, 3133, 3134). Banking and buffering logic 3135 for the SRAM banks in the scratchpad can be configured to operate in several banking modes to support various access patterns. A computation unit as described herein can include a Look-Up Table stored in the scratchpad memory 3130, from a configuration file or from other sources. In a computation unit as described herein, the scalar data path 3120 can translate a section of a raw input value I for addressing Look-Up Tables implementing a function f(I), into the addressing format utilized by the SRAM scratchpad memory 3130, adding appropriate offsets and so on, to read the entries of the Look-Up Table stored in the scratchpad memory 3130 using the sections of the input value I. Each PMU can include write address calculation logic and read address calculation logic that provide write address WA, write enable WE, read address RA and read enable RE to the banking buffering logic 3135. Based on the state of the local FIFOs 3111 and 3112 and external control inputs, the control block 3115 can be configured to trigger the write address computation, read address computation, or both, by enabling the appropriate counters 3116. A programmable counter chain 3116 (Control Inputs, Control Outputs) and control block 3115 can trigger PMU execution.

This is one simplified example of a configuration of a configurable processor for implementing a computation unit as described herein. The configurable processor can be configured in other ways to implement a computation unit. Other types of configurable processors can implement the computation unit in other ways. Also, the computation unit can be implemented using dedicated logic in some examples, or a combination of dedicated logic and instruction-controlled processors.

Other Implementations

In various implementations of the technology disclosed, when two or more reconfigurable processors collaboratively execute an application, the two or more reconfigurable processors are independently and separately configured (e.g., by the runtime processor) with a same set of configuration files. In one implementation, when a first reconfigurable processor, configured with a given set of configuration files, begins executing configuration files in the given set of configuration files and/or functions therefor and/or data therefor, and requires a second reconfigurable processor, also configured with the given set of configuration files, to execute certain configuration files in the given set of configuration files and/or functions therefor and/or data therefor, then the second reconfigurable processor waits for a signal from the first reconfigurable processor. Examples of the signal include a control signal that indicates a breakpoint/checkpoint after a quiesce condition, such as the one described in U.S. Non-provisional patent application Ser. No. 16/504,627, filed Jul. 8, 2019, entitled, "QUIESCE RECONFIGURABLE DATA PROCESSOR,".

Then, after receiving the signal and corresponding application data and tensor state from the first reconfigurable processor, the second reconfigurable processor begins execution of the certain configuration files and/or functions therefor and/or data therefor using its own copy of the given set of configuration files with which it is independently and separately configured. In some implementations, a checkpoint is generated at the first reconfigurable processor, the checkpoint is transferred to the second reconfigurable processor, and the second reconfigurable processor loads the checkpoint and begins execution of the certain configuration files and/or functions therefor and/or data therefor.

A first example of accelerated deep learning is using a deep learning accelerator to train a neural network. A second example of accelerated deep learning is using a deep learning accelerator to operate a trained neural network to perform inferences. A third example of accelerated deep learning is using a deep learning accelerator to train a neural network and subsequently perform inference with any one or more of the trained neural network, information from same, and a variant of same.

Examples of neural networks include Fully Connected Neural Networks (FCNNs), Recurrent Neural Networks (RNNs), Convolutional Neural Networks (CNNs), Long Short-Term Memory (LSTM) networks, autoencoders, deep belief networks, and Generative Adversarial Networks (GANs).

An example of training a neural network is determining one or more weights associated with the neural network, such as by hardware acceleration via a deep learning accelerator. An example of making an inference is using a trained neural network to compute results by processing input data based on weights associated with the trained neural network. As used herein, the term 'weight' is an example of a 'parameter' as used in various forms of neural network processing. For example, some neural network learning is directed to determining parameters that are then usable for performing neural network inferences using the parameters.

A neural network processes data according to a dataflow graph comprising layers of neurons. Stimuli (e.g., input data) are received by an input layer of neurons and the computed results of the dataflow graph (e.g., output data) are provided by an output layer of neurons. Example layers of neurons include input layers, output layers, rectified linear unit layers, fully connected layers, recurrent layers, long short-term memory layers, convolutional layers, kernel layers, dropout layers, and pooling layers. A neural network is conditionally and/or selectively trained, subject to hardware acceleration. After being trained, a neural network is conditionally and/or selectively used for inference, subject to hardware acceleration.

An example of a deep learning accelerator is one or more relatively specialized hardware elements operating in conjunction with one or more software elements to train a neural network and/or perform inference with a neural network relatively more efficiently than using relatively less specialized hardware elements. Some implementations of the relatively specialized hardware elements include one or more hardware logic circuitry elements such as transistors, resistors, inductors, capacitors, wire interconnects, combinatorial logic (e.g., NAND, NOR) gates, latches, register files, memory arrays, tags for memory arrays, content-addressable memories, flash, ROM, DRAM, SRAM, Serializer/Deserializer (SerDes), I/O drivers, and the like, such as implemented via custom logic, synthesized logic, ASICs, and/or FPGAs. Some of the relatively less specialized hardware elements include conventional CPUs and conventional GPUs.

An example of storage is one or more elements enabled to retain state information, e.g., any one or more of: a flip-flop, a latch or an array of latches, a register or an array of registers, a register file, a memory, a memory array, a magnetic storage device, an optical storage device, SRAM, DRAM, flash, and ROM. In various embodiments storage is volatile (e.g., SRAM or DRAM) and/or non-volatile (e.g., flash or ROM).

An example of an Integrated Circuit (IC) is a collection of circuitry implemented on one or more portions of semiconductor material, such as a single die or a plurality of dice. An example of 3D-stacking of dice is providing mechanical connectivity and/or electrical connectivity between the dice, e.g., in a dimension orthogonal to a major surface of the dice, to form a unit. The mechanical connectivity and/or the electrical connectivity are variously implemented, e.g., via one or more of solder balls, microbumps, and through-silicon vias. An example of 2.5D stacking of dice is providing mechanical connectivity and/or electrical connectivity between the dice via a common element (e.g., a silicon interposer) to form a unit, wherein the mechanical connectivity and/or electrical connectivity between each die and the common substrate is in a dimension orthogonal to a major surface of the die. The mechanical connectivity and/or the electrical connectivity are variously implemented, e.g., via one or more of solder balls, microbumps, and through-silicon vias. An example of an Application-Specific Integrated Circuit (ASIC) is an IC designed for a particular use.

An example of a package is an element enabled to mechanically retain and/or contain one or more electronic circuits and/or to electrically interconnect one or more electronic circuits. Example electronic circuits are any one or more of one or more portions of semiconductor material, one or more dice, one or more interposers, and one or more substrates. Particular examples of packages include a BGA package and variants thereof. Some ICs comprise a package. An example of a substrate is an element to mechanically retain and/or electrically interconnect one or more dice and/or one or more packages. A particular example of a substrate is a PCB to, e.g., retain and interconnect packages. Another particular example of a substrate is a silicon interposer to, e.g., couple one or more 3D-stacked or 2.5-stacked dice. Another particular example of a substrate is a package, e.g., retaining a plurality of dice.

A SmartNIC is a network interface card, or network adapter that operates directly on data packets independent of host kernel resources and running an operating system networking stack resulting in less contention for the host processing resources, less network latency, and increases in network data packet throughput. The SmartNIC accomplishes this by offloading network stack processing tasks from the system host CPU, acting as a coprocessor of sorts.

In the present context, a SmartNIC is a NIC equipped with a fully programmable hardware implementation, supporting an operating system configured for network processing tasks. The hardware implementation may comprise System-on-Chip (SoC), FPGAs, ASICs, CGRAs, or other programmable processor circuits such as the ARM family. A SmartNIC may support sets of specialized hardware functionalities accelerates a specific class of functions (e.g., Open vSwitch data-plane) or to perform generic packet and flow-filtering, packet inspection, flow table processing, encryption, RDMA, VXLAN overlays and NVMe-oF functionality.

A SmartNIC includes a host kernel-bypass logic for sending and receiving packets to/from nodes and additional hosts. The SmartNIC may accomplish this by providing a set of physical addresses comprising a shared memory for inputs and outputs. In one aspect, the reprogrammable processor may directly access sets of SmartNIC FIFO buffers using a combination of head and tail pointers as described supra to push and pull data, thus bypassing the host kernel and reducing at least one hop. A host may also interface directly to the SmartNIC by writing to a physical address without requiring drivers to control the network flow, further increasing theoretical throughput.

In one aspect, the SmartNIC may provide a configuration interface to specify the physical addresses of a plurality of I/O shared memory buffers comprising FIFO queues and mapping tables for memory regions containing packet buffers. In an additional aspect, the SmartNIC may couple nodes, reprogrammable processors (RPs) and hosts to retrieve packet buffers from shared memory buffers and to transmit packet buffers from host, node, or RP DRAM to the SmartNIC shared memory buffers over a network.

The network fabric is an interface to a plurality of nodes and hosts. The SmartNIC provides connectivity between either a host and the network or between a node and the network. A node comprises a plurality of reprogrammable processors (RPs) and bypasses the host when interfacing to the SmartNIC. A SmartNIC may connect to a first physical/link connection over the network, coupling the SmartNIC with a host, node, or RP. The SmartNIC connects to a second physical/link connection, coupling the SmartNIC to the network. The physical/link connections to the network fabric interface may each be of any type, for instance, Ethernet, Fibre Channel, InfiniBand, PCIe, etc. A physical/link connection may also be a wireless medium. A SmartNIC includes Media Access Controllers (MACs) to interface with the physical/link connections to route data packets to the RPs and hosts.

An example SmartNIC may use an FPGA to implement the communications protocols, e.g., Transport Control Protocol ("TCP"), used to perform internet routing and may comprise PCIe high-speed network interfaces, shared physical memory and an FPGA. The FPGA may implement the SmartNIC controller as the bridge between a host, node, RP, and the network at the "physical layer" to integrate directly into the data path. The SmartNIC may further implement the Open System Interconnection ("OSI") model, which is a conceptual model that characterizes and standardizes the internal functions of a communication system by partitioning it into abstraction layers. A physical abstraction layer defines electrical and physical specifications between a device and a transmission medium, such as a copper or fiber optical cable. This includes the layout of pins, voltages, line impedance, cable specifications, signal timing, hubs, repeaters, network adapters, host bus adapters and more. The major functions and services performed by the physical layer include: (1) establishment and termination of a connection to a communications medium; (2) contention resolution; (3) flow control; and (4) modulation to convert digital data in user equipment to the corresponding signals transmitted over a communications channel. These are the signals operating over the physical cabling (such as copper and optical fiber) or over a radio link.

The network flows can be Transmission Control Protocol/Internet Protocol (TCP/IP) flows, for example. The SmartNICs may exchange network packets with the nodes or hosts via a network/fabric comprising media/physical links and can exchange network packets with their respective nodes or hosts via host-facing media/physical links to the host NICs. Network flows used by applications to exchange data may pass through the SmartNIC as follows. A host-based application may have application-layer data to convey, for instance, a remote call invocation. The host remote call invocation may comprise a command or data for passing through an operating system Application Programming Interface (API) (e.g., a stream or socket) as a write to a physical address on the SmartNIC where it enters the network stack, The API writes the command or data into the physical address of the shared memory FIFO and placed in one or more transport packets (e.g., TCP/IP packets). Next, encapsulation of transport packets to network packets (e.g., TCP/IP packets with the host's Internet Protocol (IP) address as the sender). and then loaded into one or more payloads of physical layer frames (e.g., Ethernet frames). The frames then pass through to the first physical/link connection of the network fabric. On a second SmartNIC, the above process is reversed where the network packets require decapsulation and data eventually arrives at a physical address for the host, node, or RP.

The applications execute on the reconfigurable processors in a distributed fashion by programming the individual compute and memory components and may asynchronously receive, process, and send data and control information. In the reconfigurable processors, computation may execute as deep, nested dataflow pipelines that exploit nested parallelism and data locality efficiently. These dataflow pipelines contain several stages of computation, where each stage reads data from one or more input buffers with an irregular memory access pattern, performs computations on the data while using one or more internal buffers to store and retrieve intermediate results, and produces outputs that are written to one or more output buffers. The structure of these pipelines depends on the control and dataflow graph representing the application. Pipelines may arbitrarily nest and loop within each other.

The applications/graphs/application graphs/user applications/dataflow graphs/control flow graphs/data and control flow graphs/models/deep learning applications/deep neural networks/programs/program images/jobs/tasks comprise high-level programs. A high-level program is source code written in programming languages like C, C++, Java, JavaScript, Python, and Spatial, for example, using deep learning frameworks like PyTorch, TensorFlow, ONNX, Caffe, and Keras. The high-level program can implement computing structures and algorithms of machine learning models like AlexNet, VGGNet, GoogLeNet, ResNet, ResNeXt, RCNN, YOLO, SqueezeNet, SegNet, GAN, BERT, ELMo, USE, Transformer, and Transformer-XL. In one example, the high-level program can implement a convolutional neural network with several processing layers, such that each processing layer can include one or more nested loops. The high-level program can execute irregular memory operations that involve accessing inputs and weights and performing matrix multiplications between the inputs and the weights. The high-level program can include nested loops with high iteration count and loop bodies that load and multiply input values from a preceding processing layer with weights of a succeeding processing layer to produce an output for the succeeding processing layer. The high-level program can have loop-level parallelism of the outermost loop body, which can be exploited using coarse-grained pipelining. The high-level program can have instruction-level parallelism of the innermost loop body, which can be exploited using loop unrolling, SIMD vectorization, and pipelining.

Regarding loops in the high-level programs of the applications, loops directly nested in a loop body are termed the child loops of the outer parent loop. A loop is called an innermost loop if it does not have any children, i.e., there are no nested loops within its body. A loop is an outermost loop if it does not have a parent, i.e., it is not nested within another loop's body. An imperfectly nested loop has a body with a mix of non-looping statements (e.g., primitive arithmetic, logical, and relational operations) and one or more child loops. Parallelism in the imperfectly nested loops can be exploited at any or all loop levels, and in the operations that comprise loop bodies. Parallelism can occur in multiple forms such as fine-grained and coarse-grained pipeline parallelism, data parallelism, and task parallelism.

In some implementations, a Software Development Kit (SDK) (or dataflow graph generator) generates dataflow graphs of the high-level programs of the applications. The SDK transforms the input behavioral description of the high-level programs into an intermediate representation such as the dataflow graphs. This may include code optimization steps like false data dependency elimination, dead-code elimination, and constant folding. The dataflow graphs encode the data and control dependencies of the high-level programs.

The dataflow graphs comprise nodes and edges. The nodes can represent compute operations and memory allocations. The edges can represent dataflow and control flow. In some implementations, each loop in the high-level programs can be represented as a controller in the dataflow graphs. The dataflow graphs support branches, loops, function calls, and other variations of control dependencies. In some implementations, after the dataflow graphs are generated, additional analyses or optimizations focused on loop transformations can be performed, such as loop unrolling, loop pipelining, loop fission/fusion, and loop tiling.

The SDK also supports programming the reconfigurable processors in the pool of reconfigurable dataflow resources at multiple levels, for example, from the high-level deep learning frameworks to C++ and assembly language. In some implementations, the SDK allows programmers to develop code that runs directly on the reconfigurable processors. In other implementations, the SDK provides libraries that contain pre-defined functions like linear algebra operations, element-wise tensor operations, non-linearities, and reductions required for creating, executing, and profiling the dataflow graphs on the reconfigurable processors. The SDK communicates with the deep learning frameworks via Application Programming Interfaces (APIs).

The nodes in a dataflow graph represent operation units may configure to be producers to produce tensors for execution of an application, and to be consumers to consume the tensors for execution of the application. The producers and consumers asynchronously transmit data along data connections. A tensor includes one or more vectors.

A "compiler" transforms the dataflow graphs into a hardware-specific configuration, and specifies in an execution file generated by the compiler 114. In one implementation, the compiler partitions the dataflow graphs into memory allocations and execution fragments, where these partitions are specified in the execution file. Execution fragments represent operations on data. An execution fragment can comprise portions of a program representing an amount of work. An execution fragment can comprise computations encompassed by a set of loops, a set of graph nodes, or some other unit of work that requires synchronization. An execution fragment can comprise a fixed or variable amount of work, as needed by the program. Different ones of the execution fragments can contain different amounts of computation. Execution fragments can represent parallel patterns or portions of parallel patterns and are executable asynchronously.

In some implementations, the partitioning of the dataflow graphs into the execution fragments includes treating calculations within at least one innermost loop of a nested loop of the dataflow graphs as a separate execution fragment. In other implementations, the partitioning of the dataflow graphs into the execution fragments includes treating calculations of an outer loop around the innermost loop of the dataflow graphs as a separate execution fragment. In the case of imperfectly nested loops, operations within a loop body up to the beginning of a nested loop within that loop body are grouped together as a separate execution fragment.

Memory allocations represent the creation of logical memory spaces in on-chip and/or off-chip memories for data required to implement the dataflow graphs, and these memory allocations are specified in the execution file. Memory allocations define the type and the number of hardware resources (functional units, storage, or connectivity components). Main memory (e.g., DRAM) is off-chip memory for providing memory allocations. Scratchpad memory (e.g., SRAM) is on-chip memory for providing memory allocations. Other memory types for which the memory allocations can be made for various access patterns and layouts include read-only Look-Up Tables (LUTs), fixed size queues (e.g., FIFOs), and register files.

The compiler binds memory allocations to virtual memory units and binds execution fragments to virtual compute units, and these bindings are specified in the execution file. In some implementations, the compiler partitions execution fragments into memory fragments and compute fragments, and these partitions are specified in the execution file. A memory fragment comprises address calculations leading up to a memory access. A compute fragment comprises all other operations in the parent execution fragment. In one implementation, each execution fragment is broken up into a plurality of memory fragments and exactly one compute fragment. In one implementation, the compiler performs the partitioning using reverse dataflow analysis such that inputs to an address used in a memory access recursively flag until the compiler reaches either constant values or (bound) loop/pattern iterators. A single execution fragment can produce one or more memory fragments, depending on how many memory accesses exist in the original loop body. In cases where the same memory addressing logic is shared across multiple memory accesses, address calculation may be duplicated to create multiple memory fragments from the same execution fragment.

The memory fragments of the execution fragments are configured to index into data structures. At least one of the memory fragments indexes into a data structure in the logical memory spaces of one of the memory allocations. Each compute and memory fragment preserves information about all loops whose loop bodies directly contain the operations in the corresponding execution fragment. In one implementation, this corresponds to replicating the calculation of the loop iterators of each loop into each compute and memory fragment. This replication allows each fragment to preserve the same iterative behavior as the original program, while also allowing distributed calculation of loop iterators.

The compiler translates the applications developed with commonly used open-source packages such as Keras and PyTorch into reconfigurable processor specifications. The compiler generates the configuration files with configuration data (e.g., bit stream) for the placed positions and the routed data and control networks. In one implementation, this includes assigning coordinates and communication resources of the physical memory and compute units by placing and routing units onto the array of the processor while maximizing bandwidth and minimizing latency.

Clauses

A technology is described which uses buffers to efficiently stream data between processors on a same processing node and on different processing nodes, which can be particularly applied to processors such as Central Processing Unit (CPUs), Graphics Processing Units (GPUs), Field Programmable Gate Arrays (FPGAs), Coarse-Grained Reconfigurable Architectures (CGRAs), Application-Specific Integrated Circuits (ASICs), Application Specific Instruction-set Processor (ASIP), and Digital Signal Processors (DSPs). The technology disclosed implements efficient distributed computing by allowing accelerators (e.g., reconfigurable processors) attached to separate hosts to directly communicate with each other via buffers.

The technology disclosed can be practiced as a system, method, or article of manufacture. One or more features of an implementation can be combined with the base implementation. Implementations that are not mutually exclusive are taught to be combinable. One or more features of an implementation can be combined with other implementations. This disclosure periodically reminds the user of these options. Omission from some implementations of recitations that repeat these options should not be taken as limiting the combinations taught in the preceding sections—these recitations are hereby incorporated forward by reference into each of the following implementations.

One or more implementations and clauses of the technology disclosed or elements thereof can be implemented in the form of a computer product, including a non-transitory computer readable storage medium with computer usable program code for performing the method steps indicated. Furthermore, one or more implementations and clauses of the technology disclosed or elements thereof can be implemented in the form of an apparatus including a memory and at least one processor that is coupled to the memory and operative to perform exemplary method steps. Yet further, in another aspect, one or more implementations and clauses of the technology disclosed or elements thereof can be implemented in the form of means for carrying out one or more of the method steps described herein; the means can include (i) hardware module(s), (ii) software module(s) executing on one or more hardware processors, or (iii) a combination of hardware and software modules; any of (i)-(iii) implement the specific techniques set forth herein, and the software modules are stored in a computer readable storage medium (or multiple such media).

The clauses described in this section can be combined as features. In the interest of conciseness, the combinations of features are not individually enumerated and are not repeated with each base set of features. The reader will understand how features identified in the clauses described in this section can readily be combined with sets of base features identified as implementations in other sections of this application. These clauses are not meant to be mutually exclusive, exhaustive, or restrictive; and the technology disclosed is not limited to these clauses but rather encompasses all possible combinations, modifications, and variations within the scope of the claimed technology and its equivalents.

Other implementations of the clauses described in this section can include a non-transitory computer readable storage medium storing instructions executable by a processor to perform any of the clauses described in this section. Yet another implementation of the clauses described in this section can include a system including memory and one or more processors operable to execute instructions, stored in the memory, to perform any of the clauses described in this section.

We disclose the following clauses:

Clause Set 1

1. A data processing system, comprising:
a plurality of reconfigurable processors, reconfigurable processors in the plurality of reconfigurable processors having reconfigurable processor memory;
a plurality of host processors, a host processor in the plurality of host processors operatively coupled to the reconfigurable processors and having host memory;
a plurality of buffers, buffers in the plurality of buffers including reconfigurable processors-to-host processor buffers configured to receive data from the reconfigurable processors and provide the data to the host processor, and host processor-to-reconfigurable processors buffers configured to receive data from the host processor and provide the data to the reconfigurable processors;
runtime logic, running on the host processor, configured to load and execute one or more configuration files for applications on the reconfigurable processors;
the reconfigurable processors configured to process the configuration files and data (e.g., weights, coefficients, vectors, tensors (image data, audio data, natural language processing (NLP data), control data (e.g., control tokens)) for the applications and generate outputs, and to send the outputs to the host processor using at least one of the reconfigurable processors-to-host processor buffers; and
debugging logic, running on the host processor, configured to detect errors.

2. The data processing system of clause 1, wherein the debugging logic is further configured to report the errors to a debugging console on the host processor based on comparison of the outputs to expected outputs.

3. The data processing system of any of clauses 1-2, wherein the debugging logic is further configured to report the errors to a debug output file on the host processor based on the comparison.

4. The data processing system of any of clauses 1-3, wherein the buffers are accessible to the reconfigurable processors and the host processor.

5. The data processing system of any of clauses 1-4, wherein the buffers are in the reconfigurable processor memory, and the reconfigurable processor memory is accessible to the host processor.

6. The data processing system of any of clauses 1-5, wherein the buffers are in the host memory, and the host memory is accessible to the reconfigurable processors and the host processor.

7. The data processing system of any of clauses 1-6, wherein the buffers are in a Network Interface Controller (NIC) that is accessible to the reconfigurable processors and the host processor.

8. The data processing system of any of clauses 1-7, wherein the buffers are First-In, First-Out (FIFO) buffers.

9. The data processing system of any of clauses 1-8, wherein the reconfigurable processors notify the host processor of error reporting using one or more remote procedure calls.

10. The data processing system of any of clauses 1-9, wherein the reconfigurable processors use at least one of the reconfigurable processors-to-host processor buffers to send one or more argument values to the host processor for execution of the remote procedure calls.

11. The data processing system of any of clauses 1-10, wherein the runtime logic is further configured to execute one or more test configuration files for test applications on the reconfigurable processors, wherein the reconfigurable processors are further configured to process the test configuration files data (e.g., weights, coefficients, vectors, tensors (image data, audio data, natural language processing (NLP data), control data (e.g., control tokens)) for the test applications and generate test outputs, and to send the test outputs to the host processor using at least one of the reconfigurable processors-to-host processor buffers, and wherein testing logic, running on the host processor, is configured to determine test statistics based on the test outputs, and to report the test statistics to a test output file on the host processor.

12. A data processing system, comprising:

a plurality of reconfigurable processors, reconfigurable processors in the plurality of reconfigurable processors having reconfigurable processor memory;

a plurality of host processors, a host processor in the plurality of host processors operatively coupled to the reconfigurable processors and having host memory;

a plurality of buffers, buffers in the plurality of buffers including reconfigurable processors-to-host processor buffers configured to receive data from the reconfigurable processors and provide the data to the host processor, and host processor-to-reconfigurable processors buffers configured to receive data from the host processor and provide the data to the reconfigurable processors;

runtime logic configured to load one or more configuration files for applications on the reconfigurable processors for execution, the configuration files including a plurality of functions; and the runtime logic configured to execute a first set of functions in the plurality of functions and/or data therefor (e.g., weights, coefficients, vectors, tensors (image data, audio data, natural language processing (NLP data), control data (e.g., control tokens)) on the reconfigurable processors, and a second set of functions in the plurality of functions and/or data therefor (e.g., weights, coefficients, vectors, tensors (image data, audio data, natural language processing (NLP data), control data (e.g., control tokens)) on the host processor, wherein functions in the second set of functions and/or the data therefor (e.g., weights, coefficients, vectors, tensors (image data, audio data, natural language processing (NLP data), control data (e.g., control tokens)) are transmitted to the host processor using one or more of the reconfigurable processors-to-host processor buffers, and wherein results of executing the functions and/or the data therefor (e.g., weights, coefficients, vectors, tensors (image data, audio data, natural language processing (NLP data), control data (e.g., control tokens)) on the host processor are transmitted to the reconfigurable processors using one or more of the host processor-to-reconfigurable processors buffers.

13. The data processing system of any of clauses 1-12, wherein the data on which the functions are executed is transmitted to the host processor using the one or more of the reconfigurable processors-to-host processor buffers.

14. The data processing system of any of clauses 1-13, further comprising using respective ones of the reconfigurable processors-to-host processor buffers to transmit respective functions in the second set of functions and/or data therefor (e.g., weights, coefficients, vectors, tensors (image data, audio data, natural language processing (NLP data), control data (e.g., control tokens)) to the host processor.

15. The data processing system of any of clauses 1-14, further comprising using respective ones of the host processor-to-reconfigurable processors buffers to transmit results of executing the respective functions.

16. The data processing system of any of clauses 1-15, wherein the buffers are accessible to the reconfigurable processors and the host processor.

17. The data processing system of any of clauses 1-16, wherein the buffers are in the reconfigurable processor memory, and the reconfigurable processor memory is accessible to the host processor.

18. The data processing system of any of clauses 1-17, wherein the buffers are in the host memory, and the host memory is accessible to the reconfigurable processors and the host processor.

19. The data processing system of any of clauses 1-18, wherein the buffers are in a Network Interface Controller (NIC) that is accessible to the reconfigurable processors and the host processor.

20. The data processing system of any of clauses 1-19, wherein the buffers are First-In, First-Out (FIFO) buffers.

21. A data processing system, comprising:

a plurality of reconfigurable processors including a first reconfigurable processor and additional reconfigurable processors;

a plurality of buffers, buffers in the plurality of buffers including first reconfigurable processor-to-additional reconfigurable processors buffers configured to receive data from the first reconfigurable processor and provide the data to the additional reconfigurable processors, and additional reconfigurable processors-to-first reconfigurable processor buffers configured to receive data from the additional reconfigurable processors and provide the data to the first reconfigurable processor;

runtime logic configured to load one or more configuration files for applications on the first reconfigurable processor for execution, the configuration files including a plurality of functions; and the runtime logic configured to execute a first set of functions in the plurality of functions and/or data therefor (e.g., weights, coefficients, vectors, tensors (image data, audio data, natural language processing (NLP data), control data (e.g., control tokens)) on the first reconfigurable processor, and a second set of functions in the plurality of functions and/or data therefor (e.g., weights, coefficients, vectors, tensors (image data, audio data, natural language processing (NLP data), control data (e.g., control tokens)) on the additional reconfigurable processors, wherein functions in the second set of functions and/or the data therefor (e.g., weights, coefficients, vectors, tensors (image data, audio data, natural language processing (NLP data), control data (e.g., control tokens)) are transmitted to the additional reconfigurable processors using one or more of the first reconfigurable processor-to-additional reconfigurable processors buffers, and wherein results of executing the functions and/or the data therefor (e.g., weights, coefficients, vectors, tensors (image data, audio data, natural language processing (NLP data), control data (e.g., control tokens)) on the additional reconfigurable processors are transmitted to the first reconfigurable processor using one or more of the additional reconfigurable processors-to-first reconfigurable processor buffers.

22. The data processing system of any of clauses 1-21, wherein the first reconfigurable processor and the additional reconfigurable processors are operatively coupled to a same processing node.

23. The data processing system of any of clauses 1-22, wherein the first reconfigurable processor and the additional reconfigurable processors are operatively coupled to different processing nodes.

24. A data processing system, comprising:
   a reconfigurable processor configured to execute one or more configuration files using a series of data units;
   a first plurality of buffers configured to receive data units in the series of data units from a source memory, and to stream the data units to the reconfigurable processor for processing;
   a second plurality of buffers configured to stream results of processing the data units from the reconfigurable processor, and to send the results to a destination memory for storage; and
   runtime logic configured to cause buffers in the first plurality of buffers to receive a next data unit in the series of data units from the source memory while the reconfigurable processor processes a current data unit in the series of data units, and to stream the next data unit to the reconfigurable processor for processing after buffers in the second plurality of buffers stream results of processing the current data unit from the reconfigurable processor.

25. The data processing system of any of clauses 1-24, wherein the runtime logic is further configured to cause the reconfigurable processor to process one or more previous data units while the reconfigurable processor is processing the current data unit.

25. The data processing system of any of clauses 1-25, wherein the runtime logic is further configured to cause the buffers in the first plurality of buffers to receive the next data unit from the source memory before the reconfigurable processor starts processing the current data unit.

26. The data processing system of any of clauses 1-26, wherein the runtime logic is further configured to cause the buffers in the first plurality of buffers to receive the next data unit from the source memory after the buffers in the second plurality of buffers stream the results of processing the current data unit from the reconfigurable processor.

28. A data processing system, comprising:
   a plurality of reconfigurable processors, reconfigurable processors in the plurality of reconfigurable processors having reconfigurable processor memory;
   a plurality of host processors, a host processor in the plurality of host processors operatively coupled to the reconfigurable processors and having host memory;
   a plurality of buffers in a shared memory accessible to the reconfigurable processors and the host processor; and
   runtime logic configured to execute one or more configuration files that define applications and process application data (e.g., weights, coefficients, vectors, tensors (image data, audio data, natural language processing (NLP data), control data (e.g., control tokens)) for the applications using the reconfigurable processors and the host processor, and
      wherein execution of the configuration files and processing of the application data includes receiving configuration data in the configuration files and the application data from at least one of the reconfigurable processors and providing the configuration data and the application data to the host processor, and receiving the configuration data and the application data from the host processor and providing the configuration data and the application data to the at least one of the reconfigurable processors.

29. A data processing system, comprising:
   a plurality of reconfigurable processors including a first reconfigurable processor and additional reconfigurable processors;
   a plurality of buffers in a shared memory accessible to the first reconfigurable processor and the additional reconfigurable processors; and
   runtime logic configured to execute one or more configuration files that define applications and process application data (e.g., weights, coefficients, vectors, tensors (image data, audio data, natural language processing (NLP data), control data (e.g., control tokens)) for the applications using the first reconfigurable processor and the additional reconfigurable processors, and
      wherein execution of the configuration files and processing of the application data includes receiving configuration data in the configuration files and the application data from the first reconfigurable processor and providing the configuration data and the application data to at least one of the additional reconfigurable processors, and receiving the configuration data and the application data from the at least one of the additional reconfigurable processors and providing the configuration data and the application data to the first reconfigurable processor.

Clause Set 2

1. A data processing system, comprising:
   a pool of reconfigurable dataflow resources including a plurality of processing nodes, respective processing nodes in the plurality of processing nodes operatively coupled to respective pluralities of reconfigurable processors and respective pluralities of buffers; and
   a runtime processor operatively coupled to the pool of reconfigurable dataflow resources, and configured to:
      receive a plurality of configuration files for applications, configuration files in the plurality of configuration files specifying configurations of virtual dataflow resources required to execute the configuration files, and the virtual dataflow resources including a first virtual reconfigurable processor in a first virtual processing node, a second virtual reconfigurable processor in a second virtual processing node, and virtual buffers that stream data between the first virtual reconfigurable processor and the second virtual reconfigurable processor;
      allocate reconfigurable dataflow resources in the pool of reconfigurable dataflow resources to the virtual dataflow resources, the allocated reconfigurable dataflow resources including
         a first processing node in the respective processing nodes allocated to the first virtual processing node,
         a second processing node in the respective processing nodes allocated to the second virtual processing node,
         a first reconfigurable processor, operatively coupled to the first processing node, allocated to the first virtual reconfigurable processor,
         a second reconfigurable processor operatively coupled to the second processing node allocated to the second virtual reconfigurable processor, and
         a first plurality of buffers, operatively coupled to the first processing node, and a second plurality of buffers, operatively coupled to the second processing node, allocated to the virtual buffers; and execute the configuration files and process data (e.g., weights, coefficients, vectors, tensors (image data, audio data, natural language processing (NLP data), control data (e.g., control tokens)) for the applications using the allocated reconfigurable dataflow resources.

2. The data processing system of any of clauses 1-29 in Clause Set 1 and/or clause 1 in Clause Set 2, wherein the first plurality of buffers includes a first set of sender buffers configured to receive data from the first reconfigurable processor and provide the data to a second set of receiver buffers in the second plurality of buffers, the second set of receiver buffers configured to provide the data to the second reconfigurable processor.

3. The data processing system of any of clauses 1-29 in Clause Set 1 and/or any of clauses 1-2 in Clause Set 2, wherein the second plurality of buffers includes a second set of sender buffers configured to receive data from the second reconfigurable processor and provide the data to a first set of receiver buffers in the first plurality of buffers, the first set of receiver buffers configured to provide the data to the first reconfigurable processor.

4. The data processing system of any of clauses 1-29 in Clause Set 1 and/or any of clauses 1-3 in Clause Set 2, wherein the respective processing nodes are operatively coupled to respective host processors.

5. The data processing system of any of clauses 1-29 in Clause Set 1 and/or any of clauses 1-4 in Clause Set 2, wherein the first plurality of buffers operates in a memory of a first host processor operatively coupled to the first processing node, and the second plurality of buffers operates in a memory of a second host processor operatively coupled to the second processing node.

6. The data processing system of any of clauses 1-29 in Clause Set 1 and/or any of clauses 1-5 in Clause Set 2, wherein the respective processing nodes are operatively coupled to respective pluralities of Smart Network Interface Controllers (SmartNICs).

7. The data processing system of any of clauses 1-29 in Clause Set 1 and/or any of clauses 1-6 in Clause Set 2, wherein the first plurality of buffers operates in a memory of a first SmartNIC operatively coupled to the first processing node.

8. The data processing system of any of clauses 1-29 in Clause Set 1 and/or any of clauses 1-7 in Clause Set 2, wherein the runtime logic is further configured to configure the first SmartNIC with a routing table that specifies the first reconfigurable processor as a local reconfigurable processor, and the second reconfigurable processor as a destination reconfigurable processor.

9. The data processing system of any of clauses 1-29 in Clause Set 1 and/or any of clauses 1-8 in Clause Set 2, wherein the second plurality of buffers operates in a memory of a second SmartNIC operatively coupled to the second processing node.

10. The data processing system of any of clauses 1-29 in Clause Set 1 and/or any of clauses 1-9 in Clause Set 2, wherein the runtime logic is further configured to configure the second SmartNIC with a routing table that specifies the second reconfigurable processor as a local reconfigurable processor, and the first reconfigurable processor as a destination reconfigurable processor.

11. The data processing system of any of clauses 1-29 in Clause Set 1 and/or any of clauses 1-10 in Clause Set 2, wherein at least one of the applications is a dataflow graph with a set of processing modules.

12. The data processing system of any of clauses 1-29 in Clause Set 1 and/or any of clauses 1-11 in Clause Set 2, wherein the runtime logic is further configured to partition the set of processing modules into a first subset of processing modules and a second subset of processing modules.

13. The data processing system of any of clauses 1-29 in Clause Set 1 and/or any of clauses 1-12 in Clause Set 2, wherein the runtime logic is further configured to execute configuration files for the first subset of processing modules and therefor on the first reconfigurable processor.

14. The data processing system of any of clauses 1-29 in Clause Set 1 and/or any of clauses 1-13 in Clause Set 2, wherein the runtime logic is further configured to execute configuration files for the second subset of processing modules and data therefor (e.g., weights, coefficients, vectors, tensors (image data, audio data, natural language processing (NLP data), control data (e.g., control tokens)) on the second reconfigurable processor.

15. The data processing system of any of clauses 1-29 in Clause Set 1 and/or any of clauses 1-14 in Clause Set 2, wherein the runtime logic is further configured to use the first plurality of buffers and the second plurality of buffers to stream data between the first subset of processing modules and the second subset of processing modules, wherein the data includes feature maps and/or activations generated during a forward pass, and loss gradients generated during a backward pass.

16. The data processing system of any of clauses 1-29 in Clause Set 1 and/or any of clauses 1-15 in Clause Set 2, wherein the runtime logic is further configured to initialize a first instance of the dataflow graph and a second instance of the dataflow graph.

17. The data processing system of any of clauses 1-29 in Clause Set 1 and/or any of clauses 1-16 in Clause Set 2, wherein the runtime logic is further configured to execute configuration files for the first instance of the dataflow graph and data therefor (e.g., weights, coefficients, vectors, tensors (image data, audio data, natural language processing (NLP data), control data (e.g., control tokens)) on the first reconfigurable processor.

18. The data processing system of any of clauses 1-29 in Clause Set 1 and/or any of clauses 1-17 in Clause Set 2, wherein the runtime logic is further configured to execute configuration files for the second instance of the dataflow graph and data therefor (e.g., weights, coefficients, vectors, tensors (image data, audio data, natural language processing (NLP data), control data (e.g., control tokens)) on the second reconfigurable processor.

19. The data processing system of any of clauses 1-29 in Clause Set 1 and/or any of clauses 1-18 in Clause Set 2, wherein the runtime logic is further configured to use the first plurality of buffers and the second plurality of buffers to stream data between the first instance of the dataflow graph and the second instance of the dataflow graph, wherein the data includes gradients generated during a backward pass.

20. The data processing system of any of clauses 1-29 in Clause Set 1 and/or any of clauses 1-19 in Clause Set 2, wherein the first plurality of buffers operates in a memory of the first reconfigurable processor, and the second plurality of buffers operates in a memory of the second reconfigurable processor.

21. A data processing system, comprising:
   a pool of reconfigurable dataflow resources including a plurality of processing nodes, respective processing nodes in the plurality of processing nodes operatively coupled to respective pluralities of reconfigurable processors and respective pluralities of buffers; and a runtime processor operatively coupled to the pool of reconfigurable dataflow resources, the runtime processor including runtime logic configured to:
  receive a set of configuration files for an application;
  load and execute a first subset of configuration files in the set of configuration files and association application data (e.g., weights, coefficients, vectors, tensors (image data, audio data, natural language processing (NLP data), control data (e.g., control tokens)) on a first reconfigurable processor operatively coupled to a first processing node in the respective processing nodes;
  load and execute a second subset of configuration files in the set of configuration files and associated application data (e.g., weights, coefficients, vectors, tensors (image data, audio data, natural language processing (NLP data), control data (e.g., control tokens)) on a second reconfigurable processor operatively coupled to a second processing node in the respective processing nodes; and
  use a first plurality of buffers operatively coupled to the first processing node, and a second plurality of buffers operatively coupled to the second processing node to stream data between the first reconfigurable processor and the second reconfigurable processor to load and execute the first subset of configuration files and the second subset of configuration files.

22. The data processing system of any of clauses 1-29 in Clause Set 1 and/or any of clauses 1-21 in Clause Set 2, wherein the first plurality of buffers operates in a memory of a first host processor operatively coupled to the first processing node, and the second plurality of buffers operates in a memory of a second host processor operatively coupled to the second processing node.

23. The data processing system of any of clauses 1-29 in Clause Set 1 and/or any of clauses 1-22 in Clause Set 2, wherein the first plurality of buffers operates in a memory of a first smart Network Interface Controller (SmartNIC) operatively coupled to the first processing node, and the second plurality of buffers operates in a memory of a second SmartNIC operatively coupled to the second processing node.

24. The data processing system of any of clauses 1-29 in Clause Set 1 and/or any of clauses 1-23 in Clause Set 2, wherein the first plurality of buffers operates in a memory of the first reconfigurable processor, and the second plurality of buffers operates in a memory of the second reconfigurable processor.

25. The data processing system of any of clauses 1-29 in Clause Set 1 and/or any of clauses 1-24 in Clause Set 2, wherein a network fabric operatively couples the first processing node and the second processing node.

26. The data processing system of any of clauses 1-29 in Clause Set 1 and/or any of clauses 1-25 in Clause Set 2, wherein the network fabric streams the data between the first plurality of buffers and the second plurality of buffers.

27. The data processing system of any of clauses 1-29 in Clause Set 1 and/or any of clauses 1-26 in Clause Set 2, wherein the runtime logic is further configured to:
  load and execute a third subset of configuration files in the set of configuration files and associated application data (e.g., weights, coefficients, vectors, tensors (image data, audio data, natural language processing (NLP data), control data (e.g., control tokens)) on a third reconfigurable processor operatively coupled to a third processing node in the respective processing nodes;
  load and execute a fourth subset of configuration files in the set of configuration files and associated application data (e.g., weights, coefficients, vectors, tensors (image data, audio data, natural language processing (NLP data), control data (e.g., control tokens)) on a fourth reconfigurable processor operatively coupled to a fourth processing node in the respective processing nodes; and
  use a third plurality of buffers operatively coupled to the third processing node, and a fourth plurality of buffers operatively coupled to the fourth processing node to stream data between the third reconfigurable processor and the fourth reconfigurable processor to load and execute the third subset of configuration files and the fourth subset of configuration files.

28. A data processing system, comprising:
  a processing node operatively coupled to reconfigurable processors that have different levels of configurable granularity; and
  a runtime processor operatively coupled to the processing node, the runtime processor including runtime logic configured to:
    receive a set of configuration files for an application;
    load and execute a first subset of configuration files in the set of configuration files and associated application data (e.g., weights, coefficients, vectors, tensors (image data, audio data, natural language processing (NLP data), control data (e.g., control tokens)) on a first reconfigurable processor in the reconfigurable processors, the first reconfigurable processor having a first level of configurable granularity; and
    load and execute a second subset of configuration files in the set of configuration files and associated application data (e.g., weights, coefficients, vectors, tensors (image data, audio data, natural language processing (NLP data), control data (e.g., control tokens)) on a second reconfigurable processor in the reconfigurable processors, the second reconfigurable processor having a second level of configurable granularity that is different from the first level of configurable granularity.

29. The data processing system of any of clauses 1-29 in Clause Set 1 and/or any of clauses 1-28 in Clause Set 2, wherein the first level of configurable granularity is a bit-level configurable granularity, and the first reconfigurable processor is a Field-Programmable Gate Array (FPGA).

30. The data processing system of any of clauses 1-29 in Clause Set 1 and/or any of clauses 1-29 in Clause Set 2, wherein the second level of configurable granularity is a word-level configurable granularity, and the second reconfigurable processor is a Coarse-Grained Reconfigurable Architecture (CGRA).

31. A data processing system, comprising:
  a processing node operatively coupled to reconfigurable processors that have different levels of configurable granularity; and
  a runtime processor operatively coupled to the processing node, the runtime processor including runtime logic configured to:
    receive a set of configuration files for an application;
    load and execute a first subset of configuration files in the set of configuration files and associated application data (e.g., weights, coefficients, vectors, tensors (image data, audio data, natural language processing (NLP data), control data (e.g., control tokens)) on a first reconfigurable processor in the reconfigurable processors, the first reconfigurable processor having a first configuration; and
    load and execute a second subset of configuration files in the set of configuration files and associated application data (e.g., weights, coefficients, vectors, tensors (image data, audio data, natural language processing (NLP data), control data (e.g., control tokens)) on a second reconfigurable processor in the reconfigurable processors, the second reconfigurable processor having a second configuration that is different from the configuration.

32. The data processing system of any of clauses 1-29 in Clause Set 1 and/or any of clauses 1-31 in Clause Set 2, wherein the first configuration is a bit-level configurable granularity, and the first reconfigurable processor is a Field-Programmable Gate Array (FPGA).

33. The data processing system of any of clauses 1-29 in Clause Set 1 and/or any of clauses 1-32 in Clause Set 2, wherein the second configuration is a word-level configurable granularity, and the second reconfigurable processor is a Coarse-Grained Reconfigurable Architecture (CGRA).

34. The data processing system of any of clauses 1-29 in Clause Set 1 and/or any of clauses 1-33 in Clause Set 2, wherein the first configuration is a gate-level reconfigurability, and the first reconfigurable processor is the FPGA.

35. The data processing system of any of clauses 1-29 in Clause Set 1 and/or any of clauses 1-34 in Clause Set 2, wherein the second configuration is a register transfer-level reconfigurability, and the second reconfigurable processor is the CGRA.

36. The data processing system of any of clauses 1-29 in Clause Set 1 and/or any of clauses 1-35 in Clause Set 2, wherein the first configuration uses bit-wise Look-Up Tables (LUTs) and switches, and the first reconfigurable processor is the FPGA.

37. The data processing system of any of clauses 1-29 in Clause Set 1 and/or any of clauses 1-36 in Clause Set 2, wherein the second configuration uses word-wide Issue Slots (ISs)/Arithmetic Logic Units (ALUs)/Functional Units (FUs)/Processing Elements (PEs), Register Files (RFs), and interconnections, and the second reconfigurable processor is the CGRA.

38. The data processing system of any of clauses 1-29 in Clause Set 1 and/or any of clauses 1-37 in Clause Set 2, wherein a number of the ISs used by the second reconfigurable processor is fewer than a number of the LUTs used by the first reconfigurable processor.

39. The data processing system of any of clauses 1-29 in Clause Set 1 and/or any of clauses 1-38 in Clause Set 2, wherein a number of bits required to configure the second reconfigurable processor is orders of magnitude smaller than a number of bits required to configure the first reconfigurable processor.

Clause Set 3

1. A data processing system, comprising:
a plurality of processing nodes, processing nodes in the plurality of processing nodes including a first processing node and a second processing node, the first processing node operatively coupled to the second processing node, the first processing node having a first host processor, a first plurality of reconfigurable processors operatively coupled to the first host processor, and a first plurality of Smart Network Interface Controllers (SmartNICs) operatively coupled to the first plurality of reconfigurable processors, and the second processing node having a second host processor, a second plurality of reconfigurable processors operatively coupled to the second host processor, and a second plurality of SmartNICs operatively coupled to the second plurality of reconfigurable processors;
a first plurality of buffers in a memory of a first SmartNIC in the first plurality of SmartNICs, the first SmartNIC operatively coupled to a first reconfigurable processor in the first plurality of reconfigurable processors;
a second plurality of buffers in a memory of a second SmartNIC in the second plurality of SmartNICs, the second SmartNIC operatively coupled to a second reconfigurable processor in the second plurality of reconfigurable processors;
the first plurality of buffers including a first set of sender buffers configured to receive data from the first reconfigurable processor and provide the data to a second set of receiver buffers in the second plurality of buffers, the second set of receiver buffers configured to provide the data to the second reconfigurable processor;
the second plurality of buffers including a second set of sender buffers configured to receive data from the second reconfigurable processor and provide the data to a first set of receiver buffers in the first plurality of buffers, the first set of receiver buffers configured to provide the data to the first reconfigurable processor; and
runtime logic configured to execute configuration files that define applications and process application data (e.g., weights, coefficients, vectors, tensors (image data, audio data, natural language processing (NLP data), control data (e.g., control tokens)) for the applications using the first reconfigurable processor and the second reconfigurable processor, the execution including streaming configuration data (e.g., bit stream) in the configuration files and the application data between the first reconfigurable processor and the second reconfigurable processor using one or more buffers in the first plurality of buffers and one or more buffers in the second plurality of buffers, thereby the streaming bypassing the first host processor and the second host processor.

2. The data processing system of any of clauses 1-29 in Clause Set 1 and/or any of clauses 1-39 in Clause Set 2 and/or clause 1 in Clause Set 3, wherein the execution includes streaming input data for the applications from the first reconfigurable processor to the second reconfigurable processor.

3. The data processing system of any of clauses 1-29 in Clause Set 1 and/or any of clauses 1-39 in Clause Set 2 and/or any of clauses 1-2 in Clause Set 3, wherein one or more sender buffers in the first set of sender buffers are configured to receive the input data from the first reconfigurable processor and provide the input data to one or more receiver buffers in the second set of receiver buffers, wherein the receiver buffers in the second set of receiver buffers are configured to provide the input data to the second reconfigurable processor.

4. The data processing system of any of clauses 1-29 in Clause Set 1 and/or any of clauses 1-39 in Clause Set 2 and/or any of clauses 1-3 in Clause Set 3, wherein the execution includes streaming output data for the applications from the second reconfigurable processor to the first reconfigurable processor, wherein the output data is generated as a result of processing the input data.

5. The data processing system of any of clauses 1-29 in Clause Set 1 and/or any of clauses 1-39 in Clause Set 2 and/or any of clauses 1-4 in Clause Set 3, wherein one or more sender buffers in the second set of sender buffers are configured to receive the output data from the second reconfigurable processor and provide the output data to one or more receiver buffers in the first set of receiver buffers, wherein the receiver buffers in the first set of receiver buffers are configured to provide the output data to the first reconfigurable processor.

6. The data processing system of any of clauses 1-29 in Clause Set 1 and/or any of clauses 1-39 in Clause Set 2 and/or any of clauses 1-5 in Clause Set 3, wherein the first reconfigurable processor is configured to push the input data to the first SmartNIC, wherein the first SmartNIC is configured to write the input data into the sender buffers in the first set of sender buffers, and wherein the first SmartNIC is configured to update tail pointers of the sender buffers in the first set of sender buffers in response to the writing of the input data.

7. The data processing system of any of clauses 1-29 in Clause Set 1 and/or any of clauses 1-39 in Clause Set 2 and/or any of clauses 1-6 in Clause Set 3, wherein the first SmartNIC is configured to send the input data to the second SmartNIC in response to the updated tail pointers, wherein the second SmartNIC is configured to write the input data into the receiver buffers in the second set of receiver buffers, and wherein the second SmartNIC is configured to update tail pointers of the receiver buffers in the second set of receiver buffers in response to the writing of the input data.

8. The data processing system of any of clauses 1-29 in Clause Set 1 and/or any of clauses 1-39 in Clause Set 2 and/or any of clauses 1-7 in Clause Set 3, wherein the second reconfigurable processor is configured to pull the input data from the second SmartNIC by reading the input data from the receiver buffers in the second set of receiver buffers in response to the updated tail pointers.

9. The data processing system of any of clauses 1-29 in Clause Set 1 and/or any of clauses 1-39 in Clause Set 2 and/or any of clauses 1-8 in Clause Set 3, wherein the second reconfigurable processor is configured to push the output data to the second SmartNIC, wherein the second SmartNIC is configured to write the output data into the sender buffers in the second set of sender buffers, and wherein the second SmartNIC is configured to update tail pointers of the sender buffers in the second set of sender buffers in response to the writing of the output data.

10. The data processing system of any of clauses 1-29 in Clause Set 1 and/or any of clauses 1-39 in Clause Set 2 and/or any of clauses 1-9 in Clause Set 3, wherein the second SmartNIC is configured to send the output data to the first SmartNIC in response to the updated tail pointers, wherein the first SmartNIC is configured to write the output data into the receiver buffers in the first set of receiver buffers, and wherein the first SmartNIC is configured to update tail pointers of the receiver buffers in the first set of receiver buffers in response to the writing of the output data.

11. The data processing system of any of clauses 1-29 in Clause Set 1 and/or any of clauses 1-38 in Clause Set 2 and/or any of clauses 1-10 in Clause Set 3, wherein the first reconfigurable processor is configured to pull the output data from the first SmartNIC by reading the output data from the receiver buffers in the first set of receiver buffers in response to the updated tail pointers.

12. The data processing system of any of clauses 1-29 in Clause Set 1 and/or any of clauses 1-39 in Clause Set 2 and/or any of clauses 1-11 in Clause Set 3, wherein a network fabric operatively couples the first processing node and the second processing node, and the network fabric is configured to implement the streaming of the input data from the sender buffers in the first set of sender buffers to the receiver buffers in the second set of receiver buffers, and to implement the streaming of the output data from the sender buffers in the second set of sender buffers to the receiver buffers in the first set of receiver buffers.

13. The data processing system of any of clauses 1-29 in Clause Set 1 and/or any of clauses 1-39 in Clause Set 2 and/or any of clauses 1-12 in Clause Set 3, wherein the first reconfigurable processor notifies the second reconfigurable processor of remote invocations using one or more remote procedure calls.

14. The data processing system of any of clauses 1-29 in Clause Set 1 and/or any of clauses 1-39 in Clause Set 2 and/or any of clauses 1-13 in Clause Set 3, wherein the first reconfigurable processor uses the sender buffers in the first set of sender buffers and the receiver buffers in the second set of receiver buffers to send one or more argument values to the second reconfigurable processor for execution of the remote procedure calls.

15. The data processing system of any of clauses 1-29 in Clause Set 1 and/or any of clauses 1-39 in Clause Set 2 and/or any of clauses 1-14 in Clause Set 3, wherein the second reconfigurable processor notifies the first reconfigurable processor of remote invocations using one or more remote procedure calls.

16. The data processing system of any of clauses 1-29 in Clause Set 1 and/or any of clauses 1-39 in Clause Set 2 and/or any of clauses 1-15 in Clause Set 3, wherein the second reconfigurable processor uses the sender buffers in the second set of sender buffers and the receiver buffers in the first set of receiver buffers to send one or more argument values to the first reconfigurable processor for execution of the remote procedure calls.

17. The data processing system of any of clauses 1-29 in Clause Set 1 and/or any of clauses 1-39 in Clause Set 2 and/or any of clauses 1-16 in Clause Set 3, wherein respective SmartNICs in the first plurality of SmartNICs are operatively coupled to respective reconfigurable processors in the first plurality of reconfigurable processors by respective buses, and respective SmartNICs in the second plurality of SmartNICs are operatively coupled to respective reconfigurable processors in the second plurality of reconfigurable processors by respective buses.

18. The data processing system of any of clauses 1-29 in Clause Set 1 and/or any of clauses 1-39 in Clause Set 2 and/or any of clauses 1-17 in Clause Set 3, wherein the configuration files include a plurality of functions.

19. The data processing system of any of clauses 1-29 in Clause Set 1 and/or any of clauses 1-39 in Clause Set 2 and/or any of clauses 1-18 in Clause Set 3, further comprising:

the runtime logic configured to execute a first set of functions in the plurality of functions on the first reconfigurable processor, and a second set of functions in the plurality of functions on the second reconfigurable processor,
wherein functions in the second set of functions and/or data therefor (e.g., weights, coefficients, vectors, tensors (image data, audio data, natural language processing (NLP data), control data (e.g., control tokens)) are transmitted to the second reconfigurable processor using the sender buffers in the first set of sender buffers and the receiver buffers in the second set of receiver buffers, and
wherein results of executing the functions and/or the data therefor (e.g., weights, coefficients, vectors, tensors (image data, audio data, natural language processing (NLP data), control data (e.g., control tokens)) on the second reconfigurable processor are transmitted to the first reconfigurable processor using the sender buffers in the second set of sender buffers and the receiver buffers in the first set of receiver buffers.

20. The data processing system of any of clauses 1-29 in Clause Set 1 and/or any of clauses 1-39 in Clause Set 2 and/or any of clauses 1-19 in Clause Set 3, wherein the buffers in the first plurality of buffers and the buffers in the second plurality of buffers are First-In, First-Out (FIFO) buffers.

21. The data processing system of any of clauses 1-29 in Clause Set 1 and/or any of clauses 1-39 in Clause Set 2 and/or any of clauses 1-20 in Clause Set 3, wherein the runtime logic runs in at least one of the first host processor and the second host processor.

22. A data processing system, comprising:
a plurality of processing nodes, processing nodes in the plurality of processing nodes including a first processing node and a second processing node, the first processing node operatively coupled to the second processing node, the first processing node having a first host processor, a first plurality of reconfigurable processors operatively coupled to the first host processor, and a first plurality of Smart Network Interface Controllers (SmartNICs) operatively coupled to the first plurality of reconfigurable processors, and the second processing node having a second host processor, a second plurality of reconfigurable processors operatively coupled to the second host processor, and a second plurality of SmartNICs operatively coupled to the second plurality of reconfigurable processors;
a first plurality of buffers in a memory of a first SmartNIC in the first plurality of SmartNICs, the first SmartNIC operatively coupled to a first reconfigurable processor in the first plurality of reconfigurable processors;
a second plurality of buffers in a memory of a second SmartNIC in the second plurality of SmartNICs, the second SmartNIC operatively coupled to the second host processor;
the first plurality of buffers including a first set of sender buffers configured to receive data from the first reconfigurable processor and provide the data to a second set of receiver buffers in the second plurality of buffers, the second set of receiver buffers configured to provide the data to the second host processor;
the second plurality of buffers including a second set of sender buffers configured to receive data from the second host processor and provide the data to a first set of receiver buffers in the first plurality of buffers, the first set of receiver buffers configured to provide the data to the first reconfigurable processor; and
runtime logic configured to execute configuration files that define applications and process application data (e.g., weights, coefficients, vectors, tensors (image data, audio data, natural language processing (NLP data), control data (e.g., control tokens)) for the applications using the first reconfigurable processor and the second host processor, the execution including streaming configuration data (e.g., bit stream) in the configuration files and the application data between the first reconfigurable processor and the second host processor using one or more buffers in the first plurality of buffers and one or more buffers in the second plurality of buffers, thereby the streaming bypassing the first host processor.

23. The data processing system of any of clauses 1-29 in Clause Set 1 and/or any of clauses 1-39 in Clause Set 2 and/or any of clauses 1-22 in Clause Set 3, wherein the first reconfigurable processor notifies the second host processor of remote invocations using one or more remote procedure calls.

24. The data processing system of any of clauses 1-29 in Clause Set 1 and/or any of clauses 1-39 in Clause Set 2 and/or any of clauses 1-23 in Clause Set 3, wherein the first reconfigurable processor uses one or more sender buffers in the first set of sender buffers and one or more receiver buffers in the second set of receiver buffers to send one or more argument values to the second host processor for execution of the remote procedure calls.

25. The data processing system of any of clauses 1-29 in Clause Set 1 and/or any of clauses 1-39 in Clause Set 2 and/or any of clauses 1-24 in Clause Set 3, wherein the second host processor notifies the first reconfigurable processor of remote invocations using one or more remote procedure calls.

26. The data processing system of any of clauses 1-29 in Clause Set 1 and/or any of clauses 1-39 in Clause Set 2 and/or any of clauses 1-25 in Clause Set 3, wherein the second host processor uses one or more sender buffers in the second set of sender buffers and one or more receiver buffers in the first set of receiver buffers to send one or more argument values to the first reconfigurable processor for execution of the remote procedure calls.

27. The data processing system of any of clauses 1-29 in Clause Set 1 and/or any of clauses 1-39 in Clause Set 2 and/or any of clauses 1-26 in Clause Set 3, further comprising debugging logic configured to detect errors, and report the errors to a debugging console on the second host processor using the sender buffers in the first set of sender buffers and the receiver buffers in the second set of receiver buffers.

28. The data processing system of any of clauses 1-29 in Clause Set 1 and/or any of clauses 1-39 in Clause Set 2 and/or any of clauses 1-27 in Clause Set 3, further comprising:
the runtime logic configured to execute test configuration files that define test applications and process application data (e.g., weights, coefficients, vectors, tensors (image data, audio data, natural language processing (NLP data), control data (e.g., control tokens)) for the test applications on the first reconfigurable processor; and
testing logic configured to generate results of execution of the test configuration files and the application data, and report the results to an output file on the second host processor using the sender buffers in the first set of sender buffers and the receiver buffers in the second set of receiver buffers.

29. The data processing system of any of clauses 1-29 in Clause Set 1 and/or any of clauses 1-39 in Clause Set 2 and/or any of clauses 1-28 in Clause Set 3, wherein the configuration files include a plurality of functions.

30. The data processing system of any of clauses 1-29 in Clause Set 1 and/or any of clauses 1-39 in Clause Set 2 and/or any of clauses 1-29 in Clause Set 3, further comprising:
the runtime logic configured to execute a first set of functions in the plurality of functions and data therefor (e.g., weights, coefficients, vectors, tensors (image data, audio data, natural language processing (NLP data), control data (e.g., control tokens)) on the first reconfigurable processor, and a second set of functions in the plurality of functions and data therefor (e.g., weights, coefficients, vectors, tensors (image data, audio data, natural language processing (NLP data), control data (e.g., control tokens)) on the second host processor,
wherein functions in the second set of functions and/or the data therefor (e.g., weights, coefficients, vectors, tensors (image data, audio data, natural language processing (NLP data), control data (e.g., control tokens)) are transmitted to the second host processor using the sender buffers in the first set of sender buffers and the receiver buffers in the second set of receiver buffers, and wherein results of executing the functions and/or the data therefor (e.g., weights, coefficients, vectors, tensors (image data, audio data, natural language processing (NLP data), control data (e.g., control tokens)) on the second host processor are transmitted to the first reconfigurable processor using the sender buffers in the second set of sender buffers and the receiver buffers in the first set of receiver buffers.

31. A data processing system, comprising:

a plurality of reconfigurable processors including a first reconfigurable processor and a second reconfigurable processor;

a first Smart Network Interface Controller (SmartNIC) operatively coupled to the first reconfigurable processor, the first SmartNIC having a first plurality of buffers;

a second SmartNIC operatively coupled to the second reconfigurable processor, the second SmartNIC having a second plurality of buffers; and runtime logic configured to execute configuration files that define applications and process application data (e.g., weights, coefficients, vectors, tensors (image data, audio data, natural language processing (NLP data), control data (e.g., control tokens)) for the applications using the first reconfigurable processor and the second reconfigurable processor, the execution including streaming configuration data (e.g., bit stream) in the configuration files and the application data between the first reconfigurable processor and the second reconfigurable processor using one or more buffers in the first plurality of buffers and one or more buffers in the second plurality of buffers.

32. The data processing system of any of clauses 1-29 in Clause Set 1 and/or any of clauses 1-39 in Clause Set 2 and/or any of clauses 1-31 in Clause Set 3, wherein the first reconfigurable processor is on a first processing node and operatively coupled to a first host processor, wherein the second reconfigurable processor is on a second processing node and operatively coupled to a second host processor, and wherein the first processing node and the second processing node are operatively coupled by a network fabric.

33. The data processing system of any of clauses 1-29 in Clause Set 1 and/or any of clauses 1-39 in Clause Set 2 and/or any of clauses 1-32 in Clause Set 3, wherein the first reconfigurable processor and the second reconfigurable processor are on a same processing node and operatively coupled to a same host processor.

34. A data processing system, comprising:

a first reconfigurable processor operatively coupled to a first host processor running on a first processing node;

a second reconfigurable processor operatively coupled to a second host processor on a second processing node;

a first Smart Network Interface Controller (SmartNIC) operatively coupled to the first reconfigurable processor, the first SmartNIC having a first plurality of buffers;

a second SmartNIC operatively coupled to the second host processor, the second SmartNIC having a second plurality of buffers; and runtime logic configured to execute configuration files that define applications and process application data (e.g., weights, coefficients, vectors, tensors (image data, audio data, natural language processing (NLP data), control data (e.g., control tokens)) for the applications using the first reconfigurable processor and the second host processor, the execution including streaming configuration data (e.g., bit stream) in the configuration files and the application data between the first reconfigurable processor and the second host processor using one or more buffers in the first plurality of buffers and one or more buffers in the second plurality of buffers.

35. A data processing system, comprising:

a first reconfigurable processor operatively coupled to a first host processor running on a first processing node;

a second reconfigurable processor operatively coupled to a second host processor on a second processing node;

a first Network Interface Controller (NIC) operatively coupled to the first processing node, the first NIC having a first plurality of buffers;

a second NIC operatively coupled to the second processing node, the second NIC having a second plurality of buffers; and runtime logic configured to execute configuration files that define applications and application data (e.g., weights, coefficients, vectors, tensors (image data, audio data, natural language processing (NLP data), control data (e.g., control tokens)) for the applications using the first reconfigurable processor and the second reconfigurable processor, the execution including:

the first reconfigurable processor configured to push input data for the applications to the one or more buffers in the first plurality of buffers;

the first host processor configured to cause the first NIC to stream the input data to one or more buffers in the second plurality of buffers from the first plurality of buffers; and the second host processor configured to cause the second NIC to stream the input data to the second reconfigurable processor from the buffers in the second plurality of buffers.

36. The data processing system of any of clauses 1-29 in Clause Set 1 and/or any of clauses 1-39 in Clause Set 2 and/or any of clauses 1-35 in Clause Set 3, wherein the second host processor uses one or more Remote Direct Memory Access (RDMA) commands to update tail pointers of the buffers in the second plurality of buffers after the input data is streamed to the buffers in the second plurality of buffers.

37. The data processing system of any of clauses 1-29 in Clause Set 1 and/or any of clauses 1-39 in Clause Set 2 and/or any of clauses 1-36 in Clause Set 3, wherein the second reconfigurable processor is configured to pull the input data from the buffers in the second plurality of buffers in response to the updated tail pointers.

38. The data processing system of any of clauses 1-29 in Clause Set 1 and/or any of clauses 1-39 in Clause Set 2 and/or any of clauses 1-37 in Clause Set 3, the execution further including:

the second reconfigurable processor to push output data for the applications to the buffers in the second plurality of buffers, wherein the output data is generated as a result of processing the input data;

the second host processor configured to cause the second NIC to stream the output data to the buffers in the first plurality of buffers from the second plurality of buffers; and the first host processor configured to cause the first NIC to stream the output data to the first reconfigurable processor from the buffers in the first plurality of buffers.

39. The data processing system of any of clauses 1-29 in Clause Set 1 and/or any of clauses 1-39 in Clause Set 2 and/or any of clauses 1-38 in Clause Set 3, wherein the first host processor uses one or more RDMA commands to update tail pointers of the buffers in the first plurality of buffers after the output data is streamed to the buffers in the first plurality of buffers.

40. The data processing system of any of clauses 1-29 in Clause Set 1 and/or any of clauses 1-39 in Clause Set 2 and/or any of clauses 1-39 in Clause Set 3, wherein the first reconfigurable processor is configured to pull the output data from the buffers in the first plurality of buffers in response to the updated tail pointers.

41. A data processing system, comprising:
    a first reconfigurable processor having a first Network Interface Controller (NIC), and the first NIC having a first plurality of buffers;
    a second reconfigurable processor having a second NIC, and the second NIC having a second plurality of buffers; and
    runtime logic configured to execute configuration files that define applications and process application data (e.g., weights, coefficients, vectors, tensors (image data, audio data, natural language processing (NLP data), control data (e.g., control tokens)) for the applications using the first reconfigurable processor and the second reconfigurable processor, the execution including streaming configuration data (e.g., bit stream) in the configuration files and the application data between the first reconfigurable processor and the second reconfigurable processor using the first plurality of buffers of the first NIC and the second plurality of buffers of the second NIC.

42. The data processing system of any of clauses 1-29 in Clause Set 1 and/or any of clauses 1-39 in Clause Set 2 and/or any of clauses 1-41 in Clause Set 3, wherein the first NIC is a first SmartNIC, and the second NIC is a second SmartNIC, wherein the first and second reconfigurable processors are on a same processing node, and wherein the first and second reconfigurable processors are on different processing nodes.

43. A data processing system, comprising:
    a first reconfigurable processor operatively coupled to a first host processor running on a first processing node, the first processing node operatively coupled to a first Network Interface Controller (NIC);
    a second reconfigurable processor operatively coupled to a second host processor running on a second processing node, the second processing node operatively coupled to a second NIC;
    an address generator of the first reconfigurable processor configured to stream configuration data (e.g., bit stream) and application data (e.g., weights, coefficients, vectors, tensors (image data, audio data, natural language processing (NLP data), control data (e.g., control tokens)) for execution of configuration files that define applications from the first reconfigurable processor to the second reconfigurable processor using memory addresses that map to a first plurality of buffers; and
    an address generator of the second reconfigurable processor configured to stream the configuration data (e.g., bit stream) and the application data from the second reconfigurable processor to the first reconfigurable processor using memory addresses that map to a second plurality of buffers.

44. The data processing system of any of clauses 1-29 in Clause Set 1 and/or any of clauses 1-39 in Clause Set 2 and/or any of clauses 1-43 in Clause Set 3, wherein the first plurality of buffers operates in a memory of the first reconfigurable processor.

45. The data processing system of any of clauses 1-29 in Clause Set 1 and/or any of clauses 1-39 in Clause Set 2 and/or any of clauses 1-44 in Clause Set 3, wherein the first plurality of buffers operates in a memory of the first host processor.

46. The data processing system of any of clauses 1-29 in Clause Set 1 and/or any of clauses 1-39 in Clause Set 2 and/or any of clauses 1-45 in Clause Set 3, wherein the first plurality of buffers operates in a memory of the first NIC.

47. The data processing system of any of clauses 1-29 in Clause Set 1 and/or any of clauses 1-39 in Clause Set 2 and/or any of clauses 1-46 in Clause Set 3, wherein the second plurality of buffers operates in a memory of the second reconfigurable processor.

48. The data processing system of any of clauses 1-29 in Clause Set 1 and/or any of clauses 1-39 in Clause Set 2 and/or any of clauses 1-47 in Clause Set 3, wherein the second plurality of buffers operates in a memory of the second host processor.

49. The data processing system of any of clauses 1-29 in Clause Set 1 and/or any of clauses 1-39 in Clause Set 2 and/or any of clauses 1-48 in Clause Set 3, wherein the second plurality of buffers operates in a memory of the second NIC.

50. The data processing system of any of clauses 1-29 in Clause Set 1 and/or any of clauses 1-39 in Clause Set 2 and/or any of clauses 1-49 in Clause Set 3, wherein the first NIC is a first SmartNIC, and the second NIC is a second SmartNIC.

Clause Set 4

1. A computer-implemented method, including:
    receiving a plurality of configuration files that define applications, configuration files in the plurality of configuration files specifying configurations of virtual dataflow resources required to execute the configuration files, and the virtual dataflow resources including a first virtual reconfigurable processor in a first virtual processing node, a second virtual reconfigurable processor in a second virtual processing node, and virtual buffers that stream data between the first virtual reconfigurable processor and the second virtual reconfigurable processor;
    allocating reconfigurable dataflow resources in a pool of reconfigurable dataflow resources to the virtual dataflow resources, the pool of reconfigurable dataflow resources including a plurality of processing nodes, respective processing nodes in the plurality of processing nodes operatively coupled to respective pluralities of reconfigurable processors and respective pluralities of buffers, the allocated reconfigurable dataflow resources including
        a first processing node in the respective processing nodes allocated to the first virtual processing node,
        a second processing node in the respective processing nodes allocated to the second virtual processing node,
        a first reconfigurable processor, operatively coupled to the first processing node, allocated to the first virtual reconfigurable processor,
        a second reconfigurable processor operatively coupled to the second processing node allocated to the second virtual reconfigurable processor, and
        a first plurality of buffers, operatively coupled to the first processing node, and a second plurality of buffers, operatively coupled to the second processing node, allocated to the virtual buffers; and
    executing the configuration files and processing application data for the applications using the allocated reconfigurable dataflow resources.

2. A computer-implemented method, including:
    receiving a set of configuration files for an application;
    loading and executing a first subset of configuration files in the set of configuration files and associated application data on a first reconfigurable processor operatively coupled to a first processing node in respective processing nodes;

loading and executing a second subset of configuration files in the set of configuration files and associated application data on a second reconfigurable processor operatively coupled to a second processing node in the respective processing nodes; and using a first plurality of buffers operatively coupled to the first processing node, and a second plurality of buffers operatively coupled to the second processing node to stream data between the first reconfigurable processor and the second reconfigurable processor to load and execute the first subset of configuration files and the second subset of configuration files.

3. A computer-implemented method, including:

receiving a set of configuration files for an application and associated application data;

loading and executing a first subset of configuration files in the set of configuration files and associated application data on a first reconfigurable processor having a first level of configurable granularity; and loading and executing a second subset of configuration files in the set of configuration files and associated application data on a second reconfigurable processor having a second level of configurable granularity that is different from the first level of configurable granularity.

4. A computer-implemented method, including:

receiving a set of configuration files for an application and associated application data;

loading and executing a first subset of configuration files in the set of configuration files and associated application data on a first reconfigurable processor having a first configuration; and loading and executing a second subset of configuration files in the set of configuration files and associated application data on a second reconfigurable processor having a second configuration that is different from the first configuration.

5. A computer-implemented method, including:

executing configuration files that define applications and processing application data for the applications using a first reconfigurable processor and a second reconfigurable processor, the execution including streaming configuration data (e.g., bit stream) in the configuration files and the application data between the first reconfigurable processor and the second reconfigurable processor using one or more buffers in a first plurality of buffers and one or more buffers in a second plurality of buffers, thereby the streaming bypassing a first host processor and a second host processor.

6. A computer-implemented method, including:

executing configuration files that define applications and processing application data for the applications using a first reconfigurable processor and a second host processor, the execution including streaming configuration data (e.g., bit stream) in the configuration files and the application data between the first reconfigurable processor and the second host processor using one or more buffers in a first plurality of buffers and one or more buffers in a second plurality of buffers, thereby the streaming bypassing a first host processor.

7. A data processing system, comprising:

a pool of reconfigurable dataflow resources including a plurality of processing nodes, respective processing nodes in the plurality of processing nodes operatively coupled to respective pluralities of reconfigurable processors and respective pluralities of buffers; and a runtime processor, running on one or more reconfigurable processors in the respective pluralities of reconfigurable processors, and configured to:

receive a plurality of configuration files for applications, configuration files in the plurality of configuration files specifying configurations of virtual dataflow resources required to execute the configuration files, and the virtual dataflow resources including a first virtual reconfigurable processor in a first virtual processing node, a second virtual reconfigurable processor in a second virtual processing node, and virtual buffers that stream data between the first virtual reconfigurable processor and the second virtual reconfigurable processor;

allocate reconfigurable dataflow resources in the pool of reconfigurable dataflow resources to the virtual dataflow resources, the allocated reconfigurable dataflow resources including a first processing node in the respective processing nodes allocated to the first virtual processing node, a second processing node in the respective processing nodes allocated to the second virtual processing node, a first reconfigurable processor, operatively coupled to the first processing node, allocated to the first virtual reconfigurable processor, a second reconfigurable processor operatively coupled to the second processing node allocated to the second virtual reconfigurable processor, and a first plurality of buffers, operatively coupled to the first processing node, and a second plurality of buffers, operatively coupled to the second processing node, allocated to the virtual buffers; and execute the configuration files and process application data for the applications using the allocated reconfigurable dataflow resources.

8. A data processing system, comprising:

a pool of reconfigurable dataflow resources including a plurality of processing nodes, respective processing nodes in the plurality of processing nodes operatively coupled to respective pluralities of reconfigurable processors and respective pluralities of buffers; and a runtime processor, running on one or more reconfigurable processors in the respective pluralities of reconfigurable processors, and configured to:

receive a set of configuration files for an application;

load and execute a first subset of configuration files in the set of configuration files and associated application data on a first reconfigurable processor operatively coupled to a first processing node in the respective processing nodes;

load and execute a second subset of configuration files in the set of configuration files and associated application data on a second reconfigurable processor operatively coupled to a second processing node in the respective processing nodes; and use a first plurality of buffers operatively coupled to the first processing node, and a second plurality of buffers operatively coupled to the second processing node to stream data between the first reconfigurable processor and the second reconfigurable processor to load and execute the first subset of configuration files and the second subset of configuration files.

9. A data processing system, comprising:

a processing node operatively coupled to reconfigurable processors that have different levels of configurable granularity; and a runtime processor, running on one or more of the reconfigurable processors, the runtime processor including runtime logic configured to:

receive a set of configuration files for an application and associated application data;

load and execute a first subset of configuration files in the set of configuration files and associated application data on a first reconfigurable processor in the reconfigurable processors, the first reconfigurable processor having a first level of configurable granularity; and load and execute a second subset of configuration files in the set of configuration files and associated application data on a second reconfigurable processor in the reconfigurable processors, the second reconfigurable processor having a second level of configurable granularity that is different from the first level of configurable granularity.

10. A data processing system, comprising:

a processing node operatively coupled to reconfigurable processors that have different levels of configurable granularity; and a runtime processor, running on one or more of the reconfigurable processors, the runtime processor including runtime logic configured to:

receive a set of configuration files for an application and associated application data;

load and execute a first subset of configuration files in the set of configuration files and associated application data on a first reconfigurable processor in the reconfigurable processors, the first reconfigurable processor having a first configuration; and load and execute a second subset of configuration files in the set of configuration files and associated application data on a second reconfigurable processor in the reconfigurable processors, the second reconfigurable processor having a second configuration that is different from the configuration.

11. A data processing system, comprising:

a plurality of processing nodes, processing nodes in the plurality of processing nodes including a first processing node and a second processing node, the first processing node operatively coupled to the second processing node, the first processing node having a first plurality of reconfigurable processors operatively coupled and a first plurality of Smart Network Interface Controllers (SmartNICs), and the second processing node having a second plurality of reconfigurable processors and a second plurality of SmartNICs;

a first plurality of buffers in a memory of a first SmartNIC in the first plurality of SmartNICs, the first SmartNIC operatively coupled to a first reconfigurable processor in the first plurality of reconfigurable processors;

a second plurality of buffers in a memory of a second SmartNIC in the second plurality of SmartNICs, the second SmartNIC operatively coupled to a second reconfigurable processor in the second plurality of reconfigurable processors;

the first plurality of buffers including a first set of sender buffers configured to receive data from the first reconfigurable processor and provide the data to a second set of receiver buffers in the second plurality of buffers, the second set of receiver buffers configured to provide the data to the second reconfigurable processor;

the second plurality of buffers including a second set of sender buffers configured to receive data from the second reconfigurable processor and provide the data to a first set of receiver buffers in the first plurality of buffers, the first set of receiver buffers configured to provide the data to the first reconfigurable processor; and runtime logic, running on at least one reconfigurable processor in the first plurality of reconfigurable processors or the second of reconfigurable processors, and configured to execute configuration files that define applications and application data for the applications using the first reconfigurable processor and the second reconfigurable processor, the execution including streaming configuration data (e.g., bit stream) in the configuration files and the application data between the first reconfigurable processor and the second reconfigurable processor using one or more buffers in the first plurality of buffers and one or more buffers in the second plurality of buffers.

12. A data processing system, comprising:

a plurality of reconfigurable processors including a first reconfigurable processor and a second reconfigurable processor;

a first Smart Network Interface Controller (SmartNIC) operatively coupled to the first reconfigurable processor, the first SmartNIC having a first plurality of buffers;

a second SmartNIC operatively coupled to the second reconfigurable processor, the second SmartNIC having a second plurality of buffers; and runtime logic, running on at least one reconfigurable processor in the plurality of reconfigurable processors, and configured to execute configuration files that define applications and application data for the applications using the first reconfigurable processor and the second reconfigurable processor, the execution including streaming configuration data (e.g., bit stream) in the configuration files and the application data between the first reconfigurable processor and the second reconfigurable processor using one or more buffers in the first plurality of buffers and one or more buffers in the second plurality of buffers.

13. A data processing system, comprising:

a first reconfigurable processor having a first Network Interface Controller (NIC), and the first NIC having a first plurality of buffers;

a second reconfigurable processor having a second NIC, and the second NIC having a second plurality of buffers; and runtime logic, running on at least one reconfigurable processor (e.g., the first reconfigurable processor, the second reconfigurable processor, a third reconfigurable processor), and configured to execute configuration files that define applications and application data for the applications using the first reconfigurable processor and the second reconfigurable processor, the execution including streaming configuration data (e.g., bit stream) in the configuration files and the application data between the first reconfigurable processor and the second reconfigurable processor using the first plurality of buffers of the first NIC and the second plurality of buffers of the second NIC.

14. A data processing system, comprising:

a first reconfigurable processor operatively coupled to a first Network Interface Controller (NIC);

a second reconfigurable processor operatively coupled to a second NIC;

an address generator of the first reconfigurable processor configured to stream configuration data (e.g., bit stream) and application data for execution of configuration files from the first reconfigurable processor to the second reconfigurable processor using memory addresses that map to a first plurality of buffers; and an address generator of the second reconfigurable processor configured to the configuration data (e.g., bit stream) and the application data from the second reconfigurable processor to the first reconfigurable processor using memory addresses that map to a second plurality of buffers.

15. A data processing system, comprising:
a pool of reconfigurable dataflow resources including a plurality of processing nodes, respective processing nodes in the plurality of processing nodes operatively coupled to respective pluralities of reconfigurable processors and respective pluralities of buffers; and
a runtime processor operatively coupled to the pool of reconfigurable dataflow resources, and configured to:
receive an execution file for an application, the execution file including configuration files for applications and configurations of virtual dataflow resources required to execute the configuration files, and the virtual dataflow resources including a first virtual reconfigurable processor in a first virtual processing node, a second virtual reconfigurable processor in a second virtual processing node, and virtual buffers that stream data between the first virtual reconfigurable processor and the second virtual reconfigurable processor;
allocate reconfigurable dataflow resources in the pool of reconfigurable dataflow resources to the virtual dataflow resources, the allocated reconfigurable dataflow resources including
a first processing node in the respective processing nodes allocated to the first virtual processing node,
a second processing node in the respective processing nodes allocated to the second virtual processing node,
a first reconfigurable processor, operatively coupled to the first processing node, allocated to the first virtual reconfigurable processor,
a second reconfigurable processor operatively coupled to the second processing node allocated to the second virtual reconfigurable processor, and
a first plurality of buffers, operatively coupled to the first processing node, and a second plurality of buffers, operatively coupled to the second processing node, allocated to the virtual buffers; and
execute the configuration files and process data for the applications using the allocated reconfigurable dataflow resources.

While the present invention is disclosed by reference to the preferred implementations and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following clauses.

What is claimed is:
1. A data processing system, comprising:
a pool of reconfigurable dataflow resources including a plurality of processing nodes, respective processing nodes in the plurality of processing nodes operatively coupled to respective pluralities of reconfigurable processors and respective pluralities of buffers; and
a runtime processor operatively coupled to the pool of reconfigurable dataflow resources, and configured to:
receive a plurality of configuration files for applications, configuration files in the plurality of configuration files specifying configurations of virtual dataflow resources required to execute the configuration files, and the virtual dataflow resources including a first virtual reconfigurable processor in a first virtual processing node, a second virtual reconfigurable processor in a second virtual processing node, and virtual buffers that stream data between the first virtual reconfigurable processor and the second virtual reconfigurable processor;
allocate reconfigurable dataflow resources in the pool of reconfigurable dataflow resources to the virtual dataflow resources, the allocated reconfigurable dataflow resources including
a first processing node in the respective processing nodes allocated to the first virtual processing node,
a second processing node in the respective processing nodes allocated to the second virtual processing node,
a first reconfigurable processor, operatively coupled to the first processing node, allocated to the first virtual reconfigurable processor,
a second reconfigurable processor operatively coupled to the second processing node allocated to the second virtual reconfigurable processor, and
a first plurality of send and receive network interface card (NIC) buffers, operatively coupled to the first processing node, and a second plurality of send and receive network interface card (NIC) buffers, operatively coupled to the second processing node, allocated to the virtual buffers, wherein the first and second pluralities of send and receive NIC buffers use routing tables to specify local reconfigurable processors and destination reconfigurable processors; and
execute the configuration files and process data for the applications using the allocated reconfigurable dataflow resources.

2. The data processing system of claim 1, wherein the first plurality of buffers includes a first set of sender buffers configured to receive data from the first reconfigurable processor and provide the data to a second set of receiver buffers in the second plurality of buffers, the second set of receiver buffers configured to provide the data to the second reconfigurable processor.

3. The data processing system of claim 2, wherein the second plurality of buffers includes a second set of sender buffers configured to receive data from the second reconfigurable processor and provide the data to a first set of receiver buffers in the first plurality of buffers, the first set of receiver buffers configured to provide the data to the first reconfigurable processor.

4. The data processing system of claim 3, wherein the respective processing nodes are operatively coupled to respective host processors.

5. The data processing system of claim 4, wherein the first plurality of buffers operates in a memory of a first host processor operatively coupled to the first processing node, and the second plurality of buffers operates in a memory of a second host processor operatively coupled to the second processing node.

6. The data processing system of claim 3, wherein the respective processing nodes are operatively coupled to respective pluralities of Smart Network Interface Controllers (SmartNICs), and wherein the first and second pluralities of send and receive NIC buffers are located on the SmartNICs.

7. The data processing system of claim 6, wherein the first plurality of buffers operates in a memory of a first SmartNIC operatively coupled to the first processing node.

8. The data processing system of claim 7, wherein the runtime logic is further configured to configure the first SmartNIC with a routing table that specifies the first reconfigurable processor as a local reconfigurable processor, and the second reconfigurable processor as a destination reconfigurable processor.

9. The data processing system of claim 6, wherein the second plurality of buffers operates in a memory of a second SmartNIC operatively coupled to the second processing node.

10. The data processing system of claim 9, wherein the runtime logic is further configured to configure the second SmartNIC with a routing table that specifies the second reconfigurable processor as a local reconfigurable processor, and the first reconfigurable processor as a destination reconfigurable processor.

11. The data processing system of claim 3, wherein the first plurality of buffers operates in a memory of the first reconfigurable processor, and the second plurality of buffers operates in a memory of the second reconfigurable processor.

12. The data processing system of claim 1, wherein at least one of the applications is a dataflow graph with a set of processing modules.

13. The data processing system of claim 12, wherein the runtime logic is further configured to partition the set of processing modules into a first subset of processing modules and a second subset of processing modules.

14. The data processing system of claim 13, wherein the runtime logic is further configured to execute configuration files for the first subset of processing modules and data therefor on the first reconfigurable processor.

15. The data processing system of claim 14, wherein the runtime logic is further configured to execute configuration files for the second subset of processing modules and data therefor on the second reconfigurable processor.

16. The data processing system of claim 15, wherein the runtime logic is further configured to use the first plurality of buffers and the second plurality of buffers to stream data between the first subset of processing modules and the second subset of processing modules, wherein the data includes feature maps and/or activations generated during a forward pass, and loss gradients generated during a backward pass.

17. The data processing system of claim 12, wherein the runtime logic is further configured to initialize a first instance of the dataflow graph and a second instance of the dataflow graph.

18. The data processing system of claim 17, wherein the runtime logic is further configured to execute configuration files for the first instance of the dataflow graph and data therefor on the first reconfigurable processor.

19. The data processing system of claim 18, wherein the runtime logic is further configured to execute configuration files for the second instance of the dataflow graph and data therefor on the second reconfigurable processor.

20. The data processing system of claim 19, wherein the runtime logic is further configured to use the first plurality of buffers and the second plurality of buffers to stream data between the first instance of the dataflow graph and the second instance of the dataflow graph, wherein the data includes gradients generated during a backward pass.

* * * * *